United States Patent
Tassev

(10) Patent No.: US 12,046,471 B1
(45) Date of Patent: Jul. 23, 2024

(54) OPTIMIZED THICK HETEROEPITAXIAL GROWTH OF SEMICONDUCTORS WITH IN-SITU SUBSTRATE PRETREATMENT

(71) Applicant: Government of the United States, as represented by the Secretary of the Air Force, Wright-Patterson AFB, OH (US)

(72) Inventor: Vladimir Tassev, Beavercreek, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 17/094,878

(22) Filed: Nov. 11, 2020

Related U.S. Application Data

(63) Continuation-in-part of application No. 16/201,446, filed on Nov. 27, 2018, now abandoned.
(Continued)

(51) Int. Cl.
  *C30B 25/02* (2006.01)
  *C30B 25/18* (2006.01)
  (Continued)

(52) U.S. Cl.
  CPC ........ *H01L 21/02658* (2013.01); *C30B 25/02* (2013.01); *C30B 25/18* (2013.01);
  (Continued)

(58) Field of Classification Search
  CPC ......... C30B 25/18; C30B 25/02; C30B 29/40; C30B 29/48
  See application file for complete search history.

(56) References Cited

U.S. PATENT DOCUMENTS

| 2,916,678 A | 12/1959 | Bube et al. |
| 3,218,203 A | 11/1965 | Ruehrwein |

(Continued)

FOREIGN PATENT DOCUMENTS

| CN | 102610689 A | * 7/2012 | ............ H01L 31/18 |
| DE | 3937073 | 5/1991 | |

(Continued)

OTHER PUBLICATIONS

Barkai, M., The Epitaxial growth on CaF2 and BaF2 single-crystal films on a sapphire substrate, Vacuum, vol. 1, Nos. 4-6, pp. 847-850, 1990.
(Continued)

*Primary Examiner* — Matthew J Song
(74) *Attorney, Agent, or Firm* — AFMCLO/JAZ; Chastity D. S. Whitaker

(57) ABSTRACT

A method of performing HVPE heteroepitaxy comprises exposing a substrate to a carrier gas, a first precursor gas, a Group II/III element, and ternary-forming gasses (V/VI group precursor), to form a heteroepitaxial growth of a binary, ternary, and/or quaternary compound on the substrate; wherein the carrier gas is $H_2$, wherein the first precursor gas is HCl, the Group II/III element comprises at least one of Zn, Cd, Hg, Al, Ga, and In; and wherein the ternary-forming gasses comprise at least two or more of $AsH_3$ (arsine), $PH_3$ (phosphine), $H_2Se$ (hydrogen selenide), $H_2Te$ (hydrogen telluride), $SbH_3$ (hydrogen antimonide, or antimony tri-hydride, or stibine), $H_2S$ (hydrogen sulfide), $NH_3$ (ammonia), and HF (hydrogen fluoride); flowing the carrier gas over the Group II/III element; exposing the substrate to the ternary-forming gasses in a predetermined ratio of first ternary-forming gas to second ternary-forming gas (1tf:2tf ratio); and changing the 1tf:2tf ratio over time.

2 Claims, 38 Drawing Sheets
(34 of 38 Drawing Sheet(s) Filed in Color)

Related U.S. Application Data

(60) Provisional application No. 62/681,155, filed on Jun. 6, 2018.

(51) Int. Cl.
 *C30B 29/40* (2006.01)
 *C30B 29/48* (2006.01)
 *H01L 21/02* (2006.01)

(52) U.S. Cl.
 CPC ............ *C30B 29/40* (2013.01); *C30B 29/48* (2013.01); *H01L 21/02387* (2013.01); *H01L 21/024* (2013.01); *H01L 21/02538* (2013.01); *H01L 21/02551* (2013.01); *H01L 21/02568* (2013.01)

(56) References Cited

U.S. PATENT DOCUMENTS

| | | | |
|---|---|---|---|
| 3,830,654 A | 8/1974 | Cho | |
| 3,839,082 A | 10/1974 | Kasano et al. | |
| 3,925,119 A | 12/1975 | Philbrick | |
| 3,982,265 A | 9/1976 | Johnston, Jr. | |
| 4,001,056 A | 1/1977 | Groves et al. | |
| 4,039,357 A | 8/1977 | Bachmann et al. | |
| 4,062,706 A | 12/1977 | Ruehrwein | |
| 4,063,269 A | 12/1977 | Hara | |
| 4,081,290 A | 3/1978 | Bachmann | |
| 4,088,515 A | 5/1978 | Blakeslee | |
| 4,146,774 A | 3/1979 | Fraas | |
| 4,159,354 A | 6/1979 | Milnes | |
| 4,488,914 A | 12/1984 | Quinlan | |
| 4,498,225 A | 2/1985 | Gutierrez et al. | |
| 4,592,307 A * | 6/1986 | Jolly | C30B 25/08 118/733 |
| 4,645,683 A | 2/1987 | Gourrier et al. | |
| 4,665,415 A | 5/1987 | Esaki et al. | |
| 4,808,551 A * | 2/1989 | Mori | C30B 25/14 438/933 |
| 4,848,273 A | 7/1989 | Mori | |
| 4,865,655 A * | 9/1989 | Fujita | H01L 21/02502 148/33 |
| 4,972,248 A | 11/1990 | Kornreich | |
| 5,002,630 A | 3/1991 | Kermani | |
| 5,134,091 A | 7/1992 | Chikyou | |
| 5,198,690 A | 3/1993 | Kitagawa | |
| 5,207,864 A | 5/1993 | Bhat | |
| 5,252,512 A | 10/1993 | Shuskus et al. | |
| 5,311,533 A | 5/1994 | Stutius et al. | |
| 5,563,087 A | 10/1996 | Shen | |
| 5,659,179 A | 8/1997 | Goronkin | |
| 5,868,834 A | 2/1999 | Shimoyama | |
| 6,323,053 B1 | 11/2001 | Nishikawa | |
| 9,023,673 B1 | 5/2015 | Shapovalov | |
| 9,647,156 B1 | 5/2017 | Tassev | |
| 11,384,448 B1 | 7/2022 | Tassev | |
| 11,603,603 B2 | 3/2023 | Tassev | |
| 2002/0158264 A1* | 10/2002 | Nakamura | H01L 33/32 257/94 |
| 2003/0025113 A1* | 2/2003 | Van De Walle | H01L 29/475 257/11 |
| 2003/0033974 A1 | 2/2003 | Ueda | |
| 2003/0102482 A1 | 6/2003 | Saxler | |
| 2004/0079967 A1* | 4/2004 | Shakuda | H01L 33/405 257/E33.068 |
| 2004/0201036 A1 | 10/2004 | Ikossi | |
| 2006/0150895 A1 | 7/2006 | Shibata | |
| 2007/0221954 A1 | 9/2007 | Shibata | |
| 2007/0257334 A1 | 11/2007 | Leibiger | |
| 2007/0284601 A1 | 12/2007 | Khanarian | |
| 2008/0110489 A1* | 5/2008 | Sepehry-Fard | H01L 31/18 136/246 |
| 2008/0308812 A1* | 12/2008 | Kiyomi | C30B 25/02 257/E21.112 |
| 2009/0085055 A1 | 4/2009 | Peng | |
| 2009/0159907 A1* | 6/2009 | Wang | H01L 33/24 257/E33.048 |
| 2010/0006143 A1 | 1/2010 | Welser | |
| 2010/0025730 A1 | 2/2010 | Heikman | |
| 2010/0187499 A1 | 7/2010 | Oh | |
| 2010/0212729 A1 | 8/2010 | Hsu | |
| 2010/0279020 A1 | 11/2010 | Melnik | |
| 2011/0048537 A1* | 3/2011 | Woodall | H01L 31/0725 136/262 |
| 2011/0155049 A1* | 6/2011 | Solomon | C30B 25/10 118/733 |
| 2012/0174855 A1 | 7/2012 | Wei | |
| 2012/0276671 A1 | 11/2012 | Wei et al. | |
| 2013/0037857 A1* | 2/2013 | Von Kanel | H01L 21/02381 257/190 |
| 2013/0143336 A1 | 6/2013 | Jain | |
| 2013/0193308 A1 | 8/2013 | Cellek | |
| 2013/0226335 A1* | 8/2013 | Kraus | H01L 21/67276 700/228 |
| 2013/0237001 A1 | 9/2013 | Forrest et al. | |
| 2013/0247817 A1 | 9/2013 | Konno | |
| 2014/0065742 A1 | 3/2014 | Wei | |
| 2015/0187991 A1* | 7/2015 | McGroddy | H01L 33/30 257/13 |
| 2015/0197844 A1 | 7/2015 | Clemens | |
| 2016/0281247 A1 | 9/2016 | Friedman | |
| 2016/0351747 A1 | 12/2016 | Forrest | |
| 2016/0372365 A1* | 12/2016 | Tang | H01L 21/02175 |
| 2016/0372543 A1 | 12/2016 | Xie | |
| 2017/0183793 A1 | 6/2017 | Tassev | |
| 2017/0204533 A1 | 7/2017 | Schunemann et al. | |
| 2017/0256405 A1 | 9/2017 | Lee | |
| 2017/0260628 A1 | 9/2017 | Fujikura et al. | |
| 2018/0073164 A1 | 3/2018 | Goto | |
| 2018/0080143 A1 | 3/2018 | Weinert | |
| 2018/0248028 A1* | 8/2018 | Mohapatra | H01L 27/0924 |
| 2018/0261694 A1* | 9/2018 | Dewey | H01L 27/0924 |
| 2019/0330762 A1* | 10/2019 | Kimura | C30B 25/10 |
| 2020/0185553 A1 | 6/2020 | Lee | |
| 2020/0251604 A1 | 8/2020 | McGlynn | |
| 2021/0217617 A1 | 7/2021 | Robinson | |
| 2023/0148397 A1 | 5/2023 | Tassev | |

FOREIGN PATENT DOCUMENTS

| | | |
|---|---|---|
| JP | 60176998 | 9/1985 |
| JP | 1317195 | 12/1989 |
| JP | 5304091 | 11/1993 |
| JP | 6196808 | 7/1994 |
| JP | 06-164017 | 10/1994 |
| JP | 08-186080 | 7/1996 |
| JP | 9325711 | 12/1997 |
| JP | 1093107 | 12/2001 |

OTHER PUBLICATIONS

Tassev, et al., Thick Heteroepitaxy of Binary and Ternary Semiconductor Materials for Nonlinear Frequency Conversion in the Mid and Longwave Infrared Region, Physica Status Solidi A (2020).

Tassev, V. et al., Thick Hydride Vapor Phase Heteroepitaxy: A Novel Approach to Growth of Nonlinear Optical Materials, Crystals 2019, 9, 393; doi: 10.3390/cryst9080393.

Vihn, L., et al., Heteroepitaxy of GaSe layered semiconductor compound on Si(111)7 X 7 substrate: a Van der Waals epitaxy?, Journal of Crystal Growth 135 (1994) 1-10.

Jeno, K., et al., Investigation of the growth mechanism of layered semiconductor GaSe, Applied Surface Science 113/1 14 (1997) 38-42.

Myers, L., et al., Quasi-phase-matched optical parametric oscillators in bulk periodically poled LiNbO3, J. Opt. Soc. Am. B/vol. 12, No. 11/Nov. 1995.

(56) References Cited

OTHER PUBLICATIONS

Bhat, R., A Novel Technique for the Preservation of Gratings in InP and InGaAsP and for the simultaneous preservation of InP, InGaAs, and InGaAsP in OMCVD, J. Crystal Growth 107, 871-877, 1991.

Singh, N.B., Characteristics of thick ZnSe films on quasi-phase-matched (QPM) GaAs substrates, J. Crystal Growth 312, 1142-45, 2010.

Hsiao, CJ, Growth of ultrathin GaSb layer on GaAs using metal-organic chemical vapor deposition with Sb interfacial treatment, Applied Physics Express 9, 095502, 2016.

Tassev, V., Heteroepitaxial growth of OPGaP on OPGaAs for frequency conversion in the IR and THz, Optical Materials Express, 1724, 2016.

Keuch Group, Heteroepitaxy of large lattice mismatch compound semiconductrs, Univ. Wisconsin, 2016.

Tassev, V., Heteroepitaxy, an Amazing Contribution of Crystal Growth to the World of Optics and Electronics, Crystals 7, 178, 2017.

Tassev, V., Homo and heteroepitaxial growth and study of orientation-patterned GaP for nonlinear frequency conversion devices, Proc. of SPIE vol. 9731, 2016.

Tassev, V., HVPE growth and characterization of GaP on different substrates and patterned templates for frequency conversion devices, J. of the European Optical Society—Rapid Publications 6, 11017, 2011.

Nakao, W., Single crystalline AlN film formed by direct nitridation of sapphire using aluminum oxynitride buffer, J. Crystal Growth, 259, 302-308, 2003.

Iligems, M., Phase equilibria and vapor pressures in the Ga+ P system, J. Chem. Dynamics, 6, 157-177, 1974.

Cottrell, T., The Strengths of Chemical Bonds, 2d. Ed., 1958.

Dong, L., Stress relaxation and misfit dislocation nucleation in the growth of misfitting films: A molecular dynamics simulation study, J. Appl. Phys. 83, 1998.

Simmonds, P., Tensile-strained growth on low-index GaAs, J. Appl. Phys. 112, 2012.

Noh, Y.K., Strucrural Properties of GaSb Layers Grown on InAs, AlSb, and GaSb Buffer Layers on GaAs (001) Substrates, J. Korean Physical Society, vol. 50, No. 6, Jun. 2007, 1929-1932.

Tsuchiya, H., Comparison of Hydride Vapor Phase Epitaxy of GaN Layers on Cubic GaN/(100) GaAs and Hexagonal GaN/(111) GaAs Substrates, Jpn. J. Appl. Phys., vol. 33, 1994, 6448-6453.

www.2dsemiconductors.com, 2016.

Hemmingsson, C., Optimization of low temperature GaN buffer layers for halide vapor phase epitaxy growth of bulk GaN, J. Crystal Growth, 366, 2013, 61-66.

Namikawa, Y., ZnSe Single Crystals Grown by Vapor Growth Methods and Their Applications, SEI Technical Review, No. 72, Apr. 2011.

Van Der Walls Epitaxy, http://www.ieap.uni-kiel.de/surface/ag-kipp/epitaxy/vdwe.htm, 2016.

Nishizawa, JP10-93107, machine translation.

English Translation of JP 06-164017, 2023.

English Translation of JP-08186080, 2023.

Kuech Group, "Advanced Materials, processing and Synthesis: Heteroepitaxy of large lattice mismatch compound semiconductors," Website: http://amps.che.wisc.edu/research_latticemismatch.php (downloaded Aug. 21, 2018).

Tassev et al., "Homo and heteroepitaxial growth and study of orientation-patterned GaP for nonlinear frequency conversion devices," Proc SPIE, vol. 9731 (2016) 97310G, 8 pages total.

2D Semiconductors, "2D semiconductors," Accessed from http://www.2dsemiconductor.com/2d-semiconductors/ (2019). See web.archive.org/web/20191107051516/https://www.2dsemiconductors.com/2d-semicondctor.

Institut Fur Experimentelle Und Angewandte Physik, "Van Der Waals epitaxy (VDWE)," Accessed from http://www.ieap.uni-kiel.de/surface/ag-kipp/epitaxy/vdwe.htm (2016).

Li et al., "Controlled vapor phase growth of single crystalline, two-dimensional GaSe crystals with high photoresponse," Scientific Reports, vol. 4/5497 (2014) 9 pages total.

Irvine et al., "Photosensitisation: a stimulant for the low temperature growth of epitaxial HgTe," J Crysal Growth, vol. 68 (1984) 188-193.

Peterson et al., "Progress in orietation-patterned GaAs for next-generation nonlinear optical devices," Proc SPIE, vol. 6675 68750D (2008) 11 pages total.

Yim et al., "Vapor-phase epitaxial growth and some properties of ZnSe, ZnS, and CdS," J. Electrochem. Soc .: Solid-State Science and Technology, vol. 119/3 (1972) 381-388.

Qin et al., "Low-temperature bonding for silicon-based micro-optical systems," Photonics, vol. 2 (2015) 1164-1201.

Vangala et al., "Thick orientation-patterned growth of GaP on wafer-fused GaAs templates by hydride vapor phase epitaxy for frequency conversion," Optical Mater., vol. 60 (2016) 62-66.

Termkoa et al., "Production of orientation-patterned GaP templates usig wafer fusion techniques," Optial Mater., vol. 34 (2011) 30-35.

Grassman et al., "Nucleation-related defect-free GaPSi(100) heteroepitaxy via metal-organic chemical vapor deposition," App Phys Lett., vol. 102 (2013) 142102, 5 pages total.

Soga et al., "MOCVD growth and characterization of GaAs and GaP grown on Si substrate," J Crystal Growth, vol. 93 (1988) 499-503.

Grisard et al., "Quasi-phase-matched gallium arsenide for versatile mid-infrared frequency conversion," Optical Mater Exp, vol. 2/8 (2012) 1020-1025.

Ebert et al., "MBE growth of antiphase GaAs films using GaAs/Ge/GaAs heteroepitaxy," J. Crystal Growth, vol. 201/202 (1999) 187-193.

Paskova et al., "Hydride vapour phase homoepitaxial growth of GaN on MOCVD-grown templates," MRS Online Proceedings Library, vol. 595 (1999) 314, 7 pages total.

Gonda et al., "Heteroepitaxial growth of GaP on silicon by molecular beam epitaxy," Jp J Applied Phys., vol. 17/6 (1978) 1043-1048.

Mita et al., "Fabrication of GaN lateral polarity junction by metalorganic chemical vapor deposition," J Crystal Growth, vol. 311 (2009) 3044-3048.

Kuzmenko et al., "Fabrication and testing of diamond-machined gratings in ZnSe, GaP, and bismuth germanate for the infrared and visible," Advanced Optical and Mechanical Technologies in Telescopes and Instrumentation. Edited by Atad-Ettedgui, Eli; Lemke, Dietrich. Proceedings of the SPIE, vol. 7018 (2008) 14 pages total.

Tassev et al., "Epitaxial growth of quasi-phase matched GaP for nonlinear applications: systematic process improvements," J Crystal Growth, vol. 352 (2012) 72-77.

Gordon et al., "Diffusion-bonded stacked GaAs for quasi-phase-matched second-harmonic generation of a carbon dioxide laser," Electronic Lett, vol. 29/22 (1993) 1942-1944.

Paduano et al., "Effect of initial process conditions on the structural properties of AlN films," J Crystal Growth, vol. 261 (2004) 259-265.

Zachariah and Melius, "Theoretical calculations of thermochemistry for molecules in the Si-P-H system," J Phys Chem, vol. 101 (1997) 913-918.

Ru et al., "Optical parametric oscillation in a random polycrystalline medium," Optica, vol. 4/6 (2017) 617-618.

Tassev et al., "Progress in orientation-patterned GaP for next-generation non-optical devices," Nonlinear Frequency Generation and Conversion: Materials, Devices, and Applications XII, Proc. SPIE, vol. 8604 (2013) 9 pages total.

Stutzmann et al., "Playing with polarity," Phys Stat. Sol. (b), vol. 228/2 (2001) 505-512.

Machine translation of DE 3937073.

Machine translation of JP 1317195, 2023.

Machine translation of JP 5304091, 2023.

Machine translation of JP 60176998.

Machine translation of JP 6196808, 2023.

Machine translation of JP 9325711, 2023.

* cited by examiner $2Ga + 6HCl \rightarrow 2GaCl_3 + 3H_2$   $GaCl_3 + AsH_3 \rightarrow GaAs + 3HCl$ Heteroepitaxy of α-GaSe on GaAs $2Ga + 6HCl \rightarrow 2GaCl_3 + 3H_2 \rightarrow 2GaCl_3 + 2H_2Se \rightarrow 2GaSe + 4HCl + Cl_2$ $Ga + 2HCl \rightarrow GaCl_2 + H_2 \rightarrow GaCl_2 + H_2Se \rightarrow GaSe + 2HCl$

Heteroepitaxy of ZnTe on GaSb or on InAs

In-situ $H_2Te$ formation:

$TeCl_4 + 3H_2 \rightarrow H_2Te + 4HCl$; or $N_2Te + 2HCl \rightarrow 2NaCl + H_2Te$; or $2Na_2TeO_3 + 4HCl \rightarrow 4NaCl + 2H_2Te + 3O_2$ $Zn + 2HCl \rightarrow ZnCl_2 + H_2 \rightarrow ZnCl_2 + H_2Te \rightarrow ZnTe + 2HCl$ $Zn + 2HCl \rightarrow ZnCl_2 + H_2 \rightarrow ZnCl_2 + H_2S \rightarrow ZnS + 2HCl$
$Cd + 2HCl \rightarrow CdCl_2 + H_2 \rightarrow CdCl_2 + H_2S \rightarrow CdS + 2HCl$ Heteroepitaxy of GaSb and AlSb on InAs, and AlSb on GaSb $2Ga + 6HCl \rightarrow 2GaCl_3 + 3H_2 \rightarrow GaCl_3 + SbH_3 \rightarrow GaSb + 3HCl$ $2Al + 6HCl \rightarrow 2AlCl_3 + 3H_2 \rightarrow AlCl_3 + SbH_3 \rightarrow AlSb + 3HCl$ $2Al + 6HCl \rightarrow 2AlCl_3 + 3H_2 \rightarrow AlCl_3 + AsH_3 \rightarrow AlAs + 3HCl$

| # | Heterostructure | Mismatch | Etchant Gas | Anion/Cation Source | Chemistry |
|---|---|---|---|---|---|
| 1 | GaP/GaAs | -3.574% | HCl | $PH_3$ | $2Ga + 6HCl \rightarrow 2GaCl_3 + 3H_2$; $GaCl_3 + PH_3 \rightarrow GaP + 3HCl$ |
| 2 | GaAs/GaP | +3.574% | HCl | $AsH_3$ | $2Ga + 6HCl \rightarrow 2GaCl_3 + 3H_2$; $GaCl_3 + AsH_3 \rightarrow GaAs + 3HCl$ |
| 3 | GaAsP/GaAs | <+3.574% | HCl | $AsH_3 + PH_3$ | $2Ga + 6HCl \rightarrow 2GaCl_3 + 3H_2$; $GaCl_3 + PH_3 \rightarrow GaP + 3HCl$ |
| 4 | GaAsP/GaP | <+3.574% | HCl | $AsH_3 + PH_3$ | $2Ga + 6HCl \rightarrow 2GaCl_3 + 3H_2$; $GaCl_3 + AsH_3 \rightarrow GaAs + 3HCl$ |
| 5 | ZnSe/GaAs | +0.238% | HCl | $H_2Se$ | $Zn + 2HCl \rightarrow ZnCl_2 + H_2$; $ZnCl_2 + H_2Se \rightarrow ZnSe + 2HCl$ |
| 6 | GaAs/ZnSe | -0.238% | HCl | $AsH_3$ | $2Ga + 6HCl \rightarrow 2GaCl_3 + 3H_2$; $GaCl_3 + AsH_3 \rightarrow GaAs + 3HCl$ |
| 7 | $Ga_2Se_3$/GaP | -0.607% | HCl | $H_2Se$ | $2Ga + 6HCl \rightarrow 2GaCl_3 + 3H_2$; $2GaCl_3 + 2H_2Se \rightarrow 2GaSe + 4HCl + Cl_2$ |
| 8 | $Ga_2Se_3$/GaAs | -4.04% | HCl | $H_2Se$ | $2Ga + 6HCl \rightarrow 2GaCl_3 + 3H_2$; $3H_2Se \rightarrow Ga_2Se_3 + 2HCl$ |
| 9 | c-GaSe/GaN | +17.74% | HCl | $H_2Se$ | |
| 10 | $Zn_3Te_2$/GaSb | +0.083% | HCl | $H_2Te$ | In-situ $H_2Te$ formation: $TeCl_4 + 3H_2 \rightarrow H_2Te + 4HCl$; or $N_2Te + 2HCl \rightarrow$ $2NaCl + H_2Te$, or $2Na_2TeO_3 + 4HCl \rightarrow 4NaCl + 2H_2Te + 3O_2$; $Zn + 2HCl \rightarrow ZnCl_2 + H_2$; $ZnCl_2 + H_2Te \rightarrow ZnTe + 2HCl$ |
| 11 | ZnTe/InAs | +0.700% | HCl | $H_2Te$ | $Zn + 2HCl \rightarrow ZnCl_2 + H_2$; $2ZnCl_2 + 3H_2Te \rightarrow Zn_2Te_3 + 4HCl + H_2$ |
| 12 | AlAs/GaAs | +0.127% | HCl | $AsH_3$ | $2Al + 6HCl \rightarrow 2AlCl_3 + 3H_2$; $AlCl_3 + AsH_3 \rightarrow AlAs + 3HCl$ |
| 13 | ZnS/GaP | -0.570% | HCl | $H_2S$ | $Zn + 2HCl \rightarrow ZnCl_2 + H_2$; $ZnCl_2 + H_2S \rightarrow ZnS + 2HCl$ |

FIG. 13A

| No. | Heterostructure | Mismatch | Precursor Gas | Group 6 Precursor Gas | Chemistry |
|---|---|---|---|---|---|
| 15 | CdS/InP | −0.624 % | HCl | H₂S | $Cd + 2HCl \rightarrow CdCl_2 + H_2 \rightarrow CdCl_2 + H_2S \rightarrow CdS + 2HCl$ |
| 16 | Ga₂Te₃/InP | +0.090 % | HCl | H₂Te | $2Ga + 6HCl \rightarrow 2GaCl_3 + 3H_2 \rightarrow 2GaCl_3 + 3H_2Te \rightarrow Ga_2Te_3 + 6HCl$ |
| 17 | InAs/GaSb | −0.620 % | HCl | AsH₃ | $2In + 6HCl \rightarrow 2InCl_3 + 3H_2 \rightarrow InCl_3 + AsH_3 \rightarrow InAs + 3HCl$ |
| 18 | CdSe/InAs | −0.139 % | HCl | H₂Se | $Cd + 2HCl \rightarrow CdCl_2 + H_2 \rightarrow CdCl_2 + H_2Se \rightarrow CdSe + 2HCl$ |
| 19 | GaSb/InAs | +0.620 % | SbH₃ | SbH₃ | $2Ga + 6HCl \rightarrow 2GaCl_3 + 3H_2 \rightarrow GaCl_3 + SbH_3 \rightarrow GaSb + 3HCl$ |
| 20 | AlSb/GaSb | +0.650 % | HCl | SbH₃ | $2Al + 6HCl \rightarrow 2AlCl_3 + 3H_2 \rightarrow AlCl_3 + SbH_3 \rightarrow AlSb + 3HCl$ |
| 21 | AlSb/InAs | +1.273 % | HCl | SbH₃ | $2Al + 6HCl \rightarrow 2AlCl_3 + 3H_2 \rightarrow AlCl_3 + SbH_3 \rightarrow AlSb + 3HCl$ |
| 22 | CdTe/InSb | +0.040 % | HCl | H₂Te | $Cd + 2HCl \rightarrow CdCl_2 + H_2 \rightarrow CdCl_2 + H_2Se \rightarrow CdSe + 2HCl$ |
| 23 | HgTe/InSb | −0.407 % | HCl | H₂Te | $2Hg + 6HCl \rightarrow 2HgCl_3 + 3H_2 \rightarrow 2HgCl_3 + 2H_2Te \rightarrow 2HgTe + 4HCl + O_2$ |
| 24 | HgTe/CdTe | −0.447 % | HCl | H₂Te | $2Hg + 6HCl \rightarrow 2HgCl_3 + 3H_2 \rightarrow 2HgCl_3 + 2H_2Te \rightarrow 2HgTe + 4HCl + O_2$ |
| 25 | InSe—layered | — | HCl | H₂Se | $2In + 6HCl \rightarrow 2InCl_3 + 3H_2 \rightarrow 2InCl_3 + 2H_2Se \rightarrow 2InSe + 4HCl + O_2$ |
| 26 | GaP/CaF₂ | −0.21 % | HCl | PH₃ | $2Ga + 6HCl \rightarrow 2GaCl_3 + 3H_2 \rightarrow GaCl_3 + PH_3 \rightarrow GaP + 3HCl$ |
| 27 | GaAs/CaF₂ | +3.50 % | HCl | AsH₃ | $2Ga + 6HCl \rightarrow 2GaCl_3 + 3H_2 \rightarrow GaCl_3 + AsH_3 \rightarrow GaAs + 3HCl$ |
| 28 | AlSb/BaF₂ | −0.98 % | HCl | SbH₃ | $2Al + 6HCl \rightarrow 2AlCl_3 + 3H_2 \rightarrow AlCl_3 + SbH_3 \rightarrow AlSb + 3HCl$ |
| 29 | GaSb/BaF₂ | −1.61 % | HCl | SbH₃ | $2Ga + 6HCl \rightarrow 2GaCl_3 + 3H_2 \rightarrow GaCl_3 + SbH_3 \rightarrow GaSb + 3HCl$ |
| 30 | GaP/LiNbO₃ | +5.87 % | HCl | PH₃ | $2Ga + 6HCl \rightarrow 2GaCl_3 + 3H_2 \rightarrow GaCl_3 + PH_3 \rightarrow GaP + 3HCl$ |

FIG. 13B

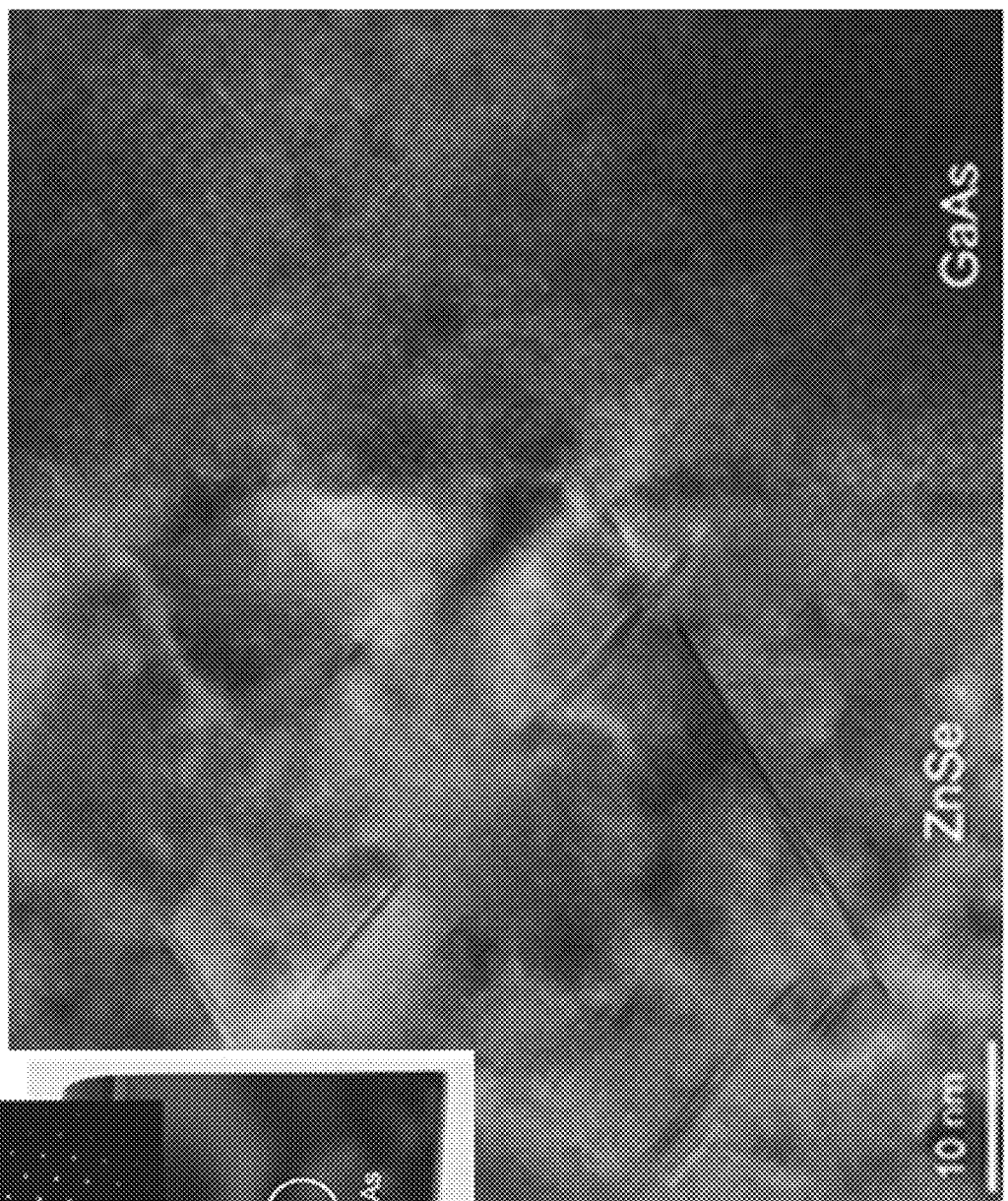
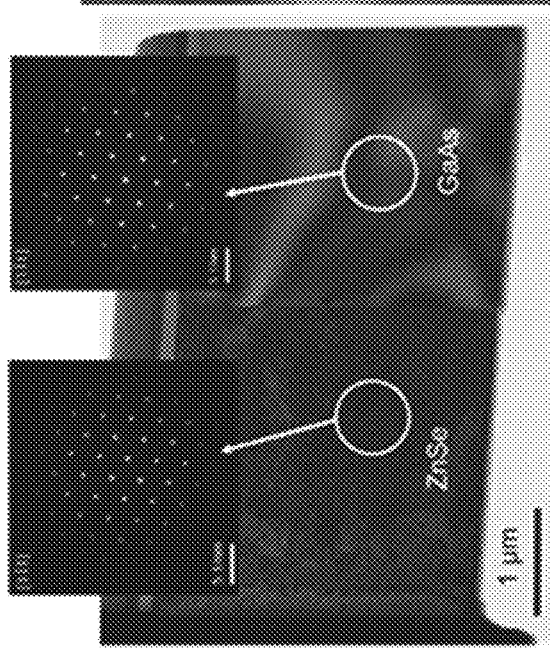
FIG. 15A
FIG. 15B

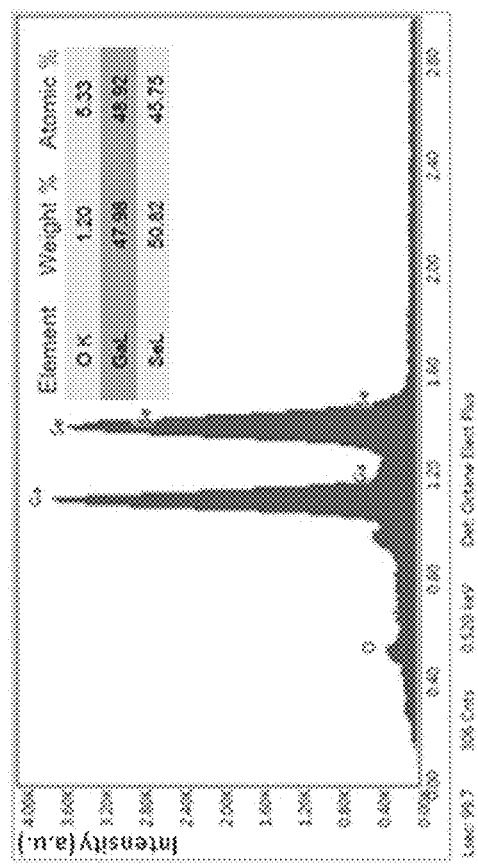
FIG. 18C
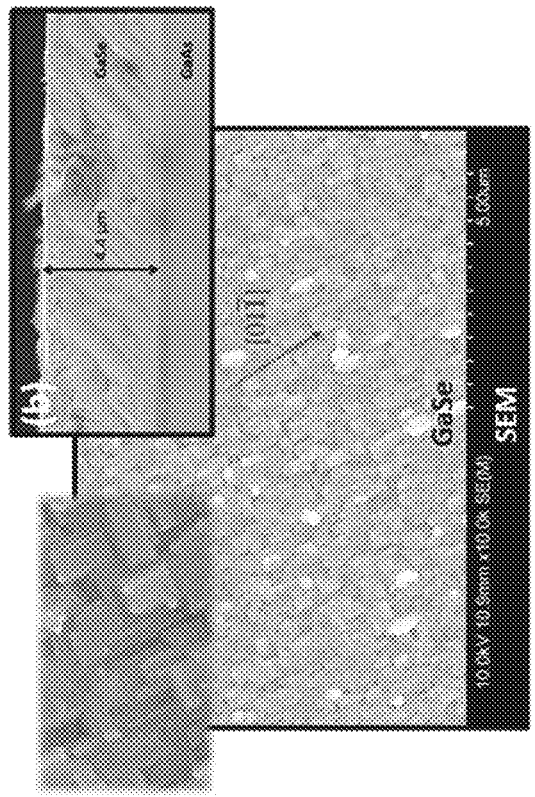
FIG. 18A
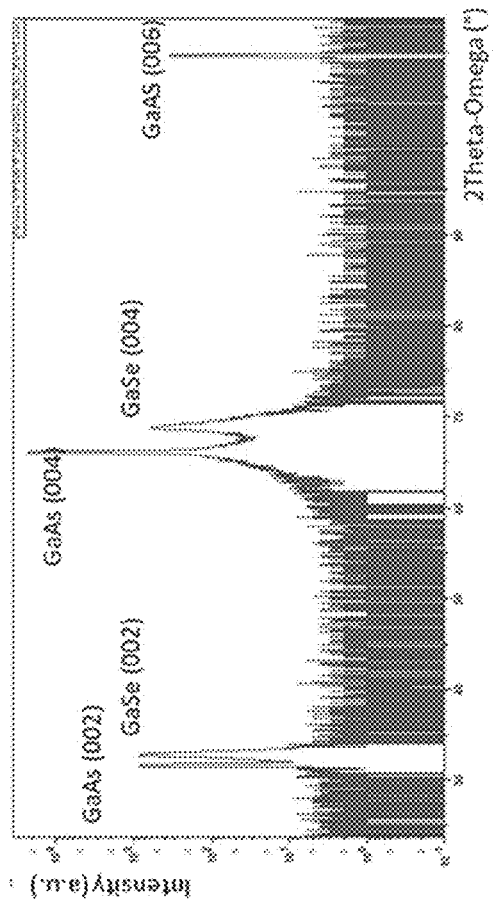
FIG. 18E
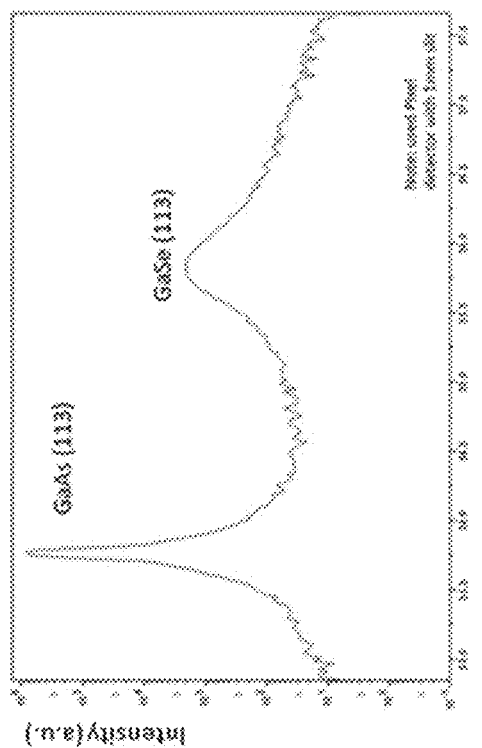
FIG. 18D
FIG. 18B

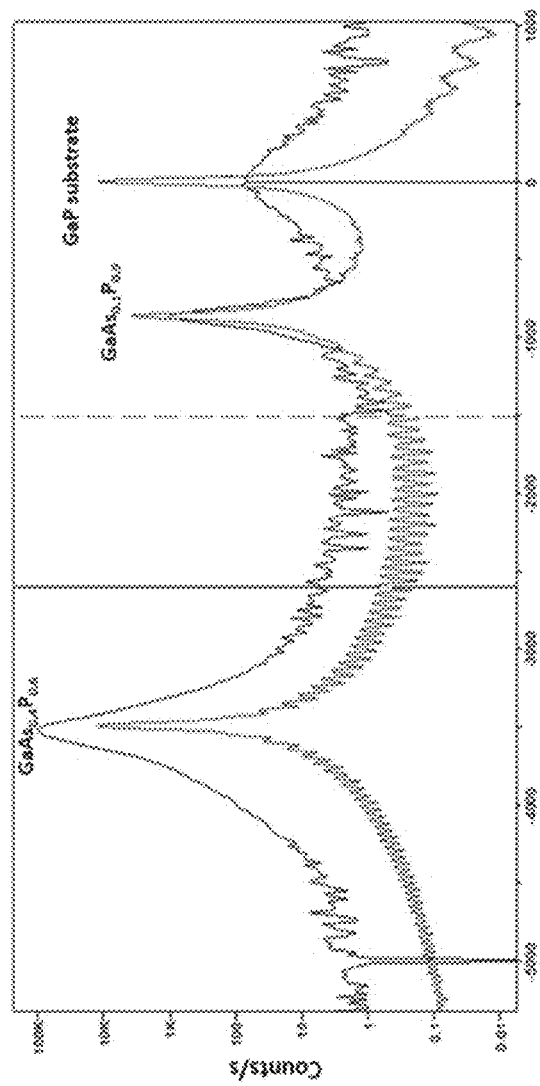
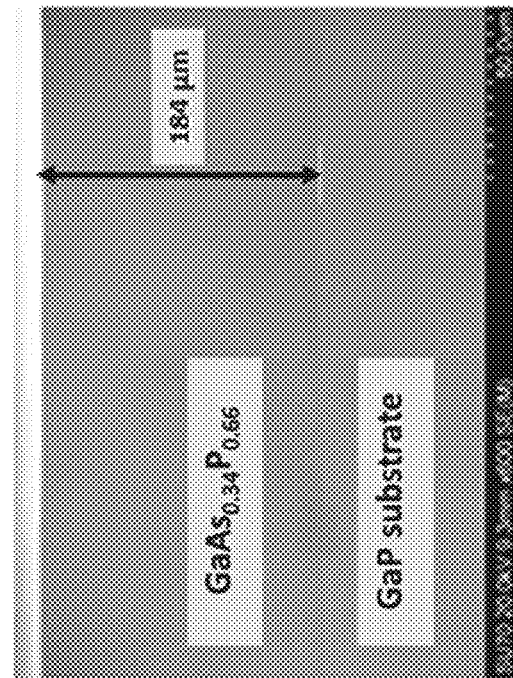
FIG. 19B
FIG. 19A

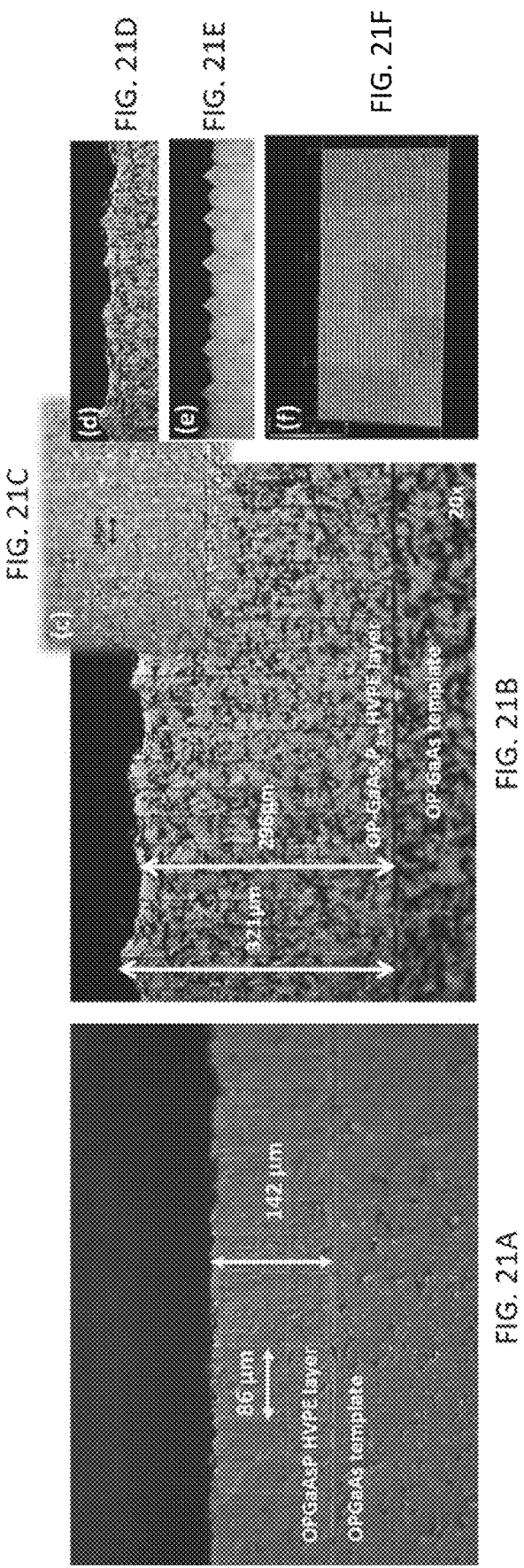

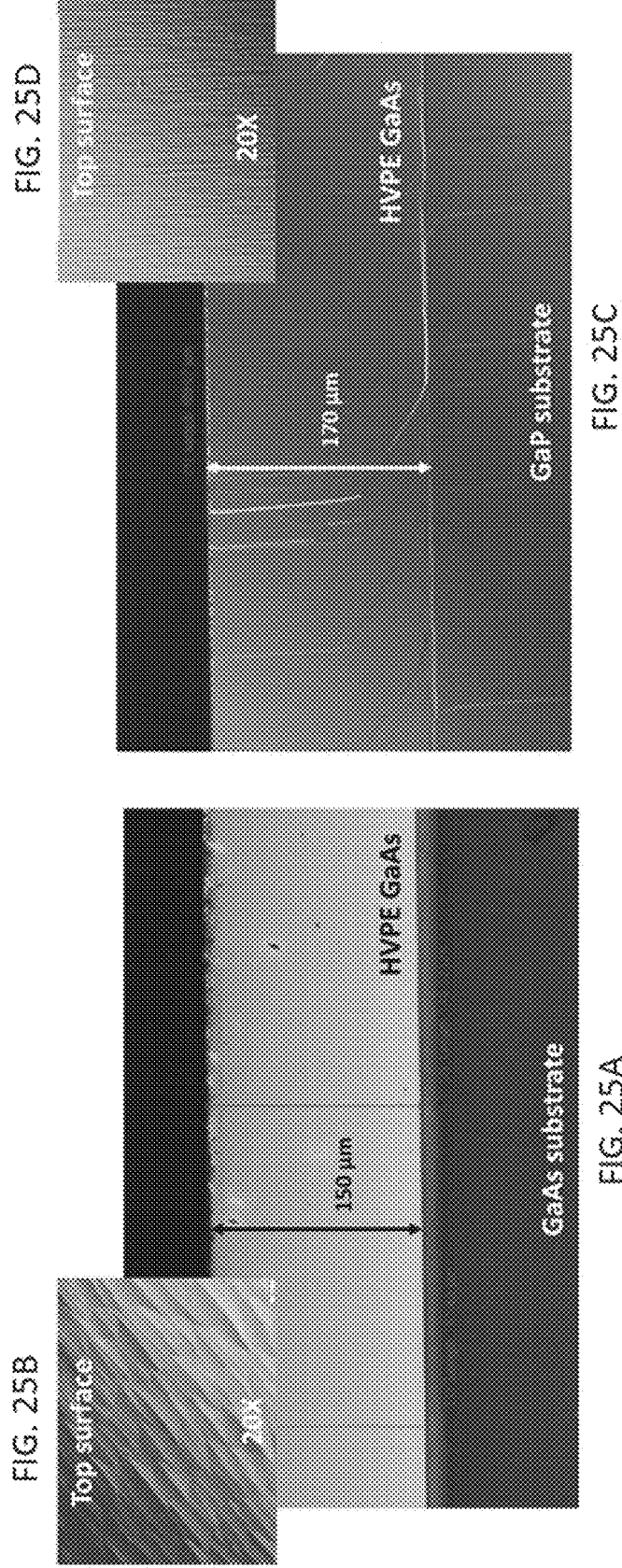

| Properties | PPLN | GaAs | GaP | ZnSe | c-GaSe | ZnTe | ZnS | CaF$_2$ | BaF$_2$ |
|---|---|---|---|---|---|---|---|---|---|
| *Optical* | | | | | | | | | |
| Transmission window [μm] | 0.37–5 | 1–16 | 0.55–12 | 0.6–18 | 0.6–19 | 0.7–30 | 0.38–14 | 0.13–10 | 0.15–12 |
| Band gap energy [eV] | 4 | 1.42 | 2.26 | 2.82 | 2.1 | 2.26 | 3.54 | 11.8 | 10.6 |
| Index of refraction n | 2.23 | 3.34 | 3.03 | 2.67 | 2.93 | 3.56 | 2.36 | 1.40 | 1.45 |
| NLO coefficient d$_{i4}$ at 1.064 μm [pm.V$^{-1}$] | 27 | 94 | 71 | 27 | 86 | 90 | 20 | N/A | N/A |
| 2PA coefficient [cm.G$^{-1}$.W$^{-1}$] at 1.06 μm | 0.38 | 28 | 0.02 | 5.5 | 6 | 4.5 | 2.0 | 2x10$^{-9}$ | 3x10$^{-9}$ |
| *Thermal* | | | | | | | | | |
| Thermal conductivity at 300 K [W.m$^{-1}$.K$^{-1}$] | 5.6 | 55 | 110 | 18 | 5.0 | 10.8 | 27.2 | 9.71 | 11.72 |
| Thermal expansion coeff. at 300 K [10$^{-6}$.K$^{-1}$] | 7.5–15.4 | 5.7 | 4.6 | 7.1 | 8.9 | 8.19 | 6.5 | 18.85 | 18.1 |
| Laser damage threshold [J/cm$^2$] | 2 | 3 | 5.4 | 5 | <1 | <1 | <1 | 5.17 | 2.91 |

FIG. 26

OPTIMIZED THICK HETEROEPITAXIAL GROWTH OF SEMICONDUCTORS WITH IN-SITU SUBSTRATE PRETREATMENT

PRIORITY

Pursuant to 37 C.F.R. § 1.78(a)(4), this application claims the benefit of and priority to prior filed co-pending Provisional Application Ser. No. 62/681,155, filed 6 Jun. 2018 and co-pending Non-Provisional application Ser. No. 16/201,446, filed 27 Nov. 2018, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to heteroepitaxial growth of semiconductor materials and, more particularly, to a process for thick heteroepitaxial growth, e.g. hundreds of microns thick layer growth, of semiconductor materials based on in-situ pre-growth treatment of the substrate.

BACKGROUND OF THE INVENTION

Heteroepitaxy, i.e. the growth of one material on a substrate from another material, has a remarkable impact on optics and electronics. Heteroepitaxy is the first choice and sometimes the only available option when there is lack of a native substrate. Examples of this are gallium nitride (GaN) and aluminum nitride (AlN) for which native substrates are not available. Accordingly, GaN and AlN continue to be grown mostly on sapphire ($Al_2O_3$) or on silicon carbide (SiC) substrates. There are a number of other cases, however, where even if native substrates are readily available, heteroepitaxy might still be preferable. Considerations for such cases are: 1) When the quality of the available native substrate is significantly lower, or their price significantly higher, in comparison to the quality and price of readily available non-native alternatives. An example of that is GaP/GaAs heteroepitaxy. Due to the lower etch pit density (EPD) of commercial GaAs (1500-5,000 $EP/cm^2$), compared to the EPD of the commercial GaP (80,000-100,000 $EP/cm^2$), the growth of GaP/GaAs by the Hydride Vapor Phase Epitaxy (HVPE) technique usually results in higher surface and crystalline quality of the heteroepitaxially-grown GaP compared to the homoepitaxially-grown GaP. In addition, the price of GaP wafers is much higher than the price of GaAs wafer, which would increase the cost of any intended final product; 2) When the related growth technique for the preparation of a particular substrate material is readily available but the growth technique still may be incapable of producing large enough (i.e. device size) substrates with the desired surface and crystalline quality. For example, the Physical Vapor Transport (PVT) technique is suitable for the growth of several different materials, e.g. SiC, ZnSe, ZnTe, ZnS, or GaSe boules. However, with the exception of SiC, the materials comparable to the boule size substrates, which are available on the market, are mostly polycrystalline; the offered crystalline samples prepared from such PVT-grown materials are, typically, about 5×5 or 10×10 mm. At the same time, even these relatively small "crystalline" samples still consist of at least 3-4 domains with different crystallographic orientations, i.e. technically they are not exactly crystalline. This means that in all these cases (ZnSe, ZnTe, ZnS, GaSe, etc.) the substrate is neither large enough, nor is their quality good enough for device fabrication; and 3) when, a combination of two or more different materials in a heterostructure sometimes have some undisputable, otherwise unachievable, advantage. One convincing example of such a case is the combination of a traditional, universal, and common semiconductor material, such as Si (or Ge), with some traditional linear or nonlinear optical material such as GaAs, GaP, GaSe, ZnSe, ZnS, etc. Si is widely distributed in nature. It is the cheapest and the most common substrate that has the highest material quality among the rest of the substrate materials. This may be attributed to the maturity of the available industrial growth techniques for its growth, e.g. CZ (Czochralski) growth and EFG (edge-defined film-fed growth). These techniques allow the growth of Si-boules up to 450 mm diameter or of large area Si-plates. Si is a unique material with high thermal resistivity, and electrical conductivity that can be easily tuned from low to high. This makes Si an attractive substrate for the heteroepitaxy of many of the already mentioned traditional linear and nonlinear optical materials. This may open the doors to various electronic, optical, or optoelectronic applications.

In order to optimize the growth of other materials on Si-substrates, the growth of a number of other electronic and optoelectronic materials (including GaAs and GaP) have been already attempted on Si-substrates using different growth techniques. Among these growth techniques are well-known industrial techniques such as Molecular Beam Epitaxy (MBE) and Metal Organic Chemical Vapor Deposition (MOCVD), as well some other less typical approaches, e.g. Remote Plasma-Enhanced Chemical Vapor Deposition (RPECVD) or Liquid Phase Epitaxy (LPE). The opposite cases of the growth of silicon on other suitable materials, including GaAs and GaP, have also been investigated.

The most frequent attempts of growth on silicon substrates were performed either directly on the Si-substrate or after the deposition of an intermediate buffer layer (described immediately below), in order to accommodate the growing layer to the foreign substrate (Si). A great deal of effort has been made in engineering those buffer layers.

The choice of Si as a substrate some inconveniences as well, for example, its fast oxidation, which requires performing special prior-growth chemical etching procedures to remove this oxide layer. Keeping the substrate in a hot hydrogen flow prior to growth, when the sample is already within the reactor chamber, is also helpful. Replacing Si with some alternative substrates may eliminate some problems, such as the need to remove the oxide layer from the substrate surface. However, of course, each replacement material will bring problems that are specific for each material. One way or another, in most cases, some kind of pre-growth treatment of the substrate will be necessary, either when it is outside of the reactor or when it is already within the reactor chamber. Such treatments may be necessary to facilitate the initial nucleation, which is the most important stage of the growth because it determines all subsequent growth stages. An example of a pre-growth substrate treatment is the pre-growth treatment of a sapphire substrate prior to the growth of GaN on it. This procedure is known as "nitridation" of the surface. For this purpose, prior to growth the sapphire substrate is kept for some time at a certain temperature in an ammonia ($NH_3$) flow with the idea to convert a thin region of the top sapphire ($Al_2O_3$) surface into aluminum nitride (AlN). The usefulness of this treatment step is that the lattice mismatch between GaN and AlN is much smaller (2.5%) than the lattice mismatch between GaN and sapphire (33%) and, thus, GaN may grow more successfully on AlN than on sapphire. Note: the in-plane lattice mismatch between AlN (0001) and sapphire (0001) is also large, even larger, 35%, than the lattice mismatch between GaN and sapphire. Fortunately, when AlN (0001) grows on sapphire (0001), its lattice cell naturally rotates at 30° around its c-axis (which is the [0001] crystallographic direction—the direction of the fastest growth in case of growth of III-Nitrides) with respect to the sapphire lattice cell, which rotation automatically reduces the AlN/sapphire lattice mismatch from 35% to 13.3%, so AlN could grow successfully on sapphire. The c-axis is perpendicular to the in-plane surface (0001). The c-axis is visible in FIG. 2A as the [001] axis. This is also the most favorable direction for growth. The materials we are growing (GaP, GaAs, etc.) are with a cubic zinc blende structure, while the III-Nitrides, given here as an example, have a hexagonal wurtzite structure. To further accommodate the growing GaN layer to the sapphire substrate, the nitridation process may be followed by the deposition of the so-called low-temperature (LT) AlN or GaN buffer layer—a highly defective area, which serves to release the strain accumulated during the initial stage of heteroepitaxy. The next step in the growth process is the deposition of the intended thick high-temperature (HT) GaN layer on the sapphire substrate.

Next to the lattice mismatch, the thermal mismatch (this is the difference in the thermal expansion coefficients of the substrate and the layer materials) is another factor that, along with the difference in the thermal conductivity, should be taken into account when attempting heteroepitaxial growth, especially thick heteroepitaxial growth, because it may result in layer cracking. Because the thermal mismatch has a more significant effect during thick growths, the HVPE growth technique, a traditional technique for thick layer growth, was neglected for a while. Instead, research has been focused for a number of years on using thin growth techniques, such as MOCVD or MBE. Other alternative solutions for achieving thick structures may include the wafer bonding technique or in some cases the PVT growth technique. All these techniques, of course, have their own disadvantages. Respectively, growths of some other materials, such as ZnSe, GaAs, GaP, GaSb and their ternaries or quaternaries on each other, mostly by MOCVD and MBE, have also been reported.

In the particular case of nonlinear optical (NLO) materials, such as GaAs, GaP, or ZnSe, especially when the pursued applications were related to the development of frequency conversion devices based on quasi-phase matching (QPM), the growth is performed on so-called orientation-patterned (OP) templates. The typical pattern on such a template consists of parallel-striped areas (domains) with periodically alternated crystal polarity deposited in a particular crystallographic direction on a substrate with a particular crystallographic orientation; the domains must have a certain width that satisfies the QPM conditions for obtaining conversion to a particular wavelength. In such cases, it is important to optimize thick HVPE growth to form the pattern throughout the whole layer thickness while maintaining good domain fidelity. At the same time, the layer must be thick enough to gain a large enough aperture for the pump beam and the related wave mixing processes to propagate throughout the medium and thus to "ignite" the expected frequency conversion (FC). In this particular case these patterns play a specific optical role and have nothing to do with the patterned templates mentioned above, which aim to facilitate the initial stages of growth in cases when the related mismatches are relatively large.

In the case of epitaxial growth on OP-templates, the heteroepitaxial approach is similarly preferred for at least two of the several reasons mentioned above. These are: 1) lack of native OP-templates, or 2) other advantages of combining two different materials in a QPM structure. Such advantages may be the better quality and/or the lower market price of the non-native substrate wafers, the availability of closely matching non-native OP templates, the more mature growth process on the alternative material, etc. Due to the first reason, PVT layer growth of OP-ZnSe (PVT is more known as a bulk growth technique) has been performed on OP-GaAs templates with a great deal of confidence, because of the small lattice mismatch (+0.24%) between ZnSe and GaAs. Subsequent attempts were used to grow thick GaP; first, on plain GaAs substrates and, later, of OP-GaP on OP-GaAs templates without much hope for success due to the larger lattice mismatch between GaAs and GaP (−3.57%). Surprisingly, while the first work yielded relatively poor domain fidelity and, therefore, limited optical results, the results from the second attempts were successful not only on plain GaAs substrates but also on OP-GaAs templates.

Unfortunately, at the beginning the resulting heteroepitaxially grown OP-GaP layers were not thick enough for a practical frequency conversion demonstration. Thus, OP-GaP/OP-GaAs heteroepitaxy was neglected for several more years, and research returned to the traditional way, i.e. homoepitaxy of OP-GaP/OP-GaP. However, the preparation of OP-GaP templates for the OP-GaP/OP-GaP homoepitaxy revealed some significant shortcomings. Such shortcomings include the low quality (poor parallelism, high EPD), high price, and limited availability of GaP wafers, the presence of an additional absorption band in the infrared (IR) region between 2 and 4 μm, the absence of an etch-stop material (used to secure the thickness of the inverted layer during the wafer bonding OP-templates preparation, etc. Therefore, using such wafers in the fabrication of OP-templates unavoidably resulted in the same poor OP-GaP template quality and, subsequently, in poor HVPE growths on them. Thus the idea to use the 5-6 times cheaper but with much higher quality OP-GaAs templates, which had been fabricated routinely for a number of years for OP-GaAs/OP-GaAs homoepitaxy, came back to the stage again—this time in support of the OP-GaP/OP-GaAs heteroepitaxy. Thus, after making some suitable changes in the reactor configuration and optimizing the growth process based on a deeper understanding the process chemistry and growth kinetics, we achieved highly repeatable heteroepitaxial growths of up to hundreds of microns thick OP-GaP layers with excellent domain fidelity on OP-GaAs templates.

The previous work left much to be desired with regard to heteroepitaxial thick growth opportunities. At this point, development in many areas of optics and electronics appeared to be almost to their limits, mostly because many of the explored materials themselves have achieved their fundamental or technological limits. However, much unexplored potential remains for HVPE heteroepitaxy through further engineering of the buffer layer or through other less explored approaches, especially in the cases of larger lattice and thermal mismatches between the substrate and the growing layer. The areas that will be favored by such advances include: 1) optoelectronics: some proper combinations of electronic semiconductor materials with linear or nonlinear optical materials realized by heteroepitaxy or by other flexible growth techniques (or combinations of growth techniques) may take over other less efficient approaches, such as wafer bonding, or some less controllable growth techniques such as, e.g. PVT. This can result in further miniaturization of ultrafast, all-optically communicating, cost-effective optoelectronic devices; 2) solar cell industry: even though Si can be grown easily in mature processes, e.g. CZ and EFG, and is still considered as an indisputable leader among the rest of the "solar cell" materials, there are many material limitations that restrict the efficiency of the Si-solar cells. In this case, heteroepitaxy of other materials on Si (GaAsP/Si as an example) may lead to new types small-dimension, high-power, broad-band hybrid, dual or multi-junction solar cells suitable for various unachieved, yet, applications; 3) multi-material heterostructures can also favor development of multi-color detectors that could cover a wide range of the spectrum; 4) Heteroepitaxy (including van der Waals heteroepitaxy) of 2D or, in general, low dimensional (LD) materials using foreign substrates; and 5) in the field of development of new laser sources heteroepitaxy may allow growths of phase matching birefringent materials (including of such that have never been grown practically in large monocrystalline substrates) or quasi-phase matching structures and the design of high power, broadly tunable frequency conversion (FC) devices. Such devices could easily achieve new frequency ranges resulting in various new applications in areas such as defense (IR countermeasures, enhanced laser radar, long-range IR communications), security (remote sensing and spectroscopy of chemical and biological species), industry (automotive pedestrian protection systems), science (ultrafast spectroscopy of chemical reaction dynamics), and medicine (breath analysis, biopsy free cancer cell detections).

The mechanisms of crystal growth are complex. On a practical level, it is difficult to determine on an atomic scale what exactly occurs after only the first few monolayers of growth, even in the simplest cases of homoepitaxy of plain semiconductor materials, e.g. Si and Ge. Obviously, heteroepitaxy is a more complex event. This is the real reason why the semiconductor industry has adopted only a few techniques for slow, thin growth, e.g. MOCVD and MBE, and for only a few well-studied materials. This is also the reason why thick growth approaches, e.g. HVPE, are used in only a limited number of homo- and heteroepitaxial cases. In reality, HVPE has never been accepted as a "full" member of the industrial family. An additional reason for that is that HVPE (and the other thick growth techniques) have their own growth problems such as parasitic nucleation during the HVPE process that, by competing the growth on the substrate, reduces the growth rate with the duration of growth and aggravates the layer quality. Another thing that introduces additional complexity is that the thick HVPE growth, especially thick heteroepitaxial growth, requires making certain steps towards accommodating the growing layer to the foreign substrates. These steps may include some special pretreatments of the substrate before placing the substrates within the reactor, or after that but prior the actual growth. Such thick growths may require prior to the thick HVPE growth a thin MOCVD or MBE buffer layer, or to perform a two-step thick growth process as the first step to deposit a low temperature (LT) buffer layer and after that, as a second step, to continue with a thick high temperature (HT) growth.

SUMMARY OF THE INVENTION

The present invention overcomes the foregoing problems and other shortcomings, drawbacks, and challenges of heteroepitaxial growth of semiconductor materials. While the invention will be described in connection with certain embodiments, it will be understood that the invention is not limited to these embodiments. To the contrary, this invention includes all alternatives, modifications, and equivalents as may be included within the spirit and scope of the present invention.

The inventive one-step thick HVPE growth process is preceded by an in-situ pre-growth treatment of the substrate, disclosed and explained below, and is supported by results that confirm that this approach ensures a smooth transition between the growing layer and the foreign substrates in many material cases, while avoiding other steps that may exhibit unfavorable impacts on the quality of the growing layer. The disclosed process demonstrates that in many cases heteroepitaxy may be the better choice, even when homoepitaxy is possible. Based on the results presented below it is suggested that the common belief that homoepitaxy is always preferable over heteroepitaxy should be reconsidered.

Due to the complex chemistry and specific growth issues for each material, HVPE is not a traditional industrial technique such as MOCVD and MBE. However, it is the only known approach (excluding wafer bonding or to a small extend the PVT technique) capable of providing the hundreds of microns thick layers which are needed for the applications discussed below. However, due the nature of its fast growth and, as a result, poor control of the initial stage of growth, HVPE may often be combined with either growth on patterned templates, or the prior deposition of a low- or high temperature intermediate buffer layer, which may be with a gradually changing chemical composition, called also a graded layer. As a close-to-equilibrium process, HVPE may also be combined with a far-from-equilibrium technique, such as MOCVD or MBE. In contrast to HVPE, such techniques by providing high supersaturation conditions may be used to deposit on the substrate an initial thin layer from the same or even other (better matching) material in many cases when HVPE cannot do that.

The differences between the MBE or MOCVD and HVPE result in differences in the buffer layer characteristics. For example, while the MOCVD or MBE buffer layers are typically only 30-370 nm thick, the HVPE buffer layers may have a thickness of 3-5 µm or even more. In addition, since MBE and MOCVD are "less sensitive" to lattice mismatch than HVPE, the thin "accommodating" buffer layer deposited between the substrate and the HVPE layer may be of a material different from the substrate material but the same as the subsequent HVPE layer material. If this is not possible, the buffer layer material should be at least with a close lattice match (best within 1% but at least no more than 2-3%) to the HVPE layer material. What a 'close' match may depend on a variety of parameters: sign of the lattice match (sometime a larger negative lattice mismatch is more favorable than a smaller positive lattice mismatch), the thermal mismatch and can it compensate the lattice mismatch, etc. For example, if the lattice mismatch is positive (the case of ZnSe/GaAs) the layer will grow under compressive strain, but since the thermal expansion coefficient of GaAs is larger than the thermal expansion coefficient of ZnSe, this will demand the opposite arrangement, i.e. the layer to grow under tensile strain. In such a case the opposite strains may favorably partially compensate each other. In most situations, a close lattice mismatch is within 1% but no more than 2-3%. For examples, GaN may be grown on Si, SiC, or sapphire on a pre-deposited thin MOCVD or MBE layer of GaN or AlN; GaN and AlN do not have a close lattice match with any of the three substrate materials. In contrast, the HVPE buffer layer shall have a close lattice match with both the substrate and the growing HVPE layer; the most successful may be the case where the HVPE buffer layer is a ternary of the parenting substrate and layer material. An example is the growth of GaP on GaAs (or vice versa) with the help of an intermediate $GaAs_xP_{1-x}$ buffer layer. The latter, however, is not mandatory; the intermediate HVPE buffer layer may be from another material with the same requirement, i.e. to match well (more or less, i.e. within 2-3% mismatch) to both substrate and layer material. We may grow, for example, GaAs on a GaP substrate or on a GaP buffer layer deposited in advance by a far-from-equilibrium growth process such as MOCVD or MBE on a Si substrate. To avoid using other growth techniques this transition GaP layer may be deposited at a lower than the growth temperature (LT buffer layer) as a first step of the HVPE growth process prior starting the high temperature growth of GaAs on this LT GaP buffer layer. For clarity it should be mentioned that, although a graded buffer intermediate layer may be pursued in both cases (MOCVD or MBE and HVPE) the meaning of "graded" or layer with "gradually changing chemical composition" may be different. For example, when we grow a buffer layer of GaN, changing the composition means gradually to change in the V/III ratio, i.e. to change the ratio between Ga and N, which makes the layer Ga- or N-rich—this may be achieved by changing the gas flow ratio between the hydride and halide precursor flows, e.g. between ammonia ($NH_3$) and $GaCl_3$ (formed by overflowing the molten Ga with a flow of HCl). In such a case grading the transition buffer layer may change its properties, e.g. the balance in the carrier concentration, but does not practically contribute very much to a better mismatch between the buffer and the growing layer, since this is the same material, GaN. In contrast, if one has the intention to grow GaP/GaAs, or the opposite, GaAs/GaP through the HVPE deposition of a LT transition $GaAs_xP_{1-x}$ ternary buffer layer, under composition change we shall have in mind the change in the ratio of arsine (As) and phosphorus (P), i.e. the ratio in the V-group atoms only (which may be controlled by the arsine to phosphine ($AsH_3$/$PH_3$) ratio, keeping the content of the III-group element (Ga), respectively the halide precursor (i. e. $GaCl_3$, formed by overflowing molten Ga with a flow of HCl) the same. Thus, in the case of GaP/GaAs, we may gradually increase the content of phosphorus (by increasing the $PH_3$ flow at the expense of the $AsH_3$ flow) for a better fit to the subsequent growth of GaP. Respectively, in the opposite case of GaAs/GaP growth we may gradually increase the content of arsenic (by increasing the $AsH_3$ flow at the expense of the $PH_3$ flow) for a better fit to the subsequent growth of GaAs. Adequate changes in the gas flows should be applied to insure an increasing amount of Ga at the expense of the Al content if the goal is to grow GaN on an AlN substrate through the formation of an AlGaN ternary buffer layer, no matter which growth technique is used, i.e. MOCVD, MBE or HVPE. In addition, when Si is the substrate (as an example), the bandgap energy of a $GaAs_xP_{1-x}$ ternary may be "tuned" by changing the x-composition of the ternary to an optimal value that fits to the bandgap of Si, or another selected substrate. The optimization of the heteroepitaxial growth of $GaAs_xP_{1-x}$ on a Si-substrate may be useful for realizing a new type portable and highly efficient, dual-junction solar cells.

In some cases, e.g. when the lattice mismatch (i.e. the relative difference between the lattices of the substrate and the growing layer-see eq. 1 below) between the Si-substrate and the growing layer is large—as large as in the case of GaAs growth on Si (4.2% lattice mismatch)—growths were purposely performed on so-called patterned templates. Note: Herein, a "substrate" is defined as a plain, ready-for-epitaxial-growth surface, while a "template" is a substrate that has a periodic or aperiodic structure, called a "pattern", deposited or otherwise formed on its surface. The pattern on the template has at least two roles: 1) to provide conditions for a more uniform nucleation on the template surface, like.g. evenly distributed nucleation spots; and 2) to contribute to a more efficient release of the initial strain built in as a result of the lattice and thermal mismatches between substrate and growing layer. This technique is reported to work well with other materials at even larger lattice mismatches than those between GaAs and Si, e.g. in cases such as the growth of GaSb on patterned GaAs templates (~7% lattice mismatch).

Next to its major role (to accommodate the growing layer to the substrate by providing a more uniform nucleation and facilitating the strain relief), the buffer layer may also be used for modifying the material quality. (Note: As far as a pattern on the substrate may provide conditions for more uniform nucleation, it also may be considered a buffer layer). For example, the buffer layer may be used to change the bandgap of the material, as was already pointed to in one of the examples, or to achieve better electrical and/or optical material properties. For example, it is known that during heteroepitaxy the lattice mismatch between the two materials is the reason for the appearance of a number of dangling (unsatisfied) bonds, which are typically associated to free carriers. Thus by controlling the number (amount) of dangling bonds one may control the free carrier concentration and, from here, to modify the material properties.

At this point, along with the various important roles that the buffer layer plays during heteroepitaxy, there are also a number of serious problems associated with its deposition. This means it should be avoided, when possible. The focus of the present invention is to replace, when possible, the deposition of the buffer layer with in-situ substrate pretreatment procedures, and when it is not possible, at least, to make the deposition of such a buffer layer a natural and inseparable stage of a one-step growth process.

According to one embodiment of the present invention a method of performing heteroepitaxy, comprises exposing a substrate comprising one of GaAs, AlAs, InAs, GaP, InP, ZnSe, GaSe, CdSe, InSe, ZnTe, CdTe, GaTe, HgTe, GaSb, InSb, AlSb, CdS, ZnS, GaN, AlN, Si, $CaF_2$, $BaF_2$, and $LiNbO_3$ (including PPLN) to a carrier gas, a first precursor gas (which typically carries a Group II or Group III element), and a second precursor gas (which typically is a hydride or halide), to form a heteroepitaxial growth of one of GaAs, AlAs, InAs, GaP, InP, ZnSe, GaSe (or $Ga_2Se_3$), CdSe, InSe, ZnTe, CdTe, GaTe (or $Ga_2Te_3$), HgTe, GaSb, GaSe, InSb, AlSb, AlAs, InAs, CdS, ZnS, GaN, AlN and some of their ternaries such as GaAsP, HgCdTe, etc., on the substrate; wherein the carrier gas is $H_2$, wherein the first precursor is HCl, the Group II or III element comprises at least one of Zn, Cd, Hg, Al, Ga, and In, and wherein the second precursor is one of $AsH_3$ (arsine), $PH_3$ (phosphine), $H_2Se$ (hydrogen selenide), $H_2Te$ (hydrogen telluride), $H_2S$ (hydrogen sulfide), $SbH_3$ (hydrogen antimonide, called also "stibine"), HF (hydrogen fluoride) and $NH_3$ (ammonia) or a mixture of some of them. The process may be an HVPE (hydride vapor phase epitaxy) process (Note: If growing III-Nitrides when halides are used as a second precursor this process may be called halide (instead of hydride) vapor phase epitaxy). More than one second precursor may be used in a mixture, in varying ratios of the mixed single precursor.

According to a first variation of the invention, the substrate is GaAs (gallium arsenide), the second precursor gas is $PH_3$ (phosphine), and the heteroepitaxial growth is GaP (gallium phosphide).

According to another variation of the invention, the substrate is GaP (gallium phosphide), the second precursor gas is $AsH_3$ (arsine), and the heteroepitaxial growth is GaAs (gallium arsenide).

According to another variation of the invention, the substrate is GaAs (gallium arsenide), the second precursor gasses are $AsH_3$ (arsine) and $PH_3$ (phosphine), and the heteroepitaxial growth is GaAsP (gallium arsenide phosphide).

According to another variation of the invention, the substrate is GaP (gallium phosphide), the second precursor gasses are $AsH_3$ (arsine) and $PH_3$ (phosphine), and the heteroepitaxial growth is GaAsP (gallium arsenide phosphide).

According to a further variation of the invention, the substrate is GaAs (gallium arsenide), the second precursor gas is $H_2Se$ (hydrogen selenide), and the heteroepitaxial growth is ZnSe (zinc selenide).

According to another variation of the invention, the substrate is ZnSe (zinc selenide), the second precursor gas is $AsH_3$ (arsine), and the heteroepitaxial growth is GaAs (gallium arsenide).

According to another variation of the invention, the substrate is GaSb (gallium antimonide), the second precursor gas is $H_2Te$ (hydrogen telluride), and the heteroepitaxial growth is ZnTe (zinc telluride).

According to a further variation of the invention, the substrate is ZnTe (zinc telluride), the second precursor gas is $SbH_3$ (antimony tri-hydride, called also stibine), and the heteroepitaxial growth is GaSb (gallium antimonide).

According to a further variation of the invention, the substrate is InAs (indium arsenide), the second precursor gas is $H_2Te$ (hydrogen telluride), and the heteroepitaxial growth is ZnTe (zinc telluride).

According to a further variation of the invention, the substrate is ZnTe (zinc telluride), the second precursor gas is $AsH_3$ (arsine), and the heteroepitaxial growth is InAs (indium arsenide).

According to a further variation of the invention, the substrate is GaN (gallium nitride), the second precursor gas is $H_2Se$ (hydrogen selenide), and the heteroepitaxial growth is ε-GaSe (hexagonal phase GaSe—gallium selenide).

According to another variation of the invention, the substrate is ε-GaSe (hexagonal gallium selenide), the second precursor gas is $NH_3$ (ammonia), and the heteroepitaxial growth is GaN (gallium nitride).

According to a further variation of the invention, the substrate is GaP (gallium phosphide), the second precursor gas is $H_2Se$ (hydrogen selenide), and the heteroepitaxial growth is $Ga_2Se_3$ (cubic phase zinc blende $Ga_2Se_3$—gallium selenide).

According to a further variation of the invention, the substrate is $Ga_2Se_3$ (cubic phase zinc blende $Ga_2Se_3$—gallium selenide), the second precursor gas is $PH_3$ (phosphine), and the heteroepitaxial growth is GaP (gallium phosphide).

According to a further variation of the invention, the substrate is GaAs (gallium arsenide), the second precursor gas is $H_2Se$ (hydrogen selenide), and the heteroepitaxial growth is $Ga_2Se_3$ (cubic phase zinc blende $Ga_2Se_3$—gallium selenide).

According to a further variation of the invention, the substrate is $Ga_2Se_3$ (cubic phase zinc blende $Ga_2Se_3$—gallium selenide), the second precursor gas is $AsH_3$ (arsine), and the heteroepitaxial growth is GaAs (gallium arsenide).

According to another variation of the invention, the substrate is AlN (aluminum nitride), the second precursor gas is $H_2Se$ (hydrogen selenide), and the heteroepitaxial growth is ε-GaSe (hexagonal gallium selenide).

According to a further variation of the invention, the substrate is ε-GaSe (hexagonal gallium selenide), the second precursor gas is $NH_3$ (ammonia), and the heteroepitaxial growth is AlN (aluminum nitride).

According to a further variation of the invention, the substrate is GaAs (gallium arsenide), the second precursor gas is $AsH_3$ (arsine), and the heteroepitaxial growth is AlAs (aluminum arsenide).

According to a further variation of the invention, the substrate is AlAs (aluminum arsenide), the second precursor gas is $AsH_3$ (arsine), the heteroepitaxial growth is GaAs (gallium arsenide).

According to another variation of the invention, the substrate is GaP (gallium phosphide), the second precursor gas is $H_2S$ (hydrogen sulfide), and the growing layer is ZnS (zinc sulfide)

According to another variation of the invention, the substrate is ZnS (zinc sulfide), the second precursor gas is $PH_3$ (phosphine), and the growing layer is GaP (gallium phosphide)

According to another variation of the invention, the substrate is InP (indium phosphide), the second precursor gas is $H_2S$ (hydrogen sulfide), and the heteroepitaxial growth is CdS (cadmium sulfide)

According to another variation of the invention, the substrate is CdS (cadmium sulfide), the second precursor gas is $PH_3$ (phosphine), and the heteroepitaxial growth is InP (indium phosphide).

According to another variation of the invention, the substrate is InP (indium phosphide), the second precursor gas is $H_2Te$ (hydrogen telluride), and the heteroepitaxial growth is cubic phase zinc blende gallium telluride $Ga_2Te_3$.

According to another variation of the invention, the substrate is cubic phase zinc blende gallium telluride $Ga_2Te_3$, the second precursor gas is $PH_3$ (phosphine), and the heteroepitaxial growth is InP (indium phosphide).

According to another variation of the invention, the substrate is GaSb (gallium antimonide), the second precursor gas is $AsH_3$ (arsine), and the heteroepitaxial growth is InAs (indium arsenide).

According to another variation of the invention, the substrate is InAs (indium arsenide), the second precursor gas is $SbH_3$ (stibine), and the heteroepitaxial growth is GaSb (gallium antimonide).

According to another variation of the invention, the substrate is InAs (indium arsenide), the second precursor gas is $H_2Se$ (hydrogen selenide), and the heteroepitaxial growth is CdSe (cadmium selenide).

According to another variation of the invention, the substrate is CdSe cadmium selenide), the second precursor gas is $AsH_3$ (arsine), and the growing layer is InAs (indium arsenide).

According to another variation of the invention, the substrate is InAs (indium arsenide), the second precursor gas is $AsH_3$ (arsine), and the heteroepitaxial growth is AlAs (aluminum arsenide). (Note: The opposite case is not presented due to the lack of AlAs substrates).

According to another variation of the invention, the substrate is InAs (indium arsenide), the second precursor gas is SbH$_3$ (stibine), and the heteroepitaxial growth is AlSb (aluminum antimonide).

According to another variation of the invention, the substrate is AlSb (aluminum antimonide), the second precursor gas is SbH$_3$ (stibine), and the heteroepitaxial growth is InAs (indium arsenide).

According to another variation of the invention, the substrate is AlSb (aluminum antimonide), the second precursor gas is SbH$_3$ (stibine), and the heteroepitaxial growth is GaSb (gallium antimonide).

According to another variation of the invention, the substrate is GaSb (gallium antimonide), the second precursor gas is SbH$_3$ (stibine), and the heteroepitaxial growth is AlSb (aluminum antimonide).

According to another variation of the invention, the substrate is GaSb (gallium antimonide), the second precursor gas is AsH$_3$ (arsine), and the heteroepitaxial growth is AlAs (aluminum arsenide).

According to another variation of the invention, the substrate is AlAs (aluminum arsenide), the second precursor gas is SbH$_3$ (stibine), and the heteroepitaxial growth is GaSb (gallium antimonide).

According to another variation of the invention, the substrate is InSb (indium antimonide), the second precursor gas is H$_2$Te (hydrogen telluride), and the heteroepitaxial growth is CdTe (cadmium telluride).

According to another variation of the invention, the substrate is CdTe (cadmium telluride), the second precursor gas is SbH$_3$ (stibine), and the heteroepitaxial growth is InSb (indium antimonide)

According to another variation of the invention, the substrate is InSb (indium antimonide), the second precursor gas is H$_2$Te (hydrogen telluride), and the heteroepitaxial growth is HgTe (mercury telluride).

According to another variation of the invention, the substrate is HgTe (mercury telluride), the second precursor gas is SbH$_3$ (stibine), and the heteroepitaxial growth is InSb (indium antimonide).

According to another variation of the invention, the substrate is CdTe (cadmium telluride), the second precursor gas is H$_2$Te (hydrogen telluride), and the heteroepitaxial growth is HgTe (mercury telluride).

According to another variation of the invention, the substrate is HgTe (mercury telluride), the second precursor gas is H$_2$Te (hydrogen telluride), and the heteroepitaxial growth is CdTe (cadmium telluride).

According to another variation of the invention, the substrate is InSb (indium antimonide), CdTe (cadmium telluride) or HgTe (mercury telluride). The second precursor gas is H$_2$Te (hydrogen telluride), and the heteroepitaxial growth is HgCdTe (mercury cadmium telluride).

According to another variation of the invention, the substrate is HgCdTe (mercury cadmium telluride), the second precursor gas is H$_2$Te (hydrogen telluride), and the heteroepitaxial growth is CdTe (cadmium telluride) or HgTe (mercury telluride), or if the second precursor gas is SbH$_3$ (hydrogen antimonide) the heteroepitaxial growth is InSb (indium antimonide), According to another variation of the invention, the substrate is from a material that is suitable for growth of InSe (indium selenide), the second precursor gas is H$_2$Se (hydrogen selenide), and the heteroepitaxial growth performed through van der Waals heteroepitaxy is InSe (indium selenide). (Note: The opposite case is not presented due to the lack of InSe substrates).

According to another variation of the invention, the substrate is CaF$_2$ (calcium fluoride), the second precursor gas is PH$_3$ (phosphine), and the heteroepitaxial growth is GaP (gallium phosphide). (Note: The opposite case is not presented as less interesting from practical point of view).

According to another variation of the invention, the substrate is CaF$_2$ (calcium fluoride), the second precursor gas is AsH$_3$ (arsenide), and the heteroepitaxial growth is GaAs (gallium arsenide). (Note: The opposite case is not presented as less interesting from practical point of view).

According to another variation of the invention, the substrate is BaF$_2$ (barium fluoride), the second precursor gas is SbH$_3$ (hydrogen antimonide), and the heteroepitaxial growth is AlSb (aluminum antimonide). (Note: The opposite case is not presented as less interesting from practical point of view).

According to another variation of the invention, the substrate is BaF$_2$ (barium fluoride), the second precursor gas is SbH$_3$ (hydrogen antimonide), and the heteroepitaxial growth is GaSb (gallium antimonide). (Note: The opposite case is not presented as less interesting from practical point of view).

According to another variation of the invention, the substrate is LiNbO$_3$ (lithium niobate) or periodically poled lithium niobate (PPLN), the second precursor gas is PH$_3$ (phosphine), and the heteroepitaxial growth is GaP (gallium phosphide) or OP-GaP. (Note: The opposite case is not presented as less interesting from practical point of view).

According to another variation of the invention, the substrate is LiNbO$_3$ (lithium niobate) or periodically poled lithium niobate (PPLN), the second precursor gas is AsH$_3$ (arsine), and the heteroepitaxial growth is GaAs (gallium arsenide) or OP-GaAs. (Note: The opposite case is not presented as less interesting from practical point of view).

According to a second embodiment of the invention, a method of performing heteroepitaxy, comprises exposing a substrate to a carrier gas, a first precursor gas, a Group II/III element, and ternary-forming gasses (V/VI group precursor), to form a heteroepitaxial growth of one of GaAs, AlAs, InAs, GaP, InP, ZnSe, GaSe (or Ga$_2$Se$_3$), CdSe, InSe, ZnTe, CdTe, GaTe (or Ga$_2$Te$_3$), HgTe, GaSb, GaSe, InSb, AlSb, AlAs, InAs, CdS, ZnS, GaN, AlN and some of their ternaries such as GaAsP, HgCdTe, etc. on the substrate; wherein the substrate comprises one of GaAs, AlAs, InAs, GaP, InP, ZnSe, GaSe (or Ga$_2$Se$_3$), CdSe, InSe, ZnTe, CdTe, GaTe (or Ga$_2$Te$_3$), HgTe, GaSb, InSb, AlSb, CdS, ZnS, GaN, AlN, Si, CaF$_2$, BaF$_2$, and LiNbO$_3$ (including PPLN); wherein the carrier gas is H$_2$, wherein the first precursor gas is HCl, the Group II/III element comprises at least one of Zn, Cd, Hg, Al, Ga, and In; and wherein the ternary-forming gasses comprise at least two or more of AsH$_3$ (arsine), PH$_3$ (phosphine), H$_2$Se (hydrogen selenide), H$_2$Te (hydrogen telluride), SbH$_3$ (hydrogen antimonide, or antimony tri-hydride, or stibine), H$_2$S (hydrogen sulfide), NH$_3$ (ammonia), and HF (hydrogen fluoride); flowing the carrier gas over the Group II/III element; exposing the substrate to the ternary-forming gasses in a predetermined ratio of first ternary-forming gas to second ternary-forming gas (1tf:2tf ratio); and changing the 1tf:2tf ratio over time.

According to a first variation of this embodiment, the method further comprises flowing the ternary-forming gasses through the furnace at a 1tf:2tf ratio of about 1:0; heating the substrate to about 500° C.-900° C.; and gradually changing the 1tf:2tf ratio towards 0:1, or to any other ratio between 1:0 to 0:1, over a time period of 1 min-10 hours. One of the gas flows may be as much as 20× smaller than the other. The final targeted 1tf:2tf ratio may be anywhere between 1:0 and 0:1, e.g. 1:2, 1:4, 1:8, 1:10, 0.5:10, 0.5:20, or any other ratio, depending on the particular gases and conditions in the reactor.

According to another variation of this embodiment, the Group II/III element is Ga, the substrate is GaAs (gallium arsenide), the first ternary-forming gas is $AsH_3$, the second ternary-forming gas is $PH_3$ (phosphine), and the heteroepitaxial growth is GaP (gallium phosphide). This corresponds to GaP on GaAs, i.e. GaP/GaAs.

According to a further variation of this embodiment, the Group II/III element is Ga, wherein the substrate is GaP (gallium phosphide), the first ternary-forming gas is $PH_3$, the second ternary-forming gas is $AsH_3$ (arsine), and the heteroepitaxial growth is GaAs (gallium arsenide). This corresponds to GaAs on GaP.

According to another variation of this embodiment, the Group II/III element is Ga, wherein the substrate is GaAs (gallium arsenide), the first ternary-forming gas is $AsH_3$ (arsine), the second ternary-forming gas is $PH_3$ (phosphine), and the heteroepitaxial growth is GaAsP (gallium arsenide phosphide). This corresponds to GaAsP on GaAs.

According to a further variation of this embodiment, the Group II/III element is Ga, wherein the substrate is GaP (gallium phosphide), the first ternary-forming gas is $PH_3$ (phosphine), the second ternary-forming gas is $AsH_3$ (arsine), and the heteroepitaxial growth is GaAsP (gallium arsenide phosphide). This corresponds to GaAsP on GaP.

According to another variation of this embodiment, the Group II/III element is Zn, wherein the substrate is GaAs (gallium arsenide), the second ternary-forming gas is $AsH_3$, the second ternary-forming gas is $H_2Se$ (hydrogen selenide), and the heteroepitaxial growth is ZnSe (zinc selenide). This corresponds to ZnSe on GaAs.

According to a further variation of this embodiment, the Group II/III element is Ga, wherein the substrate is ZnSe (zinc selenide), the first ternary-forming gas is $H_2Se$, the second ternary-forming gas comprises $AsH_3$ (arsine), and the heteroepitaxial growth is GaAs (gallium arsenide). This corresponds to GaAs on ZnSe.

According to another variation of this embodiment, the Group II/III element is Zn, wherein the substrate is GaSb (gallium antimonide), the first ternary-forming gas is $SbH_3$, the second ternary-forming gas is $H_2Te$ (hydrogen telluride), and the heteroepitaxial growth is ZnTe (zinc telluride). This corresponds to ZnTe on GaSb.

According to a further variation of this embodiment, the Group II/III element is Ga, wherein the substrate is ZnTe (zinc telluride), the first ternary-forming gas is $H_2Te$, the second ternary-forming gas is $SbH_3$ (hydrogen antimonide/stibine/antimony tri-hydride), and the heteroepitaxial growth is GaSb (gallium antimonide). This corresponds to GaSb on ZnTe.

According to another variation of this embodiment, the Group II/III element is Zn, wherein the substrate is InAs (indium arsenide), the first ternary-forming gas is $AsH_3$, the second ternary-forming gas is $H_2Te$ (hydrogen telluride), and the heteroepitaxial growth is ZnTe (zinc telluride). This corresponds to ZnTe on InAs.

According to a further variation of this embodiment, the Group II/III element is In, wherein the substrate is ZnTe (zinc telluride), the first ternary-forming gas is $H_2Te$, the second ternary-forming gas is $AsH_3$ (arsine), and the heteroepitaxial growth is InAs (indium arsenide). This corresponds to InAs on ZnTe.

According to another variation of this embodiment, the Group II/III element is Ga, wherein the substrate is GaN (gallium nitride), the first ternary-forming gas is $NH_3$, the second ternary-forming gas is $H_2Se$ (hydrogen selenide), and the heteroepitaxial growth is hexagonal ε-GaSe (gallium selenide). This corresponds to hexagonal GaSe on GaN.

According to a further variation of this embodiment, the Group II/III element is Ga, wherein the substrate is hexagonal ε-GaSe (gallium selenide), the first ternary-forming gas is $H_2Se$, the second ternary-forming gas is $NH_3$ (ammonia), and the heteroepitaxial growth is GaN (gallium nitride). This corresponds to GaN on hexagonal GaSe.

According to another variation of this embodiment, the Group II/III element is Ga, wherein the substrate is GaP (gallium phosphide), the first ternary-forming gas is $PH_3$, the second ternary-forming gas is $H_2Se$ (hydrogen selenide), and the heteroepitaxial growth is cubic phase zinc blende gallium selenide $Ga_2Se_3$. This corresponds to cubic phase zinc blende $Ga_2Se_3$ on GaP.

According to a further variation of this embodiment, the Group II/III element is Ga, wherein the substrate is cubic phase zinc blende gallium selenide $Ga_2Se_3$, the first ternary-forming gas is $H_2Se$, the second ternary-forming gas is $PH_3$ (phosphine), and the heteroepitaxial growth is GaP (gallium phosphide). This corresponds to GaP on cubic phase zinc blende gallium selenide $Ga_2Se_3$.

According to another variation of this embodiment, the Group II/III element is Ga, wherein the substrate is GaAs (gallium arsenide), the first ternary-forming gas is $AsH_3$, the second ternary-forming gas is $H_2Se$ (hydrogen selenide), and the heteroepitaxial growth is cubic phase zinc blende gallium selenide $Ga_2Se_3$. This corresponds to cubic phase zinc blende gallium selenide $Ga_2Se_3$ on GaAs.

According to a further variation of this embodiment, the Group II/III element is Ga, wherein the substrate is cubic phase zinc blende gallium selenide $Ga_2Se_3$, the first ternary-forming gas is $H_2Se$, the second ternary-forming gas is $AsH_3$ (arsine), and the heteroepitaxial growth is GaAs (gallium arsenide). This corresponds to GaAs on cubic phase zinc blende gallium selenide $Ga_2Se_3$.

According to another variation of this embodiment, the Group II/III element is Ga, the substrate is AlN (aluminum nitride), the first ternary-forming gas is $NH_3$, the second ternary-forming gas is $H_2Se$ (hydrogen selenide), and the heteroepitaxial growth is hexagonal ε-GaSe (gallium selenide). This corresponds to hexagonal GaSe on AlN.

According to a further variation of this embodiment, the Group II/III element is Al, the substrate is hexagonal ε-GaSe (gallium selenide), the first ternary-forming gas is $H_2Se$, the second ternary-forming gas is $NH_3$ (ammonia), and the heteroepitaxial growth is AlN (aluminum nitride). This corresponds to AlN on hexagonal GaSe.

According to another variation of this embodiment, the Group II/III element is Al, the substrate is GaAs (gallium arsenide), the first ternary-forming gas is $AsH_3$, the second ternary-forming gas is $AsH_3$ (arsine), and the heteroepitaxial growth is AAs (aluminum arsenide). This corresponds to AAs on GaAs. Since GaAs and AAs are both arsenides, there is no need of a mixture of ternary gases. The opposite growth, GaAs/AlAs, is not presented because of the lack of AlAs substrates. However, the lattice mismatch between GaAs and AlAs is negligible (+0.127%). High quality GaAs substrates and OP-GaAs templates are both readily available. Accordingly, heteroepitaxial growth of high quality AlAs on GaAs and even on OP-GaAs is very possible.

According to a further variation of this embodiment, the Group II/III element is Zn, the substrate is GaP (gallium phosphide), the first ternary-forming gas is $PH_3$, the second ternary-forming gas is H$_2$S (hydrogen sulfide), and the heteroepitaxial growth is ZnS (zinc sulfide). This corresponds to ZnS on GaP.

According to another variation of this embodiment, the Group II/III element is Ga, the substrate is ZnS (zinc sulfide), the first ternary-forming gas is H$_2$S, the second ternary-forming gas is PH$_3$ (phosphine), and the heteroepitaxial growth is GaP (gallium phosphide). This corresponds to GaP on ZnS.

According to a further variation of this embodiment, the Group II/III element is Cd, the substrate is InP (indium phosphide), the first ternary-forming gas is PH$_3$, the second ternary-forming gas is H$_2$S (hydrogen sulfide), and the heteroepitaxial growth is CdS (cadmium sulfide). This corresponds to CdS on InP.

According to another variation of this embodiment, the Group II/III element is In, the substrate is CdS (cadmium sulfide), the first ternary-forming gas is H$_2$S, the second ternary-forming gas is PH$_3$ (phosphine), and the heteroepitaxial growth is InP (indium phosphide). This corresponds to InP on CdS.

According to a further variation of this embodiment, the Group II/III element is Ga, the substrate is InP (indium phosphide), the first ternary-forming gas is PH$_3$, the second ternary-forming gas is H$_2$Te (hydrogen telluride), and the heteroepitaxial growth is a cubic phase zinc blende gallium telluride Ga$_2$Te$_3$. This corresponds to cubic phase zinc blende gallium telluride Ga$_2$Te$_3$ on InP. The opposite growth (InP/Ga$_2$Te$_3$) is not presented as being less reasonable.

According to another variation of this embodiment, the Group II/III element is In, the substrate is GaSb (gallium antimonide), the first ternary-forming gas is SbH$_3$, the second ternary-forming gas is AsH$_3$ (arsine), and the heteroepitaxial growth is InAs (indium arsenide). This corresponds to InAs on GaSb.

According to a further variation of this embodiment, the Group II/III element is Ga, the substrate is InAs (indium arsenide), the first ternary-forming gas is AsH$_3$, the second ternary-forming gas is SbH$_3$ (hydrogen antimonide), and the heteroepitaxial growth is GaSb (gallium antimonide). This corresponds to GaSb on InAs.

According to another variation of this embodiment, the Group II/III element is Cd, the substrate is InAs (indium arsenide), the first ternary-forming gas is AsH$_3$, the second ternary-forming gas is H$_2$Se (hydrogen selenide), and the heteroepitaxial growth is CdSe (cadmium selenide). This corresponds to CdSe on InAs. The opposite growth (InAs/CdSe) is not presented as being less reasonable.

According to a further variation of this embodiment, the Group II/III element is Al, the substrate is InAs (indium arsenide), the first and the second ternary-forming gas is the same AsH$_3$ (arsine), and the heteroepitaxial growth is AlAs (aluminum arsenide). Since both substrate (InAs) and growing layer (AlAs) are arsenides, only AsH$_3$ is used. This corresponds to AlAs on InAs. The opposite growth (InAs/AlAs) is not presented as being less reasonable.

According to another variation of this embodiment, the Group II/III element is Al, the substrate is InAs (indium arsenide), the first ternary-forming gas is AsH$_3$, the second ternary-forming gas is SbH$_3$ (hydrogen antimonide), and the heteroepitaxial growth is AlSb (aluminum antimonide). This corresponds to AlSb on InAs. The opposite growth (InAs/AlSb) is not presented as being less reasonable.

According to a further variation of this embodiment, the Group II/III element is Ga, the substrate is AlSb (aluminum antimonide), the first ternary-forming gas is SbH$_3$, the second ternary-forming gas is SbH$_3$ (hydrogen antimonide), and the heteroepitaxial growth is GaSb (gallium antimonide). This corresponds to GaSb on AlSb. Since GaSb and AlSb are both antimonides, there is no need of a gas mixture.

According to another variation of this embodiment, the Group II/III element is Al, the substrate is GaSb (gallium antimonide), the first ternary-forming gas is SbH$_3$, the second ternary-forming gas is SbH$_3$ (hydrogen antimonide), and the heteroepitaxial growth is AlSb (aluminum antimonide). This corresponds to AlSb on GaSb. Since GaSb and AlSb are both antimonides, there is no need of a mixture of gases.

According to a further variation of this embodiment, the Group II/III element is Al, the substrate is GaSb (gallium antimonide), the first ternary-forming gas is SbH$_3$, the second ternary-forming gas is AsH$_3$ (arsine), and the heteroepitaxial growth is AlAs (aluminum arsenide). This corresponds to AlAs on GaSb.

According to another variation of this embodiment, the Group II/III element is Ga, the substrate is AlAs (aluminum arsenide), the first ternary-forming gas is AsH$_3$, the second ternary-forming gas is SbH$_3$ (hydrogen antimonide), and the heteroepitaxial growth is GaSb (gallium antimonide). This corresponds to GaSb on AlAs.

According to a further variation of this embodiment, the Group II/III element is Cd, the substrate is InSb (indium antimonide), the first ternary-forming gas is SbH$_3$, the second ternary-forming gas is H$_2$Te (hydrogen telluride), and the heteroepitaxial growth is CdTe (cadmium telluride). This corresponds to CdTe on InSb. The opposite growth (InSb/CdTe) is not presented as being less reasonable.

According to another variation of this embodiment, the Group II/III element is Hg, the substrate is InSb (indium antimonide), the first ternary-forming gas is SbH$_3$, the second ternary-forming gas is H$_2$Te (hydrogen telluride), and the heteroepitaxial growth is HgTe (mercury telluride). This corresponds to HgTe on InSb. The opposite growth (InSb/HgTe) is not presented as being less reasonable.

According to a further variation of this embodiment, the Group II/III element is Hg, the substrate is CdTe (cadmium telluride), the first ternary-forming gas is H$_2$Te, the second ternary-forming gas is H$_2$Te, and the heteroepitaxial growth is HgTe (mercury telluride). This corresponds to HgTe on CdTe. Since CdTe and HgTe are both tellurides, there is no need of a gas mixture. The opposite growth (CdTe/HgTe) is not presented as being less reasonable.

According to another variation of this embodiment, the Group II/III element is Hg, the substrate is either InSb (indium antimonide), CdTe (cadmium telluride) or HgTe (mercury telluride). The first and second ternary-forming gases in the cases of growth on CdTe or HgTe is H$_2$Te (hydrogen telluride), because the two substrates choices (CdTe and HgTe) and the growing layer (HgCdTe) are tellurides. When InSb is used as a substrate, H$_2$Te is the first ternary-forming gas, but SbH$_3$ (hydrogen antimonide) may be used as a second ternary-forming gas. The heteroepitaxial growth in all this cases is HgCdTe (mercury cadmium telluride). This corresponds to HgCdTe on one of the substrates, i.e. InSb, CdTe, or HgTe. Note: HCl overflows a first boat with Hg and a second boat with molten Cd, and only H$_2$Te is used as a ternary-precursor gas in the cases of HgCdTe growth on CdTe or HgTe substrates. In the case of HgCdTe growth on an InSb substrate, growth may start in a SbH$_3$+H$_2$Te mixture to allow a smoother transition between the substrate and the growing HgCdTe layer. The opposite growths (InSb/HgCdTe, CdTe/HgCdTe and HgTe/HgCdTe) are not presented.

According to a further variation of this embodiment, the Group II/III element is Ga, the substrate is CaF$_2$ (calcium fluoride), the first ternary-forming gas is HF, the second ternary-forming gas is PH$_3$ (phosphine), and the heteroepitaxial growth is GaP (gallium phosphide). This corresponds to GaP on CaF$_2$. The opposite growth (CaF$_2$/GaP) is not presented because CaF$_2$ is not transparent in the wavelength range of interest.

According to another variation of this embodiment, the Group II/III element is Ga, the substrate is CaF$_2$ (calcium fluoride), the first ternary-forming gas is HF, the second ternary-forming gas is AsH$_3$ (arsenide), and the heteroepitaxial growth is GaAs (gallium arsenide). This corresponds to GaAs on CaF$_2$. The opposite growth (CaF$_2$/GaAs) is not presented because CaF$_2$ is not transparent in the wavelength range of interest.

According to a further variation of this embodiment, the Group II/III element is Al, the substrate is BaF$_2$ (barium fluoride), the first ternary-forming gas is HF, the second ternary-forming gas is SbH$_3$ (hydrogen antimonide), and the heteroepitaxial growth is AlSb (aluminum antimonide). This corresponds to AlSb on BaF$_2$. The opposite growth (BaF$_2$/AlSb) is not presented because BaF$_2$ is not transparent in the wavelength range of interest.

According to another variation of this embodiment, the Group II/III element is Ga, the substrate is BaF$_2$ (barium fluoride), the first ternary-forming gas is HF, the second ternary-forming gas is SbH$_3$ (hydrogen antimonide), and the heteroepitaxial growth is GaSb (gallium antimonide. This corresponds to GaSb on BaF$_2$. The opposite growth (BaF$_2$/GaSb) is not presented because BaF$_2$ is not transparent in the wavelength range of interest.

According to a further variation of this embodiment, the Group II/III element is Ga, the substrate is one of LiNbO$_3$ (Lithium niobate) or periodically poled lithium niobate (PPLN), the first ternary-forming gas is PH$_3$, the second ternary-forming gas is PH$_3$ (phosphine), and the heteroepitaxial growth is one of GaP (gallium phosphide) or OP-GaP. This corresponds to GaP on LiNbO$_3$ or OP-GaP on LiNbO$_3$. The opposite growth (LiNbO$_3$/GaP) is not shown because LiNbO$_3$ is transparent only in a part of the wavelength range of interest.

According to another variation of this embodiment, the Group II/III element is Ga, the substrate is one of LiNbO$_3$ (lithium niobate) or periodically poled lithium niobate (PPLN), the first ternary-forming gas is AsH$_3$, the second ternary-forming gas is AsH$_3$ (arsine), and the heteroepitaxial growth is one of GaAs (gallium arsenide) or OP-GaAs. This corresponds to GaAs on LiNbO$_3$ or OP-GaAs on LiNbO$_3$. The opposite growth (LiNbO$_3$/GaAs) is not shown because LiNbO$_3$ is transparent only in a part of the wavelength range of interest.

Details regarding these and other heteroepitaxial cases can be found in FIG. 13.

Additional objects, advantages, and novel features of the invention will be set forth in part in the description, which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention. The patent or application file contains at least one drawing executed in color. Copies of this patent or patent application publication with color drawing(s) will be provided by the Office upon request and payment of the necessary fee.

FIGS. 9A-9D present SEM top surface images of an OP-GaAs template showing the adjacent area around the boundary between two oppositely oriented domains before preheating (FIG. 9A) and after preheating in PH$_3$:H$_2$ atmosphere (FIG. 9B). Respectively, (FIG. 9C) represents the area within the green shaped rectangular from FIG. 9B at a larger magnification, while FIG. 9D represents the area within the red shaped rectangular from FIG. 9B. There, due to the increased magnification, one can see how the longitudinally-shaped pits that appear after the exposure of the GaAs substrate to the non-native precursor (PH$_3$:H$_2$) are oriented in two mutually perpendicular directions in the two neighboring domains with opposite crystallographic orientations.

FIGS. 13A-13B present tables with some of the favorable heteroepitaxial cases from point of view of the lattice mismatches. The most probable chemistry in each individual case is also included in the table.

FIGS. 15A-15B depicts cross-sectional TEM image of the HVPE grown ZnSe/GaAs: as (FIG. 15A) shows bright-field planar image with corresponding FFT patterns; (FIG. 15B) shows high-resolution image of ZnSe/GaAs interface.

FIGS. 18A-18E depict SEM top surface image of heteroepitaxial growth of GaSe on a (100) GaAs substrate in two different magnifications (FIG. 18A); SEM cross section SEM image of the same GaSe/GaAs sample (FIG. 18B); EDS study of the top GaSe surface clearly indicating presence of nearly equal amounts of Ga and Se, i. e. that the grown layer is GaSe (FIG. 18C); and, Omega/2Theta XRD scan indicating high crystalline quality of a cubic phase zinc blende gallium selenide Ga$_2$Se$_3$ (FIGS. 18D and 18E).

FIGS. 19A-19B depict Nomarski cross sectional optical image of GaAs$_{0.34}$P$_{0.66}$ ternary grown on a 4-degree "off axis" (100) GaP substrate (FIG. 19A); XRD (004) peak (blue curve) along with a simulation fit (red curve) was used to evaluate the crystalline quality of the material and extract the alloy compositional values (FIG. 19B).

FIGS. 21A-21F depict Nomarski optical image of a cross section of a thick HVPE growth of OP-GaAs$_{0.34}$P$_{0.66}$ ternary on an OP-GaAs template with a pattern period of 43 μm (FIG. 21A); Nomarski optical image of a cross section of a thick HVPE growth of OP-GaAs$_x$P$_{1-x}$ ternary (different x-composition) on an OP-GaAs template with a pattern period of 34 µm (FIG. 21B); A small spot from the image in FIG. 21B at a larger magnification (FIG. 21C); A portion from the upper part of FIG. 21B revealing excellent domain fidelity but rougher surface morphology—the growth was performed on an OP-GaAs template prepared by the standard MBE assisted polarity inversion technique with inverted layer which was finished-up with the growth of a thin MBE encapsulated layer (FIG. 21D); Similar area from a growth on an MBE assisted OP-GaAs template, where the deposition of the encapsulating layer is omitted, i.e. the HVPE growth is performed directly on the inverted layer showing much smoother surface morphology (FIG. 21E); Top surface of the grown structure shown in FIG. 2B taken with a laser scan using stitching software and showing excellent domain propagation all the way to the top surface (FIG. 21D)

FIGS. 25A-25D depict Nomarski optical images of the top surface (FIG. 25A) and the cross section (FIG. 25B) of a GaAs/GaAs homoepitaxial HVPE growth; and the top surface (FIG. 25C) and the cross section (FIG. 25D) of a GaAs/GaP heteroepitaxial HVPE growth. Both growths are performed for one hour at the same growth conditions. However, it is obvious that the heteroepitaxial growth provides faster growth rate and smoother surface morphology.

FIG. 26 presents some nonlinear optical materials that are suitable for frequency conversion devices along with their most important material characteristics for such applications.

Figure 1:
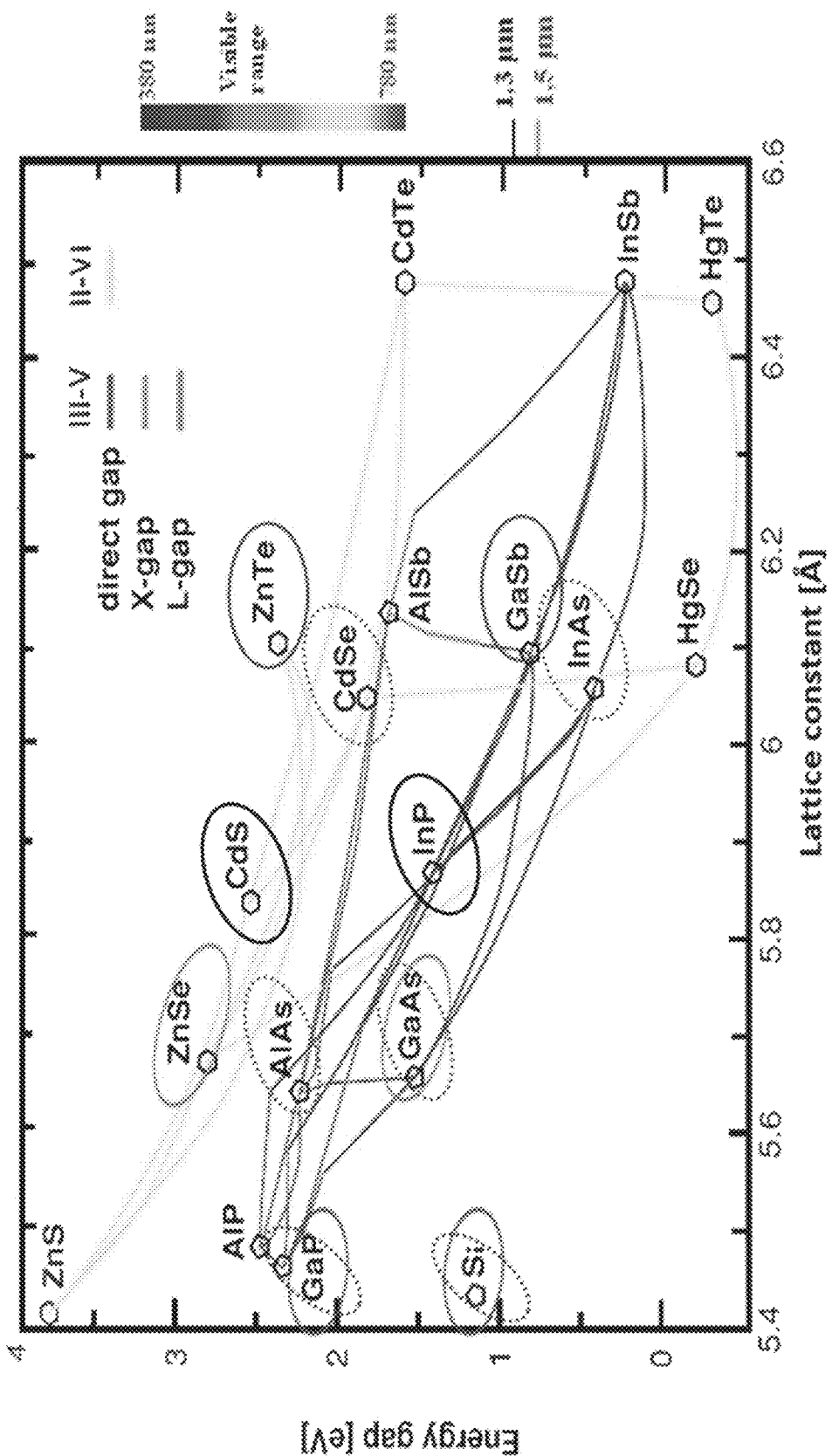
FIG. 1 illustrates the energy gap as a function of the lattice constants for some traditional compound semiconductor materials.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

A process for thick heteroepitaxial growth of semiconductor materials is presented below. The semiconductor structures of the growing layer(s) may be deposited in a horizontal or vertical direction, on plain substrates or on patterned templates, including orientation-patterned templates.

A further embodiment of the invention states that the heteroepitaxial growth is preceded by an in-situ pre-growth treatment of the substrate or the template followed by at least 300-500 µm thick heteroepitaxial growth of one or more doped or undoped semiconductor materials or their binaries, ternaries, or quaternaries. (Note: An exception of the thickness range is when the purpose of the growth was growth of low-dimensional (LD) materials. In this case, thicknesses in the range of several nm to several µm are acceptable.)

In order to be successful, each separate heteroepitaxial combination must meet particular requirements, including the lattice mismatch and the accumulated strain. Accordingly, the heteroepitaxy exhibited in any particular example below will be based on the degree and the sign of the lattice mismatch between substrate and growing layer, as well as on how the strain accumulated in the growing layer because of the lattice and thermal mismatch is released—in plastic or elastic strain release processes. While the elastic strain release process occurs through surface roughening, a typical example of a plastic strain release process is the periodic formation of the so-called "misfit dislocations" (MDs). Such dislocations may appear after a certain critical thickness $h_c$ of the so-called "pseudomorphous growth", during which the layer is "forced" to grow with the lattice constant of the substrate. (Note: The words "mismatch" and "misfit" are almost identical, but their meanings are distinct in this context. However, in particular cases, one will be preferred to the other. For example, it is proper to say "lattice mismatch" and "misfit dislocations".) In this invention, we teach that the sign and the degree of the lattice mismatch and the periodicity of the MDs may be used as criteria for one to determine in advance how successful a new case of heteroepitaxy would be.

The lattice mismatch $f_\%$ is calculated using the formula:

$$f_\% = \frac{b_o - a_o}{a_o} \cdot 100 \qquad \text{(eq. 1)}$$

where $a_0$ and $b_0$ are the lattice constants of the substrate and the layer material. The lattice constants of some traditional semiconductor materials are presented in FIG. 1, which shows their bandgap energies as a function of their lattice constants. From FIG. 1, one can easily see that some materials, although having different bandgap energies, have close lattice constants and could be suitable for heteroepitaxy. Such are, for example, GaP and Si, ZnSe and GaAs, AlAs and GaAs, ZnTe and GaSb, ZnS and GaP, or ZnS and Si, etc.

The periodicity $\tau$ of the misfit dislocations is determined by:

$$\tau = \frac{100}{f_\%} \qquad \text{(eq. 2)}$$

As an example, we can determine the lattice mismatch $f_\%$ and the periodicity of the MDs $\tau$ in the particular heteroepitaxial case of growth of GaP on a GaAs substrate. The lattice constant $(a_o)$ of GaAs=5.6532 Å, while the lattice constant $(b_o)$ of GaP=5.4512 Å. According to equations (1) and (2), in this example the lattice mismatch $f_\%$ is negative (−3.57%) because $b_o$ GaP<$a_o$ GaAs; we should expect the appearance of MDs at a periodicity $\tau$ of about 28 (i.e. 100/3.57) interatomic distances. Such lattice mismatch (−3.57%) may be considered as large. In general, lattice mismatches of 3-4% and more are considered as relatively large, while lattice mismatches under 1% may be considered as relatively small. Thus the lattice mismatch between GaP and GaAs (−3.57%) may be considered as large, while the lattice mismatch between ZnSe and GaAs (+0.26), for example, may be considered as small. However, whether a particular mismatch can be considered as large or small, it depends on other factors as well, for example, on the strength of the bonds (the bond dissociation energies) between the atoms of the substrate and those of the growing layer. For example, (Table 1) the bond energies of the bonds Ga—As and Ga—P are in the same order of magnitude. This means that the As and P atoms can easily replace each other, forming an intermediate GaAsP ternary transition layer between the substrate and the growing layer. Namely, because of this GaP and GaAs can grow successfully on each other even at the larger mismatch of 3.57%. As we discovered in the course of our study the formation of this intermediate ternary layer could be initiated still during the preheating stage of growth by treating the substrate with its non-native precursor, i.e. by exposing GaAs to phosphine ($PH_3$) or GaP to arsine ($AsH_3$). As Table 1 also shows, from this point of view GaSb, InSb and InP are also "easy" substrates due to the low bonding energies of their atoms. However, as one can see from Table 1, due to the high bonding energy of the Ge—Ge bond and, especially, of the Si—Si bond, these common substrates are hardly treatable. Thus, in the case of growth of Ge/Se, for example, namely because the atomic bonds are strong in both materials, the lattice mismatch of +3.96% between Ge and Si is considered as huge, no matter that as a number this mismatch is not much different from the lattice mismatch between GaAs and GaP:

TABLE 1

Some bond dissociation energies (standard state enthalpy changes) at T = 298 K.

| Bond | Bond dissociation energy $\Delta Hf_{298}$ [kJ/mol] |
|---|---|
| Ga—As | 209 |
| Ga—P | 230 |
| Ga—Sb | 209 |
| In—Sb | 152 |
| In—P | 198 |
| Ge—Ge | 274 |
| Si—Si | 327 |

The sign of the lattice mismatch, minus (−) or plus (+), is also important. For example, it was determined that the thickness of the pseudomorphous growth, i.e. the critical thickness $h_c$, is larger when the lattice mismatch is negative and the film is growing under tensile strain than in the case of a positive lattice mismatch when the layer is growing compressively strained. To clarify again that, according to eq. 1, we have a negative mismatch and a layer growing under tensile strain when the lattice constant of the layer material is smaller than the lattice constant of the substrate. In contrast, a positive mismatch means a larger lattice constant of the layer material—a case when the layer is growing under compressive strain. The significant difference in the mechanisms of dislocation nucleation (after the moment in which the pseudomorphous growth becomes energetically unfavorable and the accumulated elastic strain must be relieved somehow) in the case of tension vs. compression contributes to this difference as well. For example, while in the compression case the dislocations nucleate by squeezing out an atom at the base of surface depressions, in the tension case, the nucleation of misfit dislocations involves the concerted motion of a relatively large number of atoms, leading to insertion of an extra lattice (plane) row into an already continuous film. In addition to all that, the film morphology depends intimately on the sign of the misfit (+ or −), i.e., on the type of the strain (tensile or compressive). It is experimentally confirmed, for example, that growth under tensile strain (negative misfit) favors 2D growth, which usually results in smooth surface morphology, while compressive growth facilitates 3D growth, which typically results in hillock type, i.e., rougher surface morphology. In other words, plastic relaxation (negative misfit, tensile strain) is encouraged when the goal is to grow metamorphic buffers, while elastic relaxation (positive misfit, compressive strain), being associated with surface roughening, shall be used to drive quantum dot self-assembly processes. All this is, again, in support our notion that the growth under tensile strain, as it is in the case of growth of GaP on GaAs (negative misfit), should be more favorable for our coals than the opposite case of growth of GaAs on GaP (positive misfit).

Figure 2A:
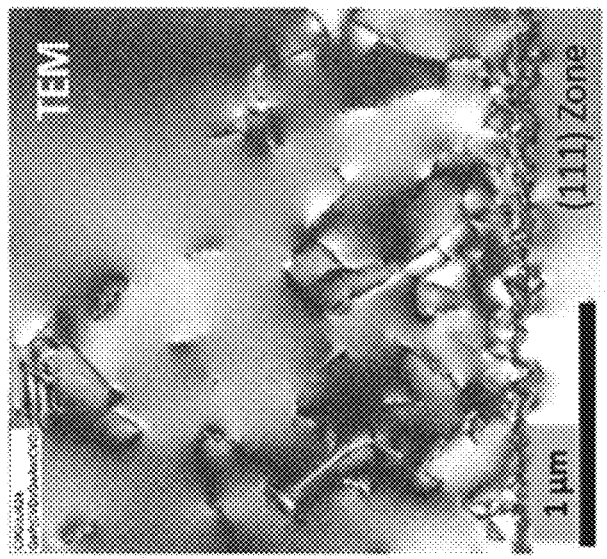
FIG. 2A illustrates that the biaxial strain a can be resolved into a uniaxial shear stress τ on the {111} dislocation glide plane.
Figure 2B:
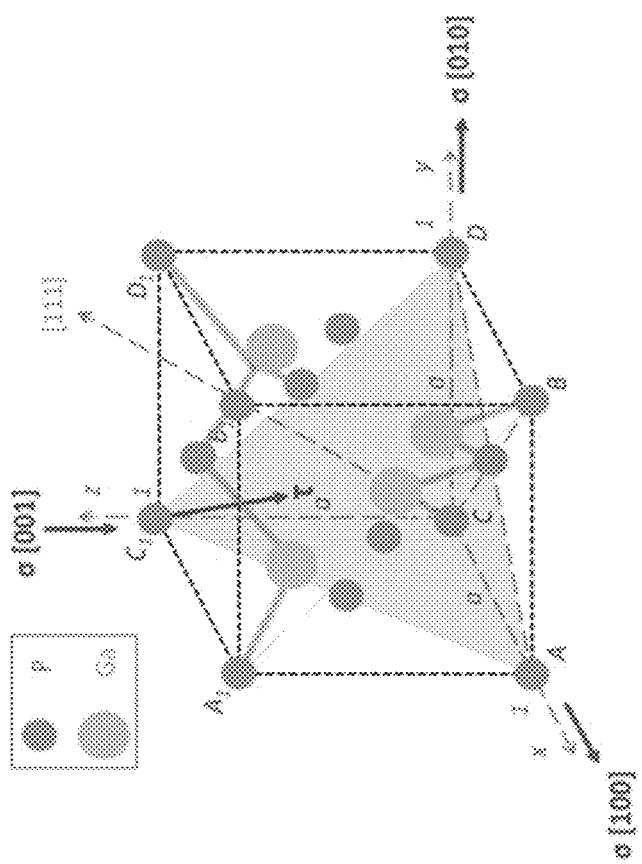
FIG. 2B presents a TEM image of the strain being relaxed in a plastic (dislocation nucleation) process during GaP/GaAs heteroepitaxy.

The linearly increasing elastic strain accumulated during the pseudomorphous growth must be released at a certain point. The formation of MDs (misfit dislocations) is one of the possible mechanisms of strain relief. However, deeper crystallographic considerations are necessary to determine where they should be expected, or on which crystallographic plane it is most probable for the MDs to appear. In a zinc blende structure (this is the structure of many of the compound semiconductor materials presented herein, e.g. GaAs, GaP, ZnSe, etc.), for example, the biaxial strain a accumulated during pseudomorphous growth may be resolved (see FIG. 2A) into a uniaxial shear stress T on the (111) dislocation glide plane. At the same time, the directions of $\sigma$ and $\tau$, of course, will be opposite depending on whether the layer is growing under tensile (negative mismatch) or compressive (positive mismatch) strain, i.e. whether the lattice constant of the growing layer is smaller or larger than the lattice constant of the substrate. Thus, recalling that the accumulated strain may be released in either elastic (surface roughening) or plastic (dislocation nucleation) relaxation processes, one may assume that in the latter case the most probable plane where the misfit dislocations shall appear is (111). Such dislocations were indeed noticed in the (111) zone in the particular case of GaP/GaAs heteroepitaxy as the TEM image in FIG. 2B indicates. However, they do not appear around the theoretically predicted critical thickness of the pseudomorphous growth but in a later stage of the growth, which tells us that during the fast growing HVPE process other mechanisms may also contribute to the strain relief. According to some cross-sectional high-resolution TEM images, which will be discussed in detail later in the text, roughening surfaces, formation of voids, and other compositional variations observed near the GaP/GaAs interface may serve as an alternative strain relief mechanism. These energy absorbing events may postpone the formation of the MDs until a later stage of growth, or even entirely replace it. All this provided some insight that it might not be terribly detrimental if the surface of the substrate was to be made rougher with the intention of facilitating the initial layer's nucleation. As for the top surface of the grown layer, for frequency conversion we need optically transparent cross sections for the propagating waves to go through and not a smooth layer surface morphology. Fortunately, after the first several microns of highly defective area (FIG. 2B) the transparency of the layers improves with increasing thickness, similar to many other material cases. The reasons for this "self-improvement" could be many but, in general, growth of thicker layers is, itself, a way for reducing the treading dislocations, because with the thickness increases the probability increases for two opposite treading dislocations to fall within their interaction cutoff (eventually annealing each other) as well.

Roughening of the surface may be the result of exposing the substrate to a non-native precursor during the preheating stage. This is supported by FIGS. 3C-3D, which present an SEM image (FIG. 3C) and an AFM image (FIG. 3D) of a GaAs substrate preheated for 1 h in a $PH_3:H_2$ atmosphere. It is worth to mention that the damages (pitting) are about the same after preheating the GaAs substrate for 1 hour in $PH_3:H_2$ atmosphere and for 1 minute only, so they occur quickly.

Figure 3B:
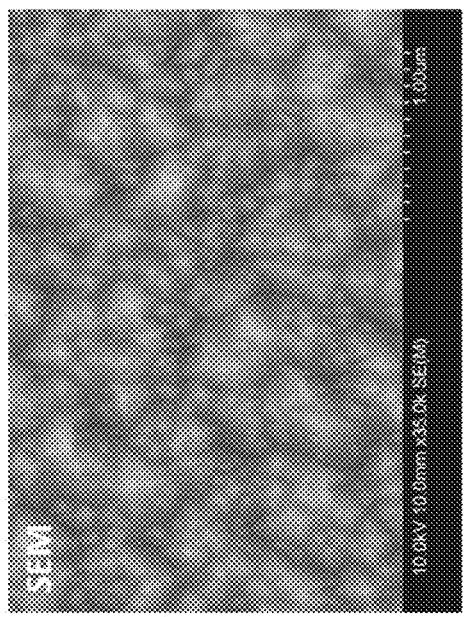
FIG. 3B presents an SEM image of a GaAs substrate preheated in H$_2$ atmosphere only and shows the damages in result of the thermal decomposition of the GaAs surface.
Figure 3D:
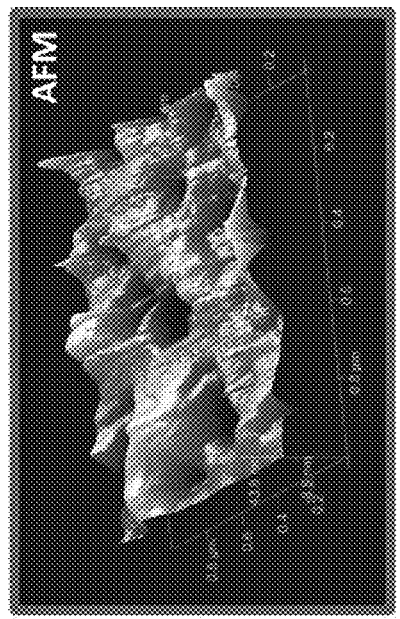
FIG. 3D presents an AFM images of a small area from the SEM image shown on FIG. 3C.
Figure 3A:
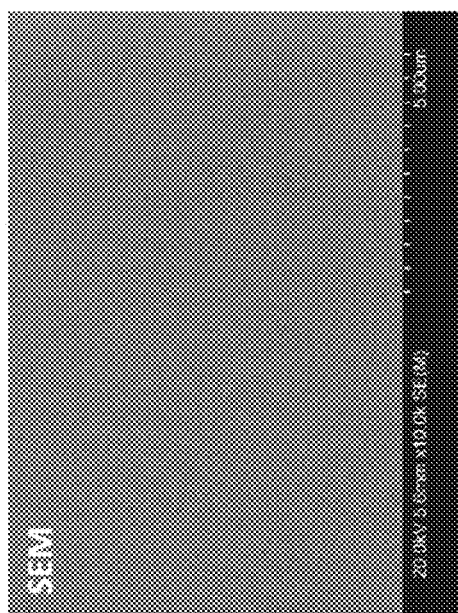
FIG. 3A presents an SEM image of a GaAs substrate preheated for 1 h in AsH$_3$+H$_2$ atmosphere, according to an embodiment of the invention.
Figure 3C:
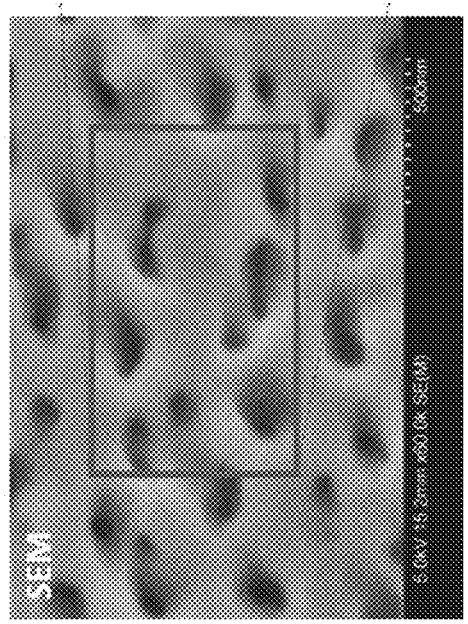
FIG. 3C presents an SEM image with a higher magnification of a GaAs substrate preheated for 1 h in PH$_3$:H$_2$ atmosphere.

FIG. 3A presents an SEM image of a GaAs substrate preheated for 1 h in $AsH_3:H_2$ atmosphere, according to an embodiment of the invention; one can see that such roughening (see FIGS. 3C and 3D) never occurs when the substrate is exposed to its native precursor (see FIG. 3A) during the preheating stage. However, although the temperature is still lower than the deposition temperature, some thermal decomposition of the substrate may occur if the GaAs substrate is preheated only in an $H_2$ atmosphere, as shown in FIG. 3B. That is why, to prevent the thermal decomposition during growths of GaAs or GaP the wafers should to be exposed to an $AsH_3:H_2$ (for a GaAs wafer) or a $PH_3:H_2$ (for a GaP wafer) mixture once the furnace temperature achieves 350-400° C., even though the decomposition temperature is much higher –about 700° C. Preheating the substrate only in $H_2$, for example, actually results in an intensive evaporation (and shortage) of the more volatile Group V-atom (As or P in the particular cases of GaAs or GaP) (see FIG. 3B). Going further in this direction by pretreating the GaAs substrate in phosphine ($PH_3$), or in a $PH_3:H_2$ mixture, leads to severe pitting of the GaAs surface (see FIGS. 3C, 3D, 4A, and 4C). Similarly, preheating the GaP substrate in $AsH_3$ or in an $AsH_3:H_2$ mixture resulted in even more severe pitting of the GaP surface (see FIG. 4B and FIG. 4D). Even with the time of exposure as short as 1 minute, the visible surface damage on the substrate's surface will be about the same as after one hour of exposure of the substrate to the nonnative precursor (as shown in FIGS. 3C-3D and 4A-4D).

Figure 4B:
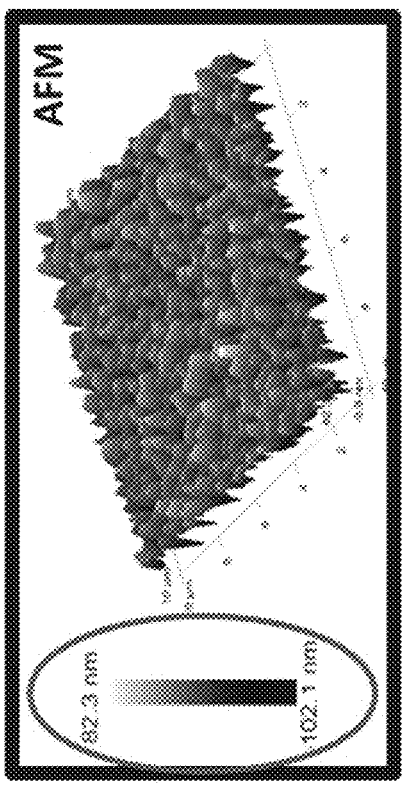
FIG. 4B presents an AFM image at lower magnification of a GaP substrate preheated for 1 h in AsH$_3$:H$_2$ atmosphere, according to an embodiment of the invention.
Figure 4D:
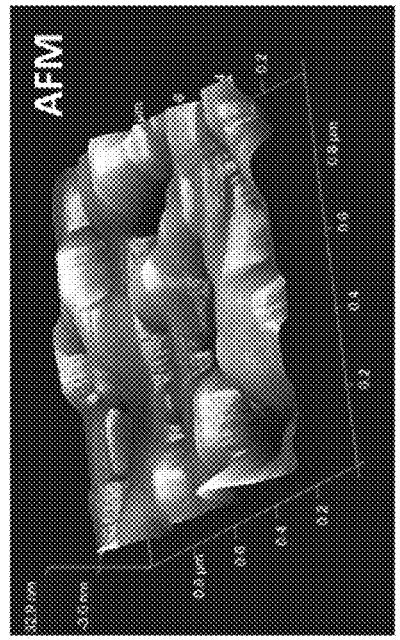
FIG. 4D presents an AFM image of a small area of FIG. 4B at a higher magnification of a GaP substrate preheated for 1 h in AsH$_3$:H$_2$ atmosphere, according to an embodiment of the invention.
Figure 4A:
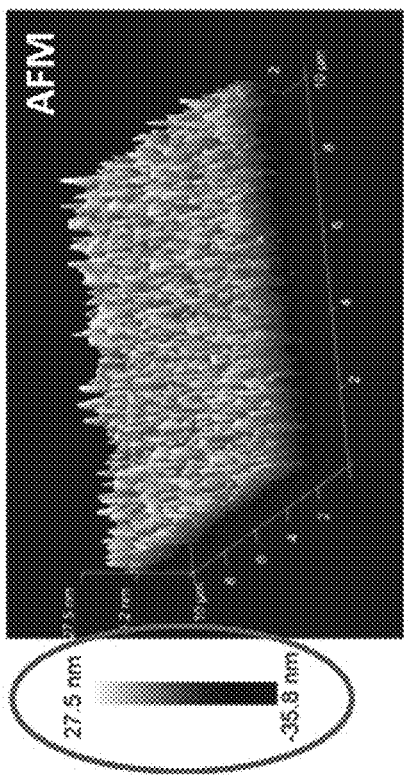
FIG. 4A presents an AFM image at lower magnification than FIGS. 3D, 4C and 4D of a GaAs substrate preheated for 1 h in PH$_3$:H$_2$ atmosphere, according to an embodiment of the invention.
Figure 4C:
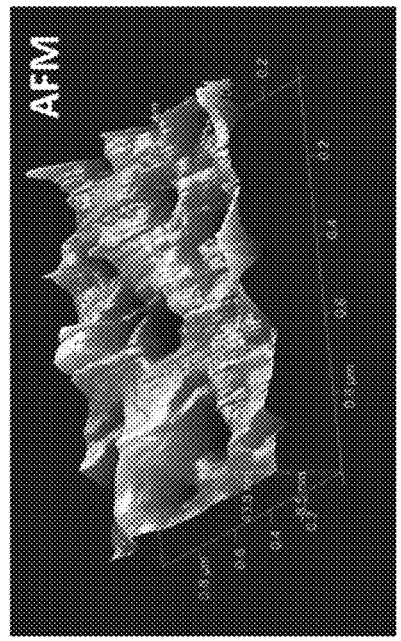
FIG. 4C presents an AFM image of a small area of FIG. 4A at a higher magnification of a GaAs substrate preheated for 1 h in PH$_3$:H$_2$ atmosphere, according to an embodiment of the invention.
Figure 5:
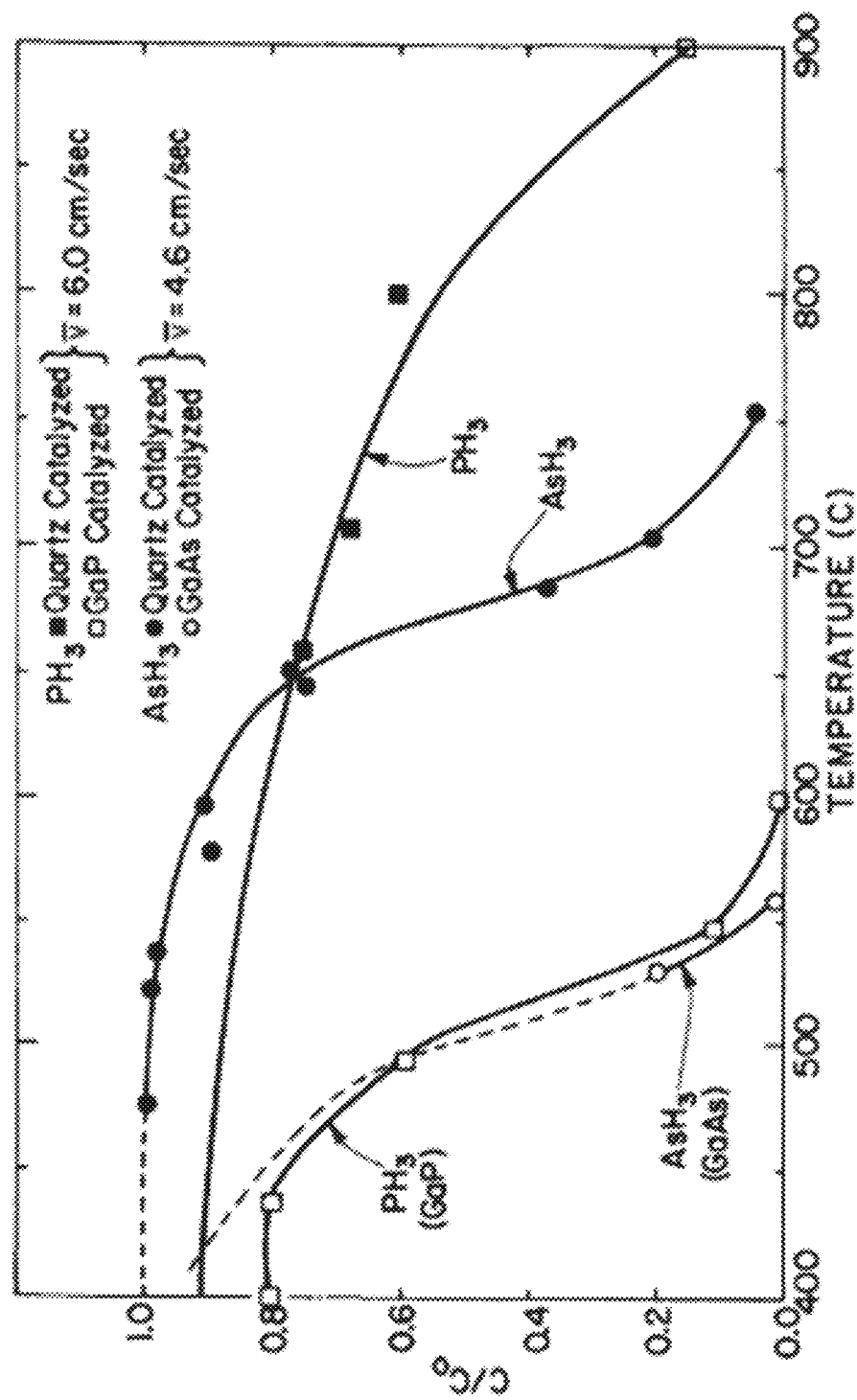
FIG. 5 presents the thermal decomposition of AsH$_3$ and PH$_3$ as a function of the temperature in a quartz vessel with (the two curves at left) and without (the two curves at right) the presence of a GaAs (with arsine flow) or a GaP (with phosphine flow) substrates within the vessel.

It is thought that the stronger influence of $AsH_3$ on GaP than of $PH_3$ on GaAs (compare the ranges of the distances between peaks and valleys on the scales that are left from FIG. 4A and FIG. 4B) should be attributed to the lower surface quality (i.e. the higher EPD) of GaP, which makes the surface more vulnerable to the $AsH_3$ attacks. However, to fairly compare this effect we must also consider the differences in the thermal decomposition of GaAs and GaP, as well as the differences in the thermal decomposition of $AsH_3$ and $PH_3$. It is known, for example, that the As-vapor pressure over a GaAs surface is lower in comparison to the P-vapor pressure over GaP, which means that GaP decomposes faster or to a greater extent than GaAs. At the same time, the thermal decomposition of $PH_3$ and $AsH_3$ over a GaP substrate or, respectively, over a GaAs substrate in the temperature range of 400-600° C., (see the left side of FIG. 5), are nearly equivalent, but still slightly in favor of the $AsH_3$ decomposition under 500° C. However, according to the right side of FIG. 5, the $AsH_3$ decomposition over a quartz surface (the surface of our reactor tube) within the pretreatment temperature range, i.e. above 350° C. but less than the growth temperature, is significantly stronger than the thermal decomposition of $PH_3$. Thus, still during the preheating stage, due to the stronger decomposition of $AsH_3$, there will be plenty of arsenic (As) atoms in the $AsH_3$, which is overflowing (i.e. flowing over) the GaP substrate. At the same time, with increasing substrate temperature, the GaP will decompose more and more, losing more phosphorus (P) atoms which can be easily replaced in the crystal cell by the liberated As atoms from the decomposing arsine. That is why $AsH_3$ attacks more GaP severely, which results in deeper and more intensive pitting—see FIG. 4B) than when $PH_3$ attacks the GaAs surface (see FIG. 4A).

Figure 6B:
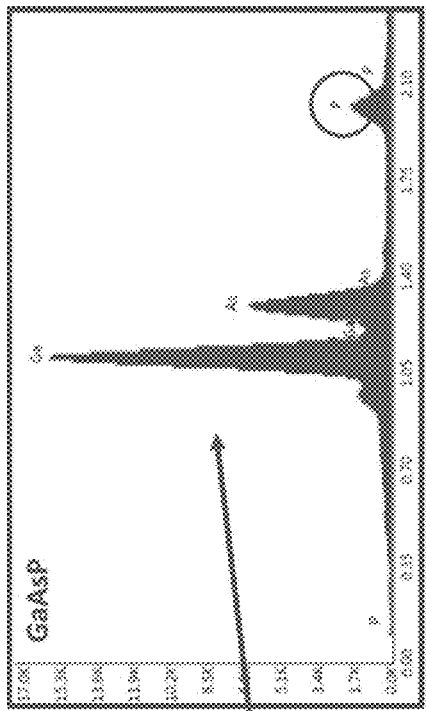
FIGS. 6B-6C present an EDS analysis that showing the presence of only GaAs in the pitted (dark) spots (FIG. 6B); in contrast, the partly covered (white) areas indicate the presence of GaAsP (FIG. 6C)
Figure 6C:
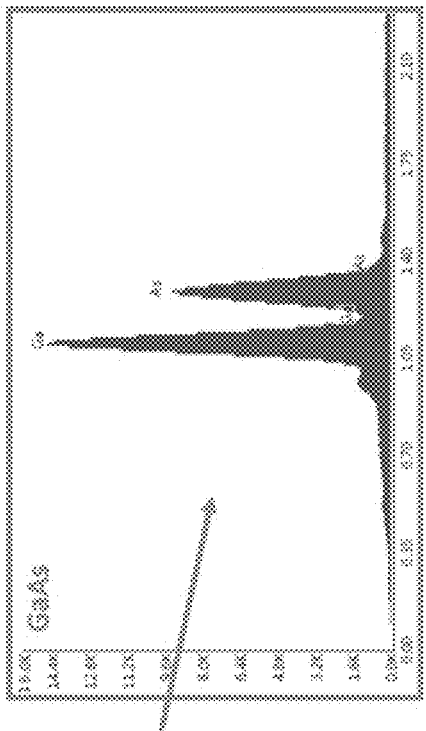
Figure 6A:
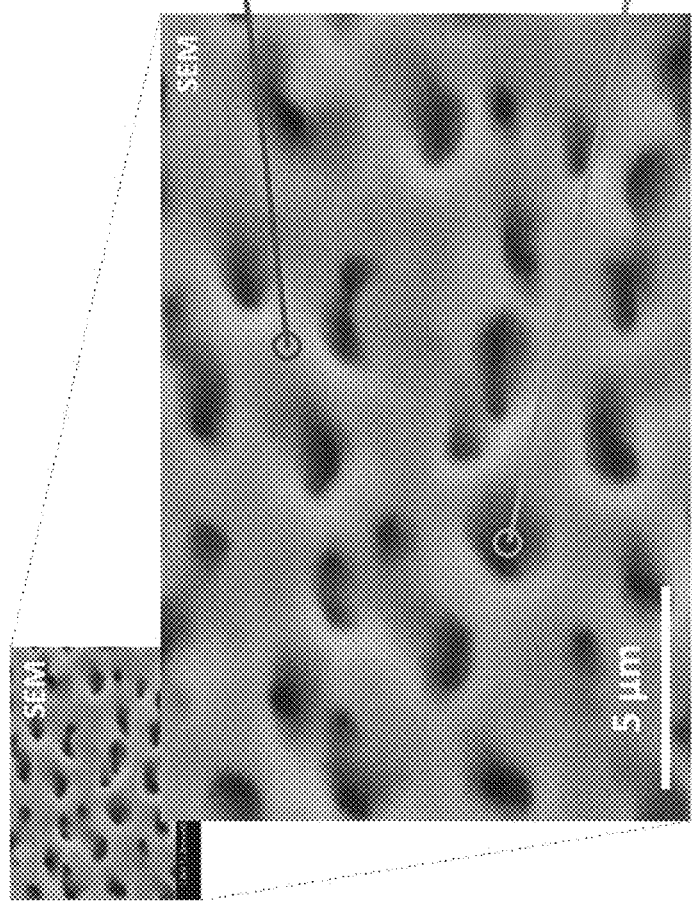
FIG. 6A presents an SEM image of a GaAs substrate preheated in PH$_3$:H$_2$ atmosphere.
Figures 7A, 7B:
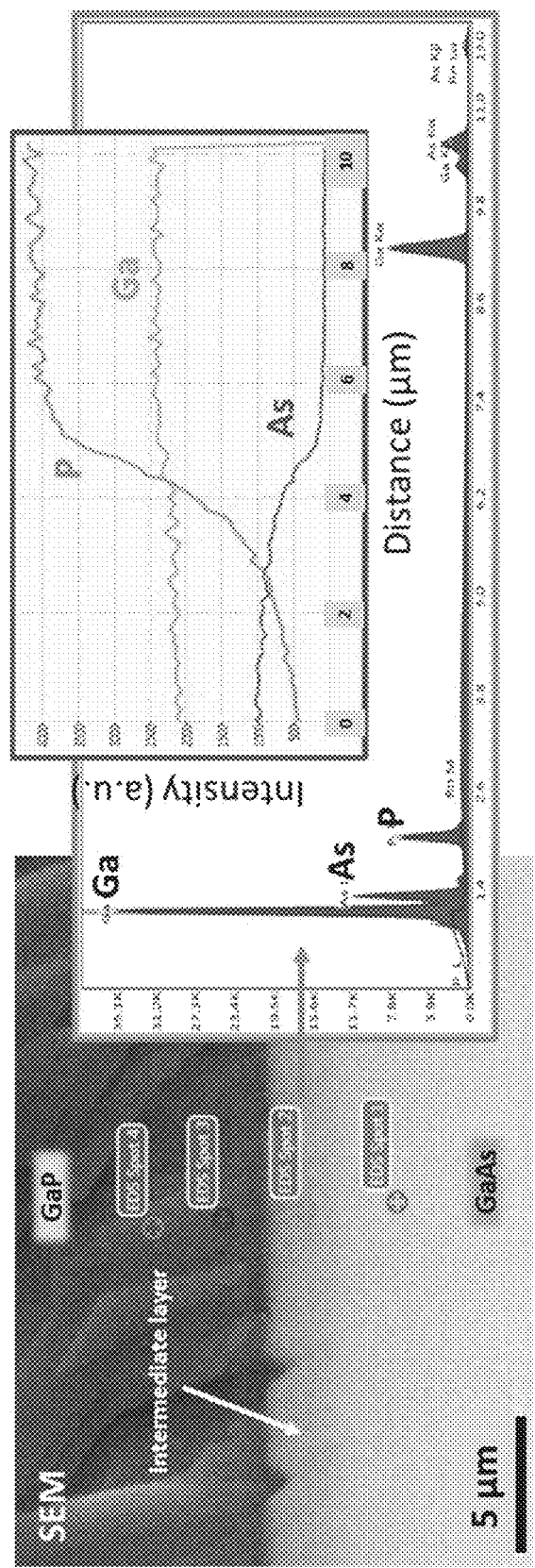
FIG. 7A presents a SEM cross section image of an area near the substrate/layer interface that shows the formation of an intermediate layer between the GaAs substrate and the growing GaP layer.
FIG. 7B presents an EDS profile analysis that indicates that the forming buffer layer is a GaAsP ternary with a gradually changing composition.

It was discovered that surface roughening (looking like pitting) is not only the result of exposing the semiconductor material to a non-native precursor during the preheating stage. Elemental analysis performed by Electron Dispersion Spectroscopy (EDS) of surfaces exposed to non-native precursors (see FIGS. 6A-6C) indicated that exposing, for example, GaAs to $PH_3$ or to the aforementioned $PH_3$-containing mixtures ($PH_3:H_2$ or $AsH_3:PH_3:H_2$) provokes the formation of ternary $GaAs_xP_{1-x}$ islands during the preheating stage prior to initiating the heteroepitaxial growth of GaP/GaAs. These islands eventually coalesce in a later stage of growth forming a continuous intermediate transition $GaAs_xP_{1-x}$ buffer layer (FIG. 7A and FIG. 7B). By absorbing some of the mismatch strain, this transition buffer layer helps to accommodate the growing layer to the foreign substrate, realizing a smooth transition between the substrate to the growing material. Exposing GaP to the related non-native precursor $AsH_3$ or their mixtures ($AH_3:H_2$ or $PH_3:AsH_3:H_2$) led to similar results.

Figure 8:
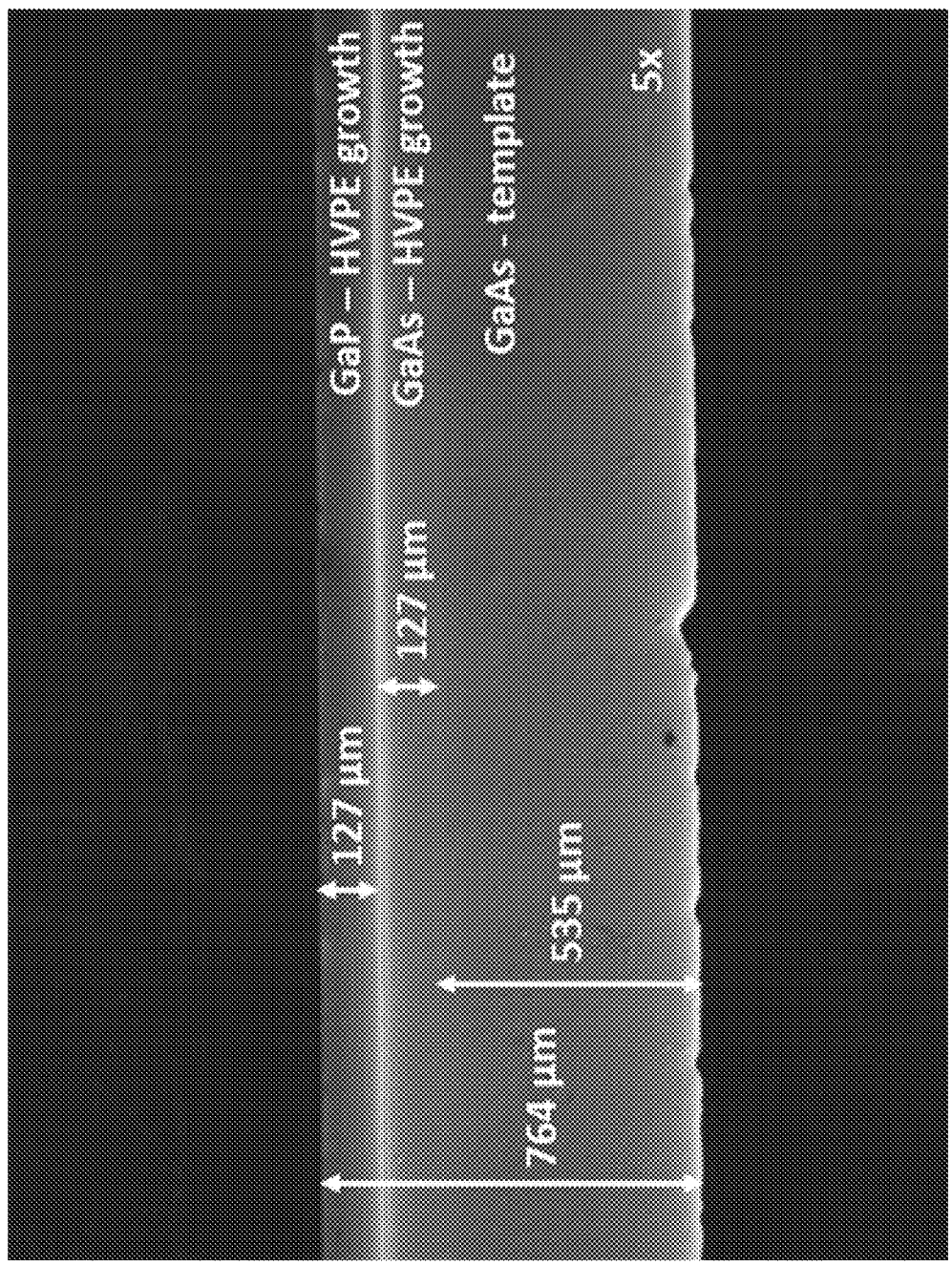
FIG. 8 presents a Nomarski cross section image of a grown multilayer heterostructure first of GaAs/GaAs and after that of GaP/GaAs.

The effect that the non-native precursors may have on the GaP and GaAs substrates (see FIG. 4A and FIG. 4B) is not a single, isolated case. This approach works well in many more material cases (see FIGS. 13A-13B). Accordingly, this provides the opportunity to grow multi-layered multi-material heterostructures (see FIG. 8) in which, depending on the pursued application, two or more materials may by alternated multiple times after achieving certain thicknesses within the same heterostructure in the frame of one continuous growth process. For example, we may start the growth by growing GaP on a GaAs substrate pretreated in phosphine or in a $PH_3:H_2$ mixture. Then, after preheating the already grown GaP layer in arsine or in an $AsH_3:H_2$ mixture, to continue with the HVPE growth of GaAs. After this second step, we may choose to preheat the already grown GaAs layer in hydrogen selenide ($H_2Se$) (or an $H_2Se:H_2$ mixture) following by HVPE growth of ZnSe/GaAs, etc. Such structures, with the ability to cover large portions of the spectrum, may have applications that will cross known boundaries— the already mentioned portable highly-efficient solar cells, multiphoton detectors, laser sources (including frequency conversion sources) that simultaneously cover both atmospheric windows of transparency between 2-5 and 8-13 µm, etc. Finally, involving common substrates such as Si may open many doors in optoelectronics, resulting in cost reduction of the final products in all known areas where Si is involved.

The proposed approach is to some extent universal because it may be applied to many different materials deposited one over another in a one-step epitaxial process, with or without the intentional assistance of an intermediate sub-lattice transition buffer layer (see FIGS. 7A-7B) deposited between them. However, such a layer may facilitate the growth of the following heterostructure. Quality control is crucial. First, the temperature at which the non-native precursor (or mixture) will be introduced in the reactor must be carefully chosen, as well as the ratios of the precursors' mixture, i.e. the mixture of the native and non-native precursors, their flow rates, the reactor pressure, etc. One may also choose to gradually change over time the ratio of the non-native/native precursor gasses in the mixture in order to build-up a graded buffer layer, i.e. a layer with a gradually changing composition. The purpose of this is, in order to match the lattices more closely, we may start by growing the substrate material and end up by growing the layer material. Thus, as an example, if we are planning a growth of GaP on GaAs, the process may start with maintaining the GaAs substrate in an $AsH_3:H_2$ mixture to protect its surface from thermal decomposition. Later, we may gradually start introducing $PH_3$, and increasing its amount in the mixture $AsH_3:PH_3:H_2$, while gradually reducing the amount of $AsH_3$ to zero. This process provides the conditions for growing the desired intermediate transition $GaAs_xP_{1-x}$ ternary buffer layer, in which the chemical composition changes gradually to achieve a balanced growth of a pure GaP layer. Although HVPE is a relatively fast growth process, this invention disclosure provides procedures for a gradual change in the lattice constant with a precise control of both the composition and the thickness of the buffer layer for the sake of achieving a smooth transition between the substrate and the growing material. In contrast with other known techniques, the process proposed here for buffer layer deposition is an in-situ step, inseparable from the entire growth process. Starting with the formation of the buffer layer by exposing the substrate to a non-native precursor (or to a mixture of non-native/native precursors), this process combines features of the major techniques for buffer layer engineering. Such are: building a graded layer; growing a ternary layer from (or not from) the parenting (substrate and layer) materials; growth on a patterned template—in our case the pattern consists in different sized, randomly distributed ternary islands; and using the highly defective areas of the buffer layer for efficient strain relief.

Because it is capable of controlling the thickness of the buffer layer, this invention allows one to extend the idea of the deposition of a ternary transition buffer layer to the growth of ternary layers hundreds of microns thick. This may be achieved by maintaining the ratio of the mixture of the native and the non-native precursors constant, which will ensure achieving the desired composition (x) in the growing ternary and keeping it constant during the entire growth process. As an example, the disclosed process has been used to grow up to 300 µm thick $GaAs_xP_{1-x}$ ternary layers on both GaAs and GaP substrates at the relatively high growth rate of about 100 µm/h. The ability to grow thick ternaries by the proposed process is important because the tailoring of different compositions allows one to achieve the best combinations of properties, which may be suitable for a particular application. For example, it was discovered that in the particular case of $GaAs_xP_{1-x}$ the following composition $GaAs_{0.34}P_{0.66}$ (x=0.34) provides lower two-photon absorption (2PA) than the 2PA of GaAs but higher nonlinear susceptibility than GaP in the wavelength of interest (1-1.7 µm); these parameters are of great importance for applications such as QPM frequency conversion. Another example is that by changing the x-composition of the $GaAs_xP_{1-x}$ ternary one may "tune" its bandgap energy to an optimal value that fits to the bandgap of Si in a dual-junction solar cell panel made of the ternary with Si. This idea may be applied to other ternaries in heterostructures with Si or with other common substrates.

Thus, such a combination of material properties satisfies the requirements for using this new ternary material for frequency conversion devices as well as for many other applications. At the same time, ternaries may be grown on either one of the parenting materials (in this case on GaAs or on GaP substrates) depending on how close to the given substrate is the ternary composition. For example, in the case where the content of As is more than the content of P in the ternary, GaAs will match closer as a substrate, while in the opposite case GaP shall be the more suitable substrate.

Because of the smaller lattice mismatches that the ternary $(GaAs_xP_{1-x})$ has with each of the two substrates (GaAs and GaP) compared to the lattice mismatch between the original materials (GaP and GaAs) the growth of ternaries is also an easier, more favorable, heteroepitaxial task.

Modification of the material properties, as was already mentioned, is another opportunity that the proposed invention provides and the aforementioned examples demonstrate the usefulness of such modifications for the development of new frequency conversion devices, e.g. for laser sources in the case of using GaP, GaAs, and their $GaAs_xP_{1-x}$ ternary. However, other material combinations may provide thick growths of other ternaries or quaternaries that may result in products that could support other research and development fields, e.g. optoelectronics, sensing (detectors), solar cell industry, etc.

This invention also allows to use the exposure of the substrate, the OP template, or the already grown OP material to a non-native precursor as an easy way to determine the crystal polarity of the material and, from here, to use this technique for polarity control during both the fabrication of the OP templates and the subsequent thick HVPE growth on them. This is possible because, in contrast to the case where the substrate is exposed to a non-native precursor and the shape of the observed pits are irregular and randomly distributed, in the case of exposing an OP template to a non-native precursor the shape of the pits are rather longitudinal. They are also predominantly oriented in two mutually perpendicular directions on the surface of domains with opposite crystallographic orientations (opposite polarity).

Figure 9A:
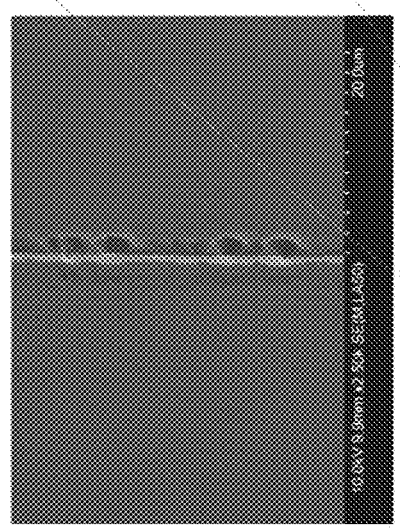
Figure 9C:
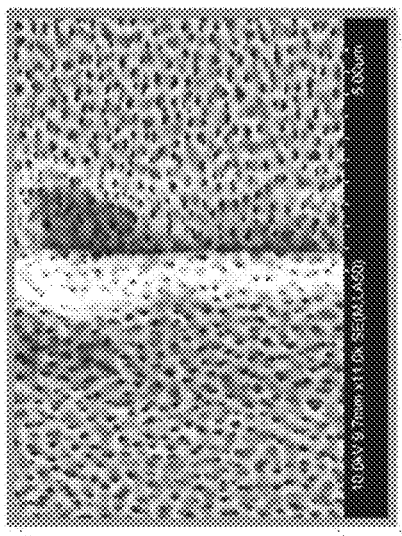
Figure 9B:
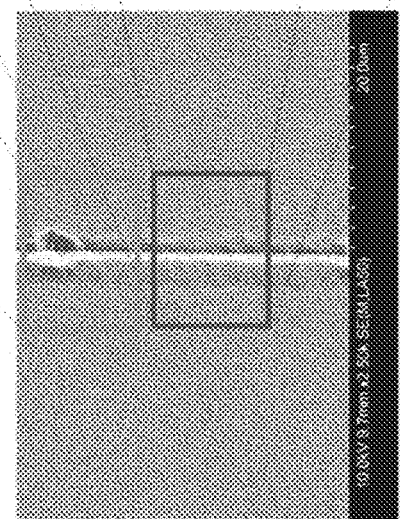
Figure 9D:
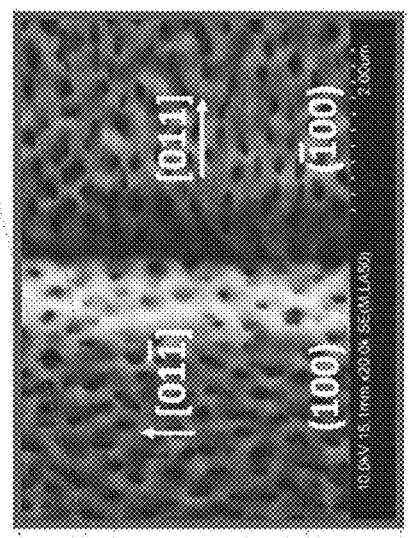
Figure 9E:
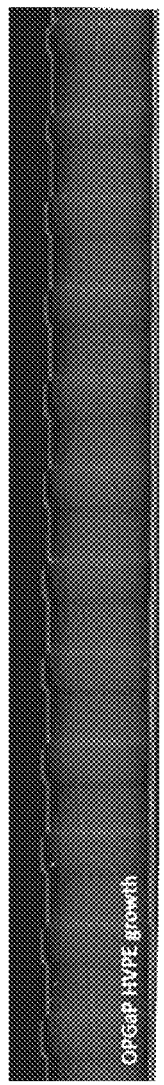
(FIG. 9E) presents a Nomarski cross section image of a 138 μm thick OP-GaP grown heteroepitaxially on the same OP-GaAs template shown in the previous FIGS. 9A-9D, according to an embodiment of the invention.

FIG. 9A and FIG. 9B, for example, present an area around the boundary between two oppositely oriented domains, (100) and ($\bar{1}00$), of an OP-GaAs template before and after preheating the OP-GaAs template in the presence of $PH_3$. FIG. 9C and FIG. 9D present the outlined small areas from FIG. 9B at higher magnifications. As one can see in FIG. 9C and FIG. 9D, after exposing the template to $PH_3$, the pits on the treated OP-GaAs template are longitudinal and tend to be oriented in two mutually perpendicular directions, along [01$\bar{1}$] and along [011], on the (100) and ($\bar{1}00$) oriented domains. This phenomenon, from a practical point of view, is an important feature of this invention, because it gives us a tool to easily determine the presence of the opposite domain orientations on the OP-template. Moreover, this approach is also an easy way to estimate the quality of the OP-template prior to the growth, or the quality of the growth on the template QPM structure, which is a simple in-situ or post-growth non-destructive evaluation step. Until now, it was possible to determine crystallographic orientations only with great uncertainty. The estimation was based on the type of the surface texture or the specific shape of grown surface features that were experimentally associated more or less to one orientation or another. One may also judge the crystallographic orientation by the rate of etching (which is usually different for different crystallographic directions) or by the shape of the etch pits revealed after etching the sample. Etching, however, means damaging the surface, after which the surface is not usable for the subsequent thick HVPE growth. Heteroepitaxial growth, performed on OP-GaAs templates exposed to a non-native precursor ($PH_3$), resulted in thick (up to 500 µm) high quality OPGaP with rectangular domains having excellent fidelity (see FIG. 9E). Depending on the type of the material, the domain width, and the pump wavelength, such QPM structures may be used for frequency conversion in, practically, any part of the spectrum. This includes frequency ranges which are uncovered or poorly covered by laser sources, which means realizing new practical applications that may easily exceed even the bravest expectations. For example, devices based on III-Nitrides with their ability to radiate in the UV and the close to UV visible spectrum could be engaged in water purification, energy conservation, high power lasers for high-energy physics, etc. Frequency conversion sources based on wideband semiconductors such as GaAs, GaP, ZnSe, GaSe, ZnTe, etc., however, radiate in the mid and longwave IR. They, especially, if they cover the two atmospheric windows of transparency, could find applications in the IR countermeasures (IRCMs) to protect aircraft and ships from heat seeking or laser guided missiles, in enhanced laser radar systems (distance detection and target recognition), or in long-range ultra-fast reliable IR communications. Respectively, FC (frequency conversion) sources radiating in the microwave and/or THz regions may be useful in airport scanners, remote sensing and spectroscopy of chemicals (explosives) or biological agents, in industry (automotive pedestrian protection systems), medicine (breath analysis, biopsy-free cancer cell detection), and science (ultrafast spectroscopy of chemical reaction dynamics).

As already explained above, the proposed process may be used for the growth of metamorphic buffer layers or for the formation of quantum dots, quantum wells, or other nano- and micro-structures. This depends on which mode of heteroepitaxy is stimulated during growth: Volmer-Weber "island growth", Frank-van der Merwe "layer-by-layer growth", or the Stranski-Krastanov "layer-plus-island growth. In other words this depends on the sign and the magnitude of the of the lattice mismatch and, from there, the type of elastic (tensile or compressive) strain, and the mechanism of strain relief—elastic (surface roughening) or plastic (dislocation formation). By skillful use of these growth modes this process may combine similar or different materials, e.g. common electronic materials, e.g. Si or Ge, with some linear and nonlinear optical materials, e.g. GaAs, GaP, GaSe, ZnSe, ZnTe, ZnS, etc., or even with their ternaries or quaternaries. Thus, the described approach contributes to advances in the development of optoelectronic devices as well.

The disclosed process allows for one-step thick growth without the need for a preliminary deposition (usually using a thin growth technique) of another material with a smaller lattice mismatch with the growing material and/or with the substrate. For example, as it is known in the prior art, thick HVPE GaN layers can be grown on SiC substrates only after the deposition of a thin AlN layer by MBE or MOCVD. Similarly, thick HVPE GaN may be grown on thin GaN or AlN deposited in advance on sapphire, again, by MOCVD or MBE (this was already discussed in more details above).

The MBE and MOCVD on one hand, and the HVPE on the other are growth processes, which are quite different by their nature. Thus, while the first two (MOCVD and MBE) are far-from-equilibrium processes, the third one, HVPE, is a close-to-equilibrium process. This makes the MOCVD and MBE "less sensitive" to lattice mismatches than HVPE. However, although MOCVD and MBE can "handle" heteroepitaxial growths, in general, at larger lattice mismatches, they, in contrast to HVPE (which is a traditional technique for hundreds of microns of thick growth), can be used only for, typically, 1-2 µm thin growths. This means that the old approach of thick heteroepitaxial growth, using as a first step MOCVD or MBE and after that HVPE, is a two-step growth process which needs more high-tech instruments and more equipment, i.e. greater investments. These limitations are not necessary with the disclosed approach, which focuses on the use of only HVPE.

The disclosed process also eliminates the need to grow (typically by HVPE) an intentionally deposited low temperature (LT) buffer layer on the substrate prior to the growth of the high temperature (HT) layer. This is known for the thick HVPE growth of GaN on a sapphire substrate, for example. The deposition of such intermediate transition layers aims to reduce the strain between the sapphire substrate and the growing GaN layer. The LT buffer layer can do this job, i.e. to accommodate the growing layer to the substrate. At the same time, however, the LT buffer layer is a highly defective area, a layer with extremely low crystalline quality and, thus, it is a source of a great number of different defects such as, for example, treading dislocations. All this means that the LT buffer layer does not provide always an optimal foundation to start the growth of the actual HT GaN layer. The proposed approach allows the formation of an intermediate transition layer naturally, in-situ, during the initial stage of preheating the substrate, and not through a growth process—it occurs prior to the start of growing the actual layer but also may continue during the initial stages of growth as well. According to the present invention, it is not necessary for the buffer layer to be a LT layer. Instead, the choice of the temperature of the buffer layer formation may be controlled, and thus its quality may be controlled.

We would like once again to emphasize another significant difference between the proposed buffer layer growth and the prior art by using the same example: an HVPE-grown LT GaN buffer layer. In the prior art case one may choose to change the V-III ratio (i.e. the ratio between the content of Ga and N) during the buffer layer deposition in order for this layer to accommodate both the substrate and growing layer. However, although these changes may change some material properties, like the balance in the carrier concentration, they may not provoke significant changes in the lattice mismatch and thus may not contribute much to accommodating the buffer layer (GaN) and the foreign substrate (SiC). Moreover, they not only may not help much in the buffer layer/substrate heteroepitaxy, but may aggravate the subsequent layer/buffer layer homoepitaxy. In summary, since the buffer layer and the subsequent layer are still from the same material, GaN, as a practical matter, we perform heteroepitaxy only in regards to the substrate (SiC or sapphire), while the HT GaN layer still grows homoepitaxially on the LT GaN buffer layer. In contrast, the inventive method, disclosed herein, is a heteroepitaxial growth of a buffer ternary layer (GaAsP in the chosen example) concerning both the substrate (GaAs) and the growing layer (GaP), since the lattice constant of the ternary (GaAsP) is always different from the lattice constants of the substrate and the growing layer. As an option, its composition may be continuously, gradually changed during the preheating stage but this may also continue during the initial stage of growth for a gradual replacement of the substrate material with the growing layer. This means that at the beginning the lattice constant of the buffer material is closer to the lattice constant of the substrate material, while at the end of its deposition the lattice constant of the ternary material is already close to the lattice constant of the layer material that will be grown on the ternary buffer layer (which means changes in the buffer layer composition make sense). However, there is another significant difference. In this case we do not change the V/III ratio of the material of the buffer layer, but only the ratio between the V-group atoms in the ternary, which are As and P in the given example. In addition, in the same example the ternary GaAsP is a combination of the two parenting materials—the substrate (GaAs) and the layer (GaP) material. However, this is not a strict requirement of this disclosure. The intermediate transition ternary layer may be from any suitable materials that accommodate the growing layer to the substrate. For example, if growth of GaSe on Si is attempted and the suggested non-native precursor, hydrogen selenide ($H_2Se$), does not "pretreat" the Si substrate properly, another non-native precursor (for example $PH_3$) may do a better job, at the same time forming on the Si surface an intermediate layer (GaP) with which GaSe has a fairly small lattice mismatch. All these options makes the proposed approach much more flexible than the approaches for growth of a transition buffer layer used until now.

Thus, the optimized growth approach presented herein avoids or solves many of the current problems and shortcomings of heteroepitaxy. The optimized growth approach presented herein demonstrates several advantages over the known and comfortable homo- and heteroepitaxial processes. The disclosed process clearly indicates that there are many particular cases when heteroepitaxy, as stated here, may be preferable even when homoepitaxy is possible.

Heteroepitaxy provides economic and quality advantages: for example, the GaP wafers (for 2-inch wafers) available on the market is 5-6 times more expensive than the corresponding GaAs. In addition, the commercially available GaP wafers have much lower quality with respect to the etch pit density (EPD) and wafer parallelism. This means that the quality of OP-GaP templates prepared from such wafers will also be low, and that is why we should expect poor quality of the HVPE growth on them. Accordingly, the performance of frequency conversion devices based on such templates will also be unacceptable, because of the expected poor domain fidelity. The ability to use GaAs substrates and OP-GaAs templates for growth of GaP and OP-GaP solves this problem.

In addition, heteroepitaxy, as stated in this disclosure, enables the use of techniques suitable for thick epitaxial growth, e.g. HVPE, and the corresponding practical applications that require thick epitaxial growths. At this moment, due to the complex growth mechanisms of heteroepitaxy, knowledge of such mechanisms is relatively limited despite the great deal of effort made over the last couple of decades. For example, on an atomic scale it is known how the growth proceeds only for the first few monoatomic layers, even for the homoepitaxial growth of only a few plain semiconductors, e.g. Si and Ge. That is why the semiconductor industry has adopted primarily thin growth techniques such as MOCVD and MBE, and only for a limited number of well-studied materials.

The disclosed heteroepitaxial approach relies on the most promising candidate for thick epitaxial growth, the HVPE technique. Some other existing techniques for thick growth are more bulk-growth than layer-growth techniques, and each of them suffers from its own disadvantages. For example, the aforementioned PVT process, used successfully in the industry for SiC bulk growth, continues to have material quality issues. This is, namely, the reason for seeking alternative approaches for the growth of SiC such as, for example, the Top Seeded Solution Growth (TSSG). PVT (and in some cases the Bridgman method) is the method of choice for the growth of other materials, already mentioned in the text, as well. Such materials include GaSe, ZnSe, ZnTe, ZnS, etc. However, looking at what is available on the market, one can easily figure out that the larger offered samples from such materials are either polycrystalline, or if they are crystalline, they are not large enough for device development. In addition, typically, they still consist of several domains with different crystallographic orientations, i.e. they are still not exactly "crystalline". PVT has been used for the heteroepitaxy of OP-ZnSe on OP-GaAs templates, but the grown OP-ZnSe structures yielded such limited optical results that any further attempts in this direction were discontinued. Obviously, the PVT, by just mechanically delivering the raw material to the substrate surface, is less controllable than HVPE and incapable of providing the flexible options and the variety of chemical paths that the HVPE technique provides. The rest of the options for thick growth are even less competitive. For example, liquid phase epitaxy (LPE) is, practically, a solution growth technique, which suffers from numerous limitations, including relatively thin (microns) growths, difficulty in controlling the composition of the buffer layer, and edge effects (low quality of the layer edges, which are close to the crucible walls, etc. Thus, one of the best achievements of LPE—up to 150-200 μm thick GaAs layers, grown in about 3 hours—is still not comparable with the millimeter thick growth of different materials deposited by HVPE with growth rates of up to 300 μm/h. Solvothermal growth is another example for thick growth. Although quite successful in the bulk growth of quartz, this technique has never achieved anything even close to that performance with any other attempted materials. Yes, growth can be performed heteroepitaxially on multiple substrates but, once the autoclave is closed, nothing else can be done to correct the growth conditions, if necessary. In addition, the grower may wait for months to gain enough layer thickness on the samples that are still not large enough for device development. It was found that HVPE provides more options for controlling the growth process and more choices for growth chemistries for thick homo- and heteroepitaxy. This, however, does not mean that HVPE still does not have its own problems. Such are, for example, the severe parasitic nucleation on the inner quartz surfaces of the reactor that always accompanies the growth and competes with the deposition process that occurs on the substrate surface. Such parasitic nucleation slows down the process (reducing the growth rate on the substrate), depletes the precursor sources, and deteriorates the layer quality.

The disclosed process allows successful heteroepitaxial growth even at relatively large lattice and thermal mismatches, and without patterning the substrate, which in many cases is the standard procedure. The present invention is based on the accumulation of a significant amount of information about a great number of semiconductor materials and various growth processes used to grow them. This allowed us to realize the significance of the determination of important characteristics of heteroepitaxy, e.g. the thickness of the pseudomorphous growth, the periodicity of the misfit dislocations, and the mechanisms of strain relief, and to successfully make samples for several particular cases. In turn, the determination of these parameters and, in general, enriching our experience and knowledge related to these processes allowed us to develop criteria by which to predict other successful cases of heteroepitaxy, and thus to realize heteroepitaxial growth at mismatches that at first sight looked impossible. Pseudomorphous growth is not ternary or quaternary growth. Instead, it is the initial stage of growth during heteroepitaxy. During this stage of growth the grown layer is "forced" to grow with the lattice constant of the substrate. This growth occurs at the expense of building a linearly-increasing strain in the layer as a result of the lattice mismatch between layer and substrate. However, after reaching a thickness called critical thickness $h_c$, the strain starts to be released by different energy absorbing mechanisms, e.g. formation of misfit dislocations, roughening of surfaces, formation of voids, etc.

The disclosed method is based on our understanding of the complex chemistry and growth mechanisms of heteroepitaxy of wideband semiconductor materials. The method secures a smooth transition between two distinct materials, for example GaAs and GaP, or GaAs and ZnSe, or GaP and GaSe, or GaSb and ZnTe, etc., not through a forced-growth process but while preheating the substrate and during the initial stages of growth. During the initial growth stages, the process directs the gradual replacement of substrate atoms, for example V-group atoms, with V-group atoms from the growing material. (Note: The later, however, is not a strict requirement meaning that the replacing atoms can by not only V-group atoms of the growing material but also any other suitable atoms that could assist the smooth substrate-to-layer transition). Thus the process, according to the given example, may direct the replacement of As atoms in the crystal cell of a GaAs substrate with P atoms during the preheating process, which may be conducted in a phosphine ($PH_3$) atmosphere or in the flow of a mixture of phosphine ($PH_3$) and arsine ($AsH_3$). The operator may also make timely decisions to optimize the process, e.g the temperature (if the growth is still in the preheating stage) at which to initiate such replacement, i.e. at which temperature to start exposing the substrate to the non-native precursor), and whether this temperature should be kept constant during the deposition of this buffer layer, or whether it should be increased at some rate until achieving the growth temperature, etc. The user also must decide whether to keep the arsine/phosphine ratio constant or to gradually change this ratio from arsine only to phosphine only in order to achieve the smoothest transition between substrate material (e.g. GaAs) and grown layer material (e.g. GaP). These possibilities point to the great flexibility of the proposed method in controlling the quality of the buffer layer.

From another point of view, the disclosed approach is universal also because it may be applied to a wide range of different materials having wide ranges of differences in their lattice constants and in their thermal properties expressed by the differences in their thermal expansion coefficients and their thermal conductivities. In spite of all these differences, by using this technique, these materials still may be deposited one over another in a one-step epitaxial growth process, with or without the intentional deposition of the aforementioned intermediate sub-lattice transition buffer layer between them. This approach has been demonstrated to be extremely successful in the growth of GaP on GaAs and in the opposite case, i.e. in the growth of GaAs on GaP although these two cases, from the perspective of lattice mismatches, are not highly favorable (see FIG. 25). The disclosed method has been applied to some other related materials systems which, from point of view of lattice mismatches, are more favorable than GaP/GaAs. One of these cases is the heteroepitaxy of ZnSe on plain GaAs substrates and on OP-GaAs templates. These growths resulted in smooth layer surfaces and high ZnSe crystalline quality on plain substrates and good domain fidelity when the growth was performed on OP templates. Respectively, growths of cubic and hexagonal phase GaSe were also performed on plain GaP, GaAs, Si, and GaN substrates. The initial results, especially in the case of GaSe/GaAs, are promising. However, a long line of other favorable heteroepitaxial cases with small lattice mismatches such as ZnTe/GaSb, ZnS/GaP, GaP/Si, etc. (see FIGS. 1 and 13A-13B, and Table 2) are in the plan to be explored in the near future in order further to confirm the feasibility of the proposed method.

Regarding the particular case of the growth of ZnSe on GaAs, the GaAs substrate (or template) is preheated in hydrogen selenide ($H_2Se$) mixed with $H_2$ or in a $H_2Se:AsH_3$: $H_2$ mixture in order to partially and gradually replace the V-group atom (As) in the GaAs crystal cell with Se (which is a VI-group atom) and thus form a $GaAs_xSe_{1-x}$ ternary buffer layer. After this step, the growth may continue with the introduction of the Zn-precursor, which may be either metallic Zn overflowed by HCl (or an $HCl+H_2$ mixture) to form zinc chloride ($ZnCl_2$), or simply $ZnCl_2$ overflowed by $H_2$, or even a Zn-rich $ZnCl_2$ solution overflowed by $HCl+H_2$ mixture. (Note: The latter one may be the better choice due to the relatively high vapor pressure of zinc.) Table 2 compares the lattice mismatch of the realized GaP/GaAs heteroepitaxy with the lattice mismatches of some other examples (incl. ZnSe/GaAs) for prospective heteroepitaxial cases as more examples and details are provided in FIGS. 13A-13B).

TABLE 2

Some favorable cases of heteroepitaxy based on their lattice mismatch.

| Heteroepitaxy | Lattice mismatch [%] |
| --- | --- |
| GaP on GaAs | −3.57 |
| ZnSe on GaAs | +0.24 |
| ZnTe on GaSb | +0.08 |
| ZnS/GaP | −0.57 |
| ZnTe on InAs | +0.70 |
| AlAs/GaAs | +0.13 |
| GaP/Si | +0.37 |

As one can see in some of the cases (e.g. ZnSe/GaAs, ZnTe/GaSb, etc.) the V-group atom will not be replaced by a V-group atom but by a VI-group atom (Se, Te, etc.). This means that the replacement of atoms shall be considered as flexible as more factors such as, e.g. the ionic radius or other technological limitations are taken into account when choosing the replacement options. This also means that it is possible to choose for pre-growth treatment of the substrate a chemical that it is not a native precursor for either the substrate or the layer material.

From Table 2 one may also see that all other given examples by provide much smaller (less than 1%) lattice mismatches, which are more favorable than GaP/GaAs, and which give them a better chance for success. In addition, to make the "right" choice one should take into account also what the desired application might be and some other related properties of the particular material candidate. For example, a brief comparison of ZnSe and ZnTe shows that ZnTe has about the same transmission range as ZnSe but lower 2PA and 3 times higher nonlinear susceptibility at the desired pumping wavelength of about 1 µm, i.e. ZnTe may be a better choice for nonlinear frequency conversion devices. Of course, one also should pay attention to the specific technological limitations related to the growth of a particular material. For example, for the growth of ZnTe, according to the suggested chemistry, we shall use $H_2Te$ for both the pre-growth treatment of the substrate (GaSb) and the actual growth of ZnTe. However, the worldwide supply of $H_2Te$ is relatively limited as, in addition, this gas is relatively unstable—even light assists in its decomposition—which means that the use of alternative Te precursors and chemistry paths is preferable. In contrast, $H_2S$ is readily available and a well-known precursor, and the lattice mismatch of ZnS with the readily available GaP substrates (and OP-GaP templates) is negligible (−0.569%). Regretfully, the nonlinear properties of ZnS are not as good as the NLO properties of ZnTe, which does not mean that heteroepitaxially grown ZnS (large area ZnS substrates are also unavailable for homoepitaxy) cannot be used for applications other than nonlinear frequency conversion. Another example of a technological limitation is that as of today GaP still cannot be grown by HVPE directly on Si, but it can be grown at high quality by MOCVD or MBE. From this point of view, although that the disclosed method gives better chances for the growth of other materials (including some that have never been grown epitaxially in a monocrystalline shape, and in a size large enough for device development) such as (ZnSe, ZnTe, ZnS, etc.), we continued to explore more options. For example, $PH_3$ does not exhibit a strong effect on the Si surface during the pre-growth treatment, however, $H_2Se$ dramatically attacks Si wafers with 4-degree miscut during the preheating stage (see FIG. 24). Accordingly, the "third party" precursor ($H_2Se$) may be used to pretreat the Si substrate with the idea to form a Si-Se transition buffer layer, which by introducing $PH_3$ in a later stage of pretreatment or growth may gradually switch the process to the growth of GaP on the Si substrate. Such extended approaches of this disclosure will be presented later in the text, but as one can see now, the options and variations seem nearly unlimited.

With regard, again, to the GaP/Si growth (see Table 2) the poorer impact of some non-native precursors, and especially of $PH_3$, is probably due to the strong Si-Si bond. In this case, bearing in mind that Si can handle higher temperatures, instead of using an alternative precursor, the Si-substrates may be preheated only in $H_2$ to provoke some thermal decomposition (as shown in FIG. 3B) to allow some Si-atoms to escape the substrate and thus, by releasing more atomic sites, to give a chance for the approaching P-atoms released at the thermal decomposition of the $PH_3$ molecules to occupy their positions. For the purpose, an additional detailed study of the thermal decomposition of Si wafers with different orientations and miscut at different temperatures may be quite helpful. As an alternative, more studies for pre-growth etching of Si with different Si dry or wet etchants may be necessary. The opposite growth, i.e. thick growth of Si on GaP is also possible. Moreover, in this case the lattice mismatch is negative, which according to some crystallographic considerations is even more favorable. In this case, the GaP substrate shall be pretreated in silane ($SiH_4$). Although GaP is more expensive and with a lower quality than a Si substrate, it is more important for the sake of further device development that a pure electronic material (Si) is combined with a pure optical material (GaP), but it is not important which material is the substrate and which is the layer material that will be growing on this substrate. Finally, although the idea of this disclosure is, in general, to realize heteroepitaxial growths in cases where native substrates are unavailable or are of low quality, the opposite growths of all the disclosed cases are a default part of this disclosure every time when such opposite growths may favor one application or another.

All the new heteroepitaxial cases (see Table 2 and FIGS. 13A-13B) may be leveraged by their inclusion in related ternary or even quaternary materials that not only combine the best properties of two (or more) semiconductor materials (of course, in relation to the desired particular practical application), but that also facilitate the heteroepitaxial growth. In addition, the ternaries, in general, shall have a closer lattice match to the parenting substrate materials than the parenting materials themselves, since the lattice constant of a ternary shall always be between the lattice constants of the two parent materials. For example, the lattice constant of the $GaAs_xP_{1-x}$ ternaries depending on the x-composition shall be between the lattice constant of GaP (5,450 Å) and GaAs (5,653 Å). The lattice mismatch of a ternary with any of the binary parent material substrate should be smaller than the lattice mismatch between the two parent materials.

Another direction that may be taken in developing this idea is to make the lattice constants between substrate and growing layer closer by doping the growing layer, while keeping in mind that doping with dopants that are different in size (i.e. smaller or larger ionic radius) will change more or less the lattice constant of the doped material. On the other hand, the dopant concentration may be gradually changed during growth, which will form a transition layer with a gradually changing lattice constant. This approach may secure an even smoother transition between the substrate and the growing layer. Finally, the suggested in-situ doping procedure conducted during the pre-growth treatment or during the initial stages of growth may be replaced by some prior growth doping procedure such as, for example, ion implantation. Indeed, ion implantation is known as being capable of changing the properties, including the lattice constant, of a thin area of the target (in our case, the substrate) near its top surface. Each of these variations of the proposed substrate pre-growth pretreatment shall be followed by growth that aims to deposit a thin or thick epitaxial layer.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

EXPERIMENTIAL

As illustrated in FIGS. 10A-10L, the related experiments were conducted in a hot wall 3-inch diameter horizontal quartz reactor 10 positioned in a three-zone resistive furnace 12. The furnace 12 is not depicted in FIGS. 10B-10L for clarity. If no ternaries are to be formed, the gasses labelled as "ternary-forming gas" in FIGS. 10A-10L correspond to the "second precursor gas" of the claims. Mixtures of the second precursor gasses, in constant ratios or ratios varying over time, may be used to support the growth of ternaries, which may in turn support the growth of the desired growing layer. The sole "precursor gas" of FIGS. 10A-10L corresponds to the "first precursor gas" of the claims. The first precursor gas is usually hydrogen chloride (HCl) diluted to the desired extent by the carrier gas (usually $H_2$). The role of the first precursor gas is to pick-up a II or III-group element (Al, Ga, In, Zn, Cd, Hg, etc.) from an open boat or a bubbler, and with it to form a metal-chlorine compound which is delivered to the mixing zone, making it available to participate in the growing process The second precursor, or ternary-forming gas, is usually a hydride of a V or VI group element ($AsH_3$, $PH_3$, $H_2Se$, $H_2S$, $SbH_3$, etc.) diluted to the desired extent by the carrier gas (usually $H_2$). The second precursor (ternary-forming gas), which is actually the precursor of the V or VI group element, is delivered to the mixing zone, making it available to participate in the growing process. We call the second precursor "ternary-forming" because the reactions between the first precursor gas and the ternary-forming gas on the foreign substrate may result in the formation of ternary islands on the substrate, which may eventually coalescence to form a continuous ternary transition buffer layer.

Figure 10A:
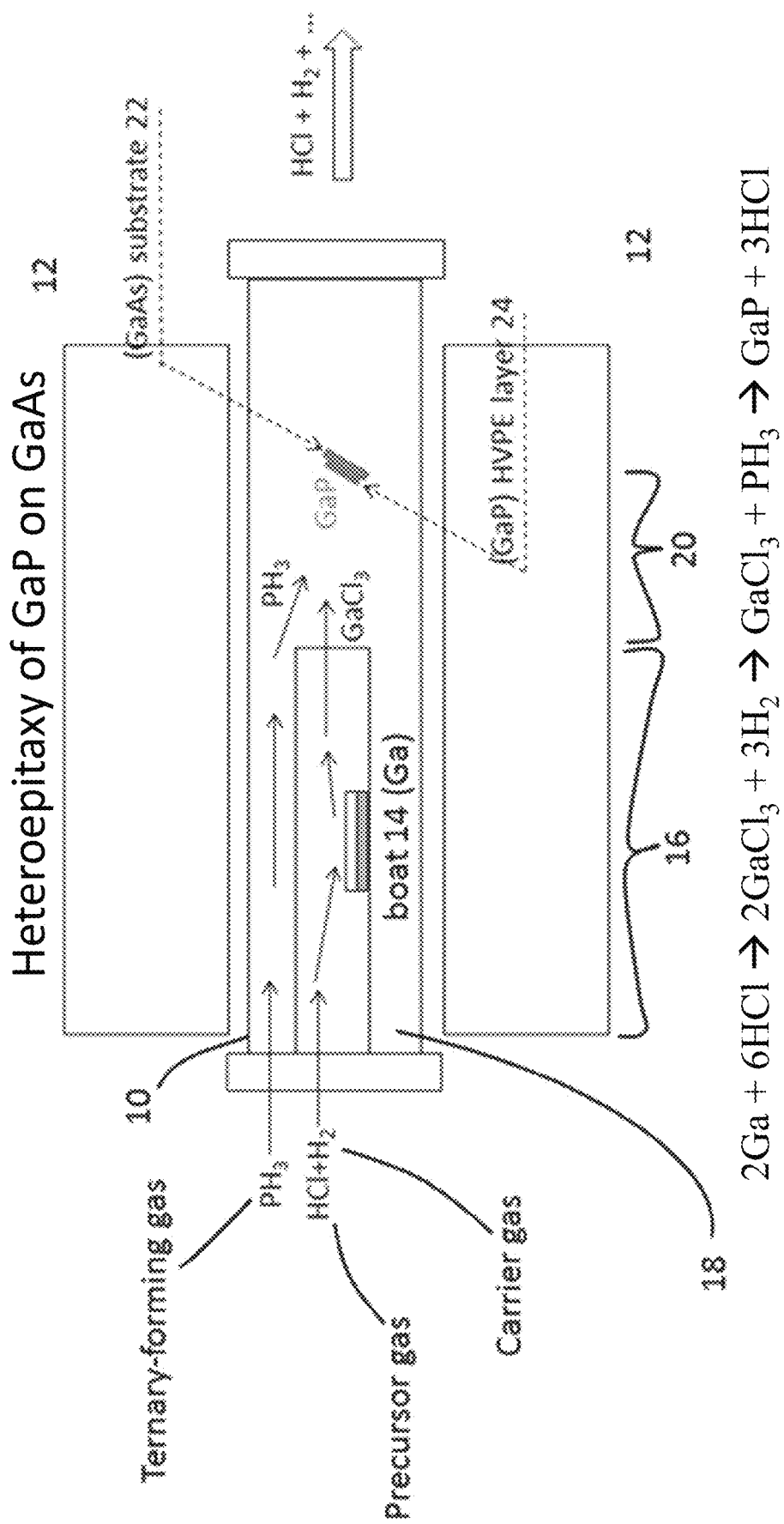
FIG. 10A illustrates a schematic drawing of an HVPE apparatus for optimized thick heteroepitaxial growth of GaP with in-situ pre-growth treatment of the GaAs substrate or the template, according to an embodiment of the invention.
Figure 10B:
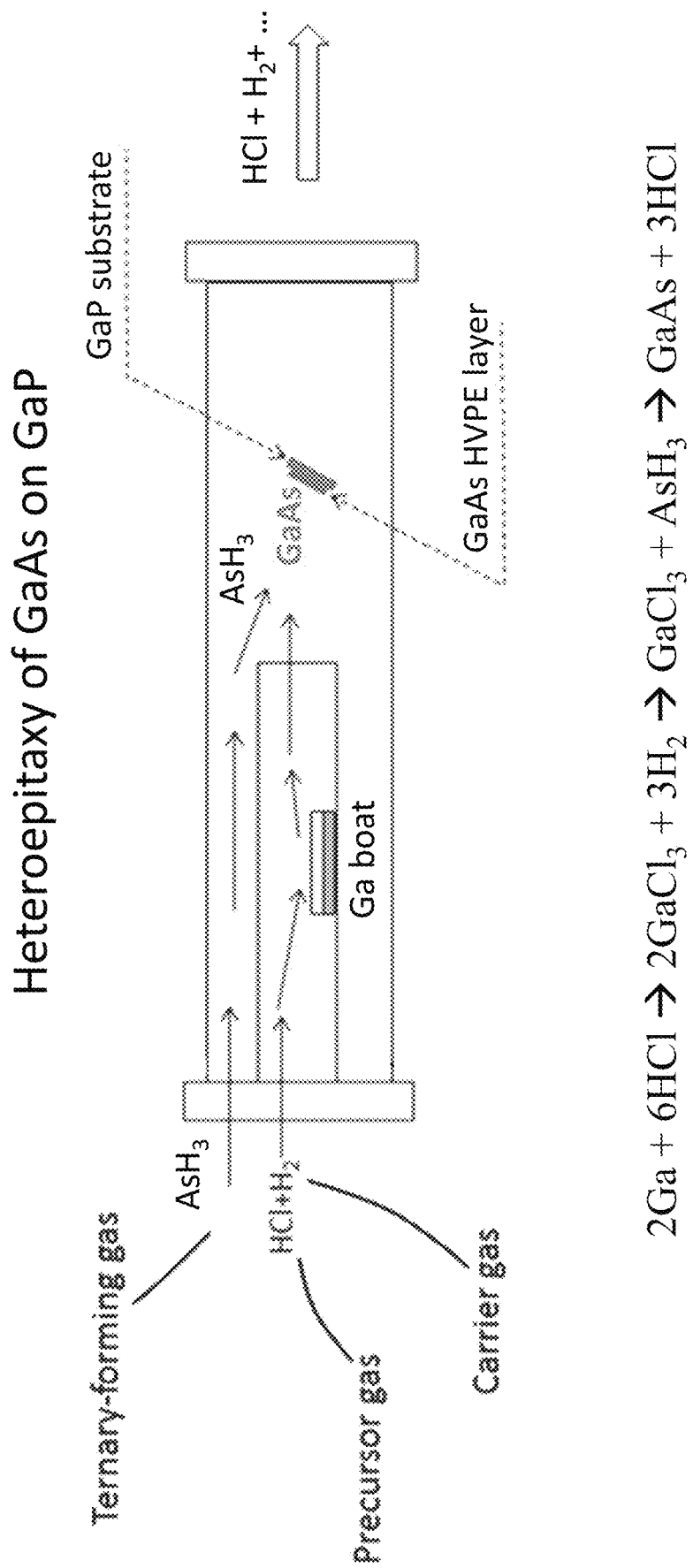
FIG. 10B illustrates a schematic drawing of an HVPE apparatus for optimized thick heteroepitaxial growth of GaAs with in-situ pre-growth treatment of the GaP substrate or the template, according to an embodiment of the invention.

Example 1—Growth of GaP on GaAs Substrates, GaAs on GaP Substrates and $GaAs_xP_{1-x}$ on Either GaAs and GaP Substrates, or all of them on the Related OP Templates These embodiments of the invention are based on the hydride vapor phase epitaxy (HVPE) process, which results in thick heteroepitaxial growth of GaP on GaAs substrates (or of OP-GaP on OP-GaAs templates) (see FIG. 10A), or the opposite case of the heteroepitaxial growth of GaAs on GaP substrates (or on OP-GaP templates) (see FIG. 10B). However, one should bear in mind that even though these are two successfully realized examples, they are not the most favorable ones in terms of matching their crystal lattices or matching their thermal expansion coefficients or thermal conductivities. As explained in the text above, many other couples of other semiconductor materials may be favored by the proposed approach, i.e. grown by the proposed technique. The initial reason to involve GaAs substrates and OP-GaAs templates first was that they were readily available at a relatively high quality and a reasonable price. In contrast, the quality of the available GaP substrates offered on the market (and from here the quality of the fabricated OP-GaP templates) was much lower, which lowered the quality of the thick HVPE growth on them. Their price was 5-6 times higher than the price of the GaAs substrates. To choose to grow first GaP/GaAs but not the opposite GaAs/GaP came also from the sign of the negative lattice mismatch. This means that the GaP layer grows under tensile stress, which is the more favorable case because this arrangement compensates the naturally compressed surface of the GaAs substrate.

With regard to FIG. 10A, a quartz boat 14 positioned in the first zone 16 and filled with molten gallium (Ga) was placed in a one-inch diameter inner tube 18 and a mixture of hydrogen $H_2$ as carrier gas and HCl as a first precursor gas was flowed over the boat 14. The purpose of the $H_2$ carrier gas is not only to carry the HCl precursor gas but also to dilute the HCl flow to a desired extent while the HCl flow picks up some gallium (Ga) from the boat 14 to form gallium chloride, for example gallium tri-chloride ($GaCl_3$) in the reaction:

  (eq. 3a)

However, forming gallium mono-chloride (GaCl) or gallium dichloride ($GaCl_2$) when HCl pass over the molten Ga is also possible in similar reactions as shown in the following equations 3b and 3c):

  (eq. 3b)

  (eq. 3c)

Another peripheral flow, a mixture of hydrogen and phosphine ($PH_3$), as a second precursor gas, in the case of GaP growth, or a mixture of hydrogen and arsine ($AsH_3$) in the case of GaAs growth, or their mixture ($PH_3+AsH_3$) is mixed, again, with $H_2$ as a carrier gas and a diluter, in the case of $GaAs_xP_{1-x}$ growth, is introduced in the reactor 10 to mix with the $GaCl_3$ in the second reactor zone 20, called "mixing zone", with the intention the gases in the mixture to react in such a way that to form on the surface of the substrate 22, respectively, GaP, GaAs, or a $GaAs_xP_{1-x}$ ternary layer. The same basic hardware is used in all variations of the disclosed method depicted in FIGS. 10A-10L. While FIG. 10A illustrates the growth of GaP or $GaAs_xP_{1-x}$ on a GaAs substrate, FIG. 10B illustrates the similar process of the growth of GaAs or $GaAs_xP_{1-x}$ on a GaP substrate. In this case the second precursor gas (or the ternary gas) is $AsH_3$ instead of $PH_3$ or it may be their mixture $PH_3+AsH_3$ (all mixed/diluted with $H_2$). In this case, growth of the ternary on a GaP substrate, however, the content of phosphine in the $PH_3+AsH_3$ mixture should be higher. This is intended to form a ternary with a higher phosphorus content, which should have a smaller lattice mismatch with the GaP substrate, in contrast with the first case when an arsine rich $PH_3+AsH_3$ mixture shall form an arsenic rich ternary with a lattice constant that is closer to the lattice constant of the GaAs substrate. The GaAs/GaP growth is considered as less favorable. The reasons for that are: First, the material quality of the commercial GaP wafers is lower and, as a result, the quality of the fabricated OP-GaP templates is lower. This naturally leads to poorer thick HVPE growth on such lower surface quality surfaces. Second, the sign of the lattice mismatch in the case of GaAs/GaP is positive, which means that, in contrast to the previous case (GaP/GaAs), the GaAs layer grows under compressive strain that, according to some considerations is less favorable than the growth under tensile strain (GaP/GaAs). One may overcome the poor quality of the commercially-available GaP substrates by creating a high quality GaP layer (according to the method of FIG. 10A, and growing GaAs on that GaP layer. This technique may be applied for each of the examples presented herein. After forming $GaCl_3$ (eq. 3a) the most probable chemical reactions related to forming GaP on GaAs or GaAs on GaP are:

  (eq. 4a)

  (eq. 4b)

These reactions are based on the assumption that when HCl is passing over the molten Ga it forms gallium tri-chloride $GaCl_3$. However, as was shown in eq. 3b and eq. 3c, forming gallium mono-chloride GaCl or gallium dichloride $GaCl_2$ is also probable. In such cases, the above equations shall be differently balanced, as is shown below in equations 4c and 4d for the case of forming GaP and in equations 4e and 4f for the case of forming GaAs:

  (eq. 4c)

  (eq. 4d)

  (eq. 4e)

  (eq. 4f)

Figure 10C:
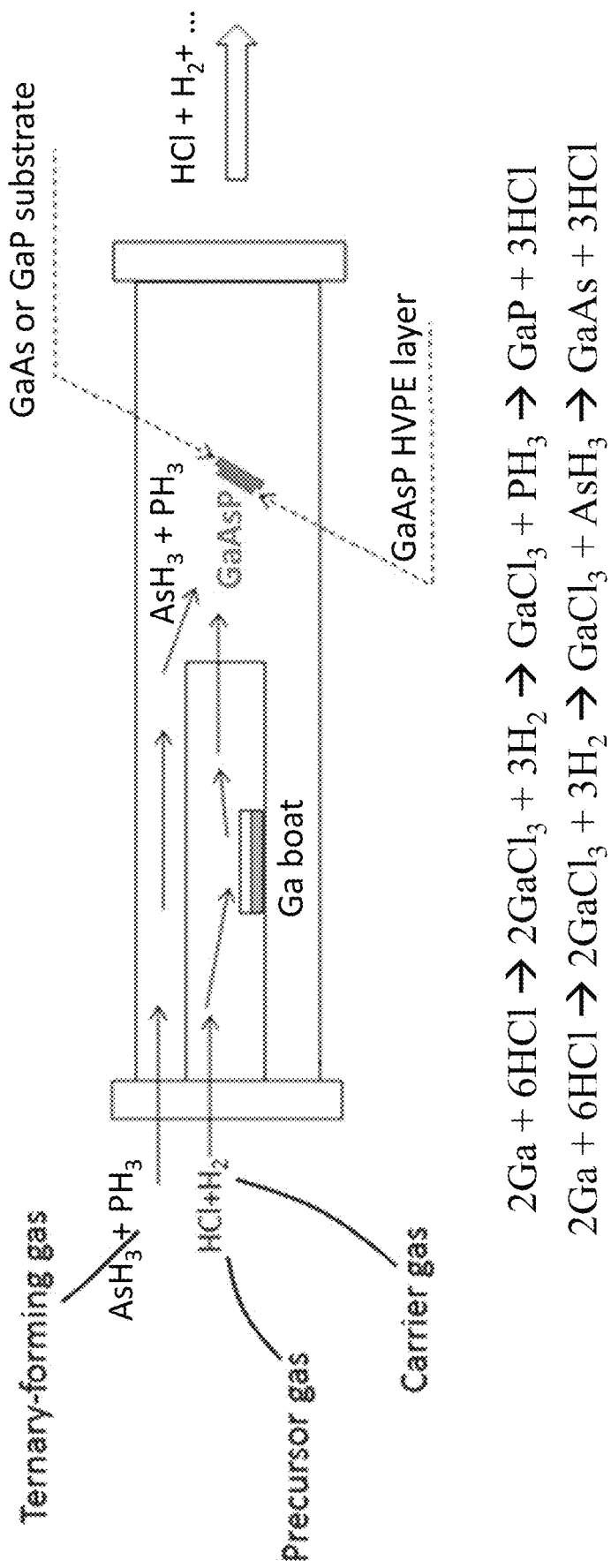
FIG. 10C illustrates a schematic drawing of an HVPE apparatus for optimized thick heteroepitaxial growth of GaAs$_x$P$_{1-x}$ ternaries with in-situ pre-growth treatment of the GaAs or GaP substrate or the template, according to an embodiment of the invention.

The schematic of the process and its chemistry during the growth of the $GaAs_xP_{1-x}$ ternaries are shown in FIG. 10C.

As one can see all other heteroepitaxial cases discussed further in the text—some of which are illustrated in the following examples—have distinct but similar chemistry.

Some typical values for the inner flows of $H_2$ and HCl, and the outer flows of $PH_3$ and/or $AsH_3$ related to the HVPE growth of GaP, GaAs, and/or $GaAs_xP_{1-x}$ are provided in Table 3 below, as an example. However, these numbers are strictly correlated to growths of GaAs, GaP, or their ternaries and to the particular configuration of the HVPE reactor shown in FIG. 10A, e.g. a hot wall horizontal reactor with a 3-inch in diameter quartz tube with length of approximately 48-72 inches typically kept at lower than atmospheric pressure. In these particular cases, the total gas flow was less than 400 sccm (standard cubic centimeters per minute, which means the flow that should be expected at "standard" conditions such as atmospheric pressure and room temperature). However, other reactor configurations or processes that involve other materials and precursors may need different flows and flow regimes. In all cases, however, the total gas flow in the close-to-equilibrium HVPE process will be much less than the huge (many liters) flows of gases typically used in far-from-equilibrium processes, such as MOCVD or MBE. At such far-from-equilibrium conditions, the process relies on high supersaturation that provides conditions for massive irreversible nucleation everywhere on the substrate surface.

TABLE 3

Some typical values for the inner and outer flows (sccm) of $H_2$, HCl, $PH_3$, and $AsH_3$ during growths of GaP, GaAs, or their ternaries.

| Inner Flow | | Outer Flow | | | |
| --- | --- | --- | --- | --- | --- |
| $H_2$ | HCl | $H_2$ | HCl | $AsH_3$ | $PH_3$ |
| 65-75 | 30-35 | 100-110 | 30-50 | 70-80 | 50-60 |

With respect to the rest of the growth parameters, all experiments were conducted with parameters within the following ranges: pressure <10 Torr, substrate temperatures 720-740° C. for the growth of GaP (respectively 680-700° C. for the growth of GaAs), and V/III ratios in the range of 2-3. These ranges provided conditions for a close-to-equilibrium process at relatively low supersaturation (typically between 0.5-1.0), which is the nature of the HVPE growth.

Growth experiments were conducted homoepitaxially (GaP/GaP and GaAs/GaAs) and heteroepitaxially (GaP/GaAs and GaAs/GaP) on plain "on-axis" (100) GaAs and GaP substrates and on the same (100) substrates but misoriented with 4° towards (111)B. As it was already mentioned, the growths of the $GaAs_xP_{1-x}$ ternary at different x ratios were performed on both GaP and GaAs substrates (FIG. 10C). Homo- and heteroepitaxial growths were performed on the related OP templates, as well. For example, homoepitaxy of GaP on OP-GaP templates and of GaAs on OP-GaAs templates, heteroepitaxy of GaP on OP-GaAs templates and GaAs on OP-GaP templates; and, finally, GaAsP on OP-GaAs and OP-GaP templates.

An important step in this process, strongly correlated to this invention, is related to the way of protecting the substrate 22 (FIGS. 10A-10L) from thermal decomposition before growth begins. Such protection is generally limited to protecting the substrate from thermal decomposition as in FIG. 3B, but not necessarily from other, desired, influences of the non-native precursors as presented in FIGS. 3C, 3D, 4A-4D, 6A, and 9B-9D. For this purpose when the reactor temperature reaches about 350° C. the substrate must be kept in either an $AsH_3$ atmosphere, in the case of a GaAs substrate, or in a $PH_3$ atmosphere, in the case of a GaP substrate. In the case of heteroepitaxy, we have more options, each of which need to be effective enough. These choices include the protection of a GaAs substrate in a $PH_3$ atmosphere or, vice versa, protection of a GaP substrate in an $AsH_3$ atmosphere. As an alternative, we may also protect the wafer (substrate) by maintaining it in a mixture of $PH_3$ and $AsH_3$ gases. In all these cases one should keep in mind that, typically, the precursor flows, as well the hydride precursors, e.g. $PH_3$, $AsH_3$, $H_2Se$, $H_2Te$, $SbH_3$, etc., are diluted by the carrier gas ($H_2$); as a practical matter, we use mixtures of $AsH_3$:$H_2$, or $PH_3$:$H_2$, or $AsH_3$:$PH_3$:$H_2$. One should also bear in mind that the growth of other materials (see FIGS. 10D-10L) will require distinct chemistries for substrate-pretreatment and growth. For example, the growth of ZnSe on GaAs substrates (or OP-GaAs templates) requires pretreatment of the GaAs substrate (or OP-GaAs template) in an $H_2Se$:$H_2$ or an $AsH_3$:$H_2Se$:$H_2$ precursor mixture. To fully explore the capabilities of the pre-growth stage, we conducted the preheating procedures not only in different precursor (or mixtures of precursors) atmospheres (flows) but also using different flow rates, different precursor ratios in the mixtures and different gas regimes of introducing those gases following preliminary determined schemes. Further experiments of this nature were continued as the preheating stage was followed by the stage of the epitaxial growth. The later experiments were performed in order to assess the impact of the initial stages of growth on the final layer quality. Finally, during the cooling stage the grown layers or OP structures had to be similarly protected from thermal decomposition keeping them in the related precursor's atmosphere until the substrate temperature achieved the safe level of about 350° C. or lower. The growths discussed in Example 1 are presented schematically in FIGS. 10A, 10B and 10C.

Figure 10D:
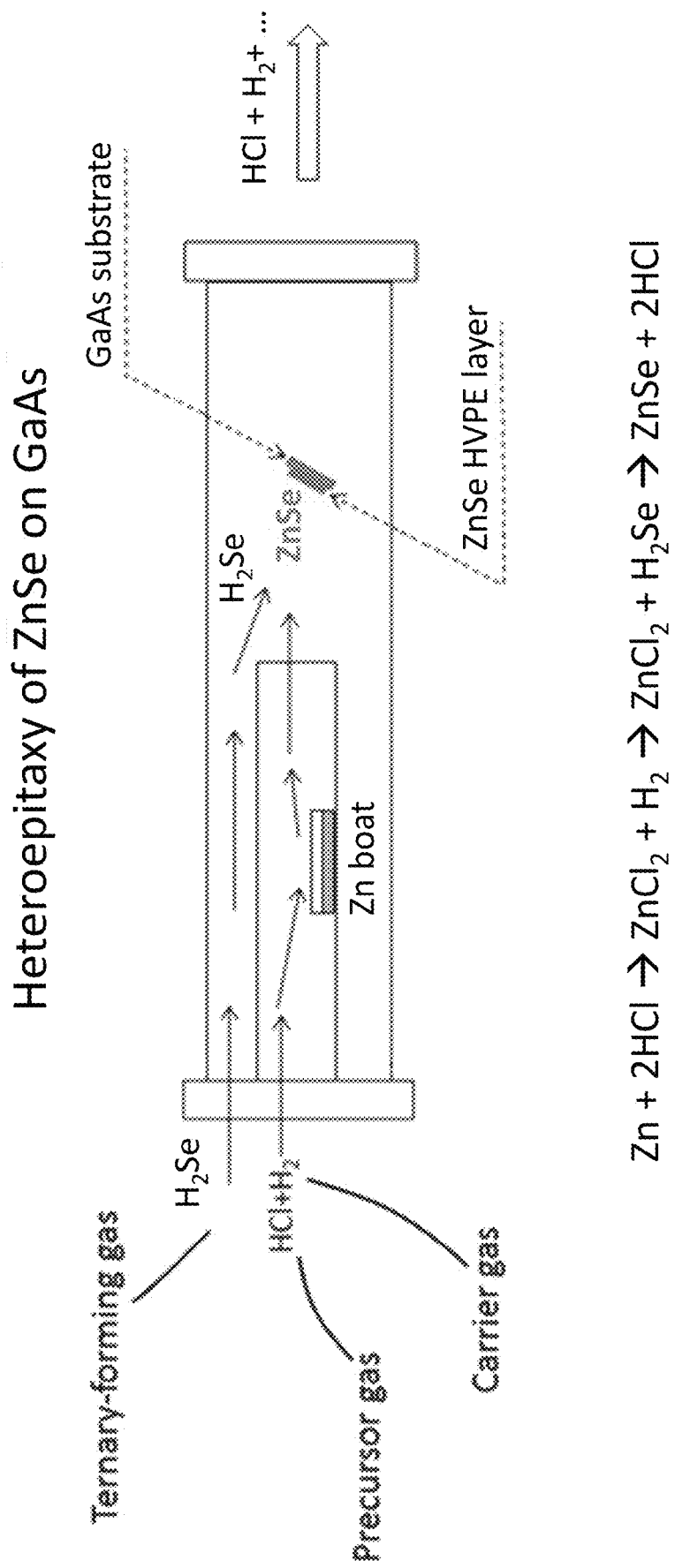
FIG. 10D illustrates a schematic drawing of an HVPE apparatus for optimized thick heteroepitaxial growth of ZnSe with in-situ pre-growth treatment of the GaAs substrate or the template, according to an embodiment of the invention.
Figure 10E:
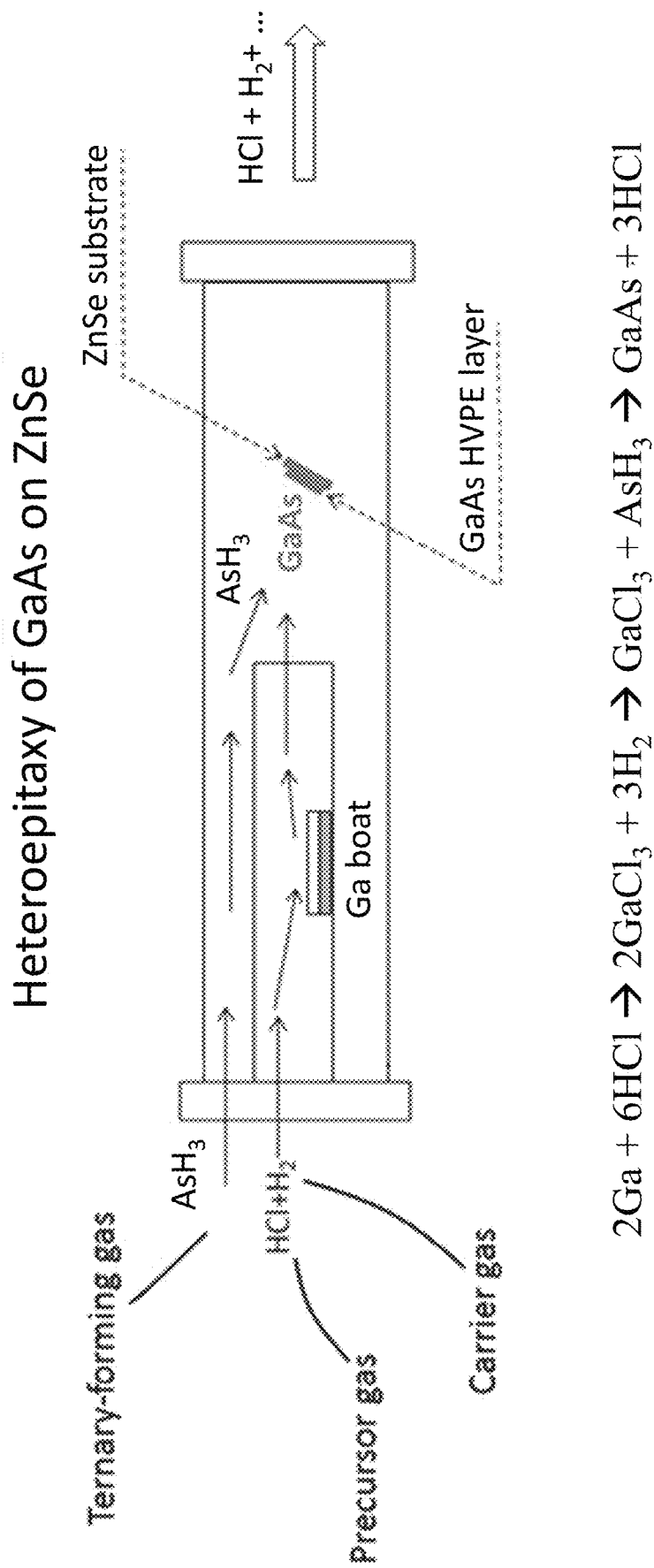
FIG. 10E illustrates a schematic drawing of an HVPE apparatus for optimized thick heteroepitaxial growth of GaAs with in-situ pre-growth treatment of the ZnSe substrate or the template, according to an embodiment of the invention.

Example 2—Growth of ZnSe on GaAs Substrates and OP-GaAs Template, as Well as the Opposite Growth of GaAs on ZnSe Substrates This embodiment of the invention is based on hydride vapor phase epitaxy (HVPE) and the heteroepitaxial growth of ZnSe on GaAs substrates (FIG. 10D) and OP-GaAs templates, and the opposite case of heteroepitaxial growth of GaAs on ZnSe substrates (FIG. 10E). Homoepitaxial growths of GaAs on GaAs substrates and ZnSe on ZnSe substrates were also conducted in order to optimize the growth conditions. As explained in the text above, many other semiconductor materials may be grown by this technique and are favored by the proposed approach. In the first case of this example—ZnSe/GaAs growth—the quartz boat 14 that is positioned in the first zone 16 of the furnace was filled with molten zinc. As a variation of this technique, the boat may instead of being filled with Zn may be filled with zinc chloride ($ZnCl_2$), or with a Zn-rich $ZnCl_2$-solution. The boat was placed in a one-inch diameter inner tube 18 and a mixture of hydrogen $H_2$ and HCl (first precursor) was flowed over the boat 14. As explained above, the purpose of the $H_2$ is not only to carry the HCl but also to dilute the HCl flow to a desired extent while the HCl flow picks up some zinc (Zn) from the boat 14 to form zinc chloride ($ZnCl_2$). In the case of using $ZnCl_2$, $H_2$ may be used simply as a carrier gas to deliver $ZnCl_2$ to the mixing zone. Another peripheral flow, a hydrogen+hydrogen selenide ($H_2$:$H_2Se$) mixture is introduced as a second precursor in the reactor 10 to mix with the $ZnCl_2$ in the second reactor zone 20 (the "mixing zone").

The intention is to have the II and VI group (Zn and Se) species in the mixture react and to form a ZnSe monocrystalline layer on the surface of the substrate 22. With regard to FIG. 10D, the process is similar to that presented with regard to FIG. 10A, except that $H_2Se$ is the ternary-forming gas, and a layer of ZnSe is formed on a GaAs substrate. This GaAs substrate, as a first step during the preheating stage is, similarly, exposed to the non-native precursor, $H_2Se$, or to the $AsH_3$:$H_2Se$ mixture, in order to introduce Se atoms to start replacing As atoms in the GaAs substrate and, eventually, form an intermediate ternary GaAsSe transition layer. As a result, later during the initial stages of growth, possibly, this layer will convert gradually in a quaternary (GaAsZnSe) transition buffer layer, which also gradually will convert growing in a pure ZnSe layer. In this case (FIG. 10D), in difference to the first three presented cases (FIG. 10A-FIG. 10C) the replacement of the V-group atoms (As) in the substrate is not with V-group but with VI-group atoms (Se). Thus, as a result, the formed initial ternary layer (GaAsSe) is not a combination from the two parenting materials, i.e. the substrate and the layer.

Growth of ZnSe on GaAs substrates and on OP-GaAs templates is a reasonable option for the growth of ZnSe because large area (enough large for device development) ZnSe monocrystalline substrates are not commercially available—the largest available "monocrystalline" ZnSe samples on the market are typically 5 mm×5 mm, and which still consist of several domains with different orientations. Consequently, OP-ZnSe templates are unavailable, as well.

Heteroepitaxy of ZnSe on GaAs is also reasonable due to the very small lattice mismatch (+0.238%) between ZnSe and GaAs. Fortunately, the availability of high quality GaAs substrates, their reasonable price, and the maturity of two OP-GaAs template preparation techniques (the wafer bonding and the MBE assisted polarity inversion technique) provide great opportunities for the growth of high quality crystalline ZnSe on non-native GaAs substrates, as well as OP-GaSe on the high quality OP-GaAs templates.

The advantage of ZnSe over GaAs and GaP is its wide and smooth IR transparency and its smaller refractive index (see FIG. 26) which, if the pursued application is for frequency conversion devices, allows wider domains of the OP templates. This significantly facilitates subsequent thick HVPE growth because it is easier to achieve good domain fidelity during the HVPE growth when the domains are wider.

Gas flow parameters for the growth of ZnSe on GaAs are similar to those presented in example 1. As depicted in FIG. 10D, the formation of ZnSe on GaAs (described below) is likely according to the reaction:

(eq.5a)

(eq. 5b)

(Note: We assume that when HCl pass over the molten Zn the formed zinc chloride is zinc dichloride ($ZnCl_2$). However, mono (ZnCl) or tri-chloride ($ZnC_3$) may be formed; the chemical equations must be properly balanced, similar to the cases of gallium chloride discussed above (eq. 4c-4f).)

The opposite case of heteroepitaxy of GaAs on ZnSe substrates is less attractive for the same reasons and mostly because of the market unavailability of large-area, good quality monocrystalline ZnSe substrates, and the much higher prices of the small dimension ZnSe samples that are available. However, large area polycrystalline ZnSe substrates are available and growth on them for other purposes still might be useful. Growths of GaAs on small monocrystalline ZnSe substrates may be useful for some other applications, bringing the advantage that in the case of GaAs/ZnSe the lattice match is the same but negative, i.e. the GaAs layer will be tensely strained, which according some considerations is more favorable.

As illustrated in FIG. 10E, the related opposite experiments for the growth of GaAs on ZnSe were conducted again in the same hot wall 3-inch diameter horizontal quartz reactor 10 positioned in a three-zone resistive furnace 12. A quartz boat 14 positioned in the first zone 16 and filled with molten gallium (Ga) was placed in a one-inch diameter inner tube 18 and overflowed with a mixture of hydrogen $H_2$ as a carrier gas and HCl (first precursor). Similar to the cases discussed in Example 1, after forming the gallium chloride ($GaCl_3$) this inner flow was mixed in the mixing zone with the peripheral ternary gas flow, which was a mixture between hydrogen ($H_2$) and arsine ($AsH_3$) with the idea to form GaAs on the surface of the ZnSe substrate. The chemistry was the same as during the growth of GaAs on other substrates (see Example 1 and FIG. 10B), for example, on GaP and in equations 4b, 4e, and 4f. A distinction is that to start forming a ternary transition buffer layer on the substrate, the ZnSe substrate may be exposed to the non-native precursor, which in this case is $AsH_3$ or a mixture the non-native precursor and the native precursor, i.e. $AsH_3$+ $H_2Se$, in both cases diluted to the optimal extent with $H_2$. The temperature of the substrate may be slightly different as well, e.g. 800° C.-850° C., taking into account the different properties of the various substrate materials—GaP in Example 1 and ZnSe in this Example 2. Optimal dilution depends of the material. For example, if the material is more volatile, e.g. P, its precursor ($PH_3$) should be less diluted than the least volatile, e.g. As, and the As precursor ($AsH_3$) should be more diluted. A rough estimation is that the diluted gas may be between 10-90% in the precursor flow.

The growths discussed in Example 2 are presented schematically in FIGS. 10D and 10E.

Example 3—Growth of a Cubic Phase Zinc Blende Gallium Selenide $Ga_2Se_3$ on GaP and GaAs Substrates (and the Related OP-GaP and OP-GaAs Templates) and Hexagonal ε-GaSe on GaN (or AlN) Substrates (and the Related OP-GaN Templates)

This embodiment of the invention is based on hydride vapor phase epitaxy (HVPE) and the heteroepitaxial growth of cubic phase zinc blende gallium selenide ($Ga_2Se_3$) on GaP and GaAs substrates (FIG. 10F and FIG. 10G) and hexagonal ε-GaSe on GaN (or AlN) substrate (FIG. 10H) (and on the related OP-GaP, OP-GaAs and OP-GaN templates), or the opposite cases of the heteroepitaxial growth of GaP and GaAs on a $Ga_2Se_3$ substrates, and GaN or AlN on a hexagonal ε-GaSe substrate (the latter is not shown schematically in figures). Homoepitaxial HVPE growths of GaSe on GaSe substrates were also conducted as a reference to the heteroepitaxial growth.

From point of view of transparency range, GaSe is as good as ZnSe but with nearly 3-times higher nonlinear susceptibility (at λ=1 μm), making it close to one of the leading materials for frequency conversion devices, GaAs. At the same time using molten Ga instead, the fast evaporating Zn allows runs with longer durations, i.e. eventually growing thicker layers with larger optical apertures. Regretfully, monocrystalline GaSe substrates larger than 10 mm×10 mm are unavailable, and even if they were available, GaSe is too soft (as soft as gypsum with hardness only of 2 by Mohs) to be able to handle the heavy bonding, polishing, and etching procedures performed in the fabrication of OP templates. Fortunately, GaSe has several different crystallographic phases, two of which, a cubic phase zinc blende gallium selenide $Ga_2Se_3$ and hexagonal F-phase GaSe have relatively close lattice matches (FIG. 13) with three substrate materials, all of which are available in both large area monocrystalline substrates and OP templates. This makes it possible to attempt layer growths by using the method proposed in this disclosure, more specifically of a cubic phase zinc blende gallium selenide $Ga_2Se_3$ on GaP (FIG. 10F) and on GaAs (FIG. 10G), and ε-GaSe on GaN (or AlN) substrates and, eventually, on the related OP templates, OP-GaP, OP-GaAs and OP-GaN. Although the opposite growths of these substrate materials should be, in general, possible on GaSe substrates, since such substrates are not available in sizes large enough for device development or even for fabrication of OP-GaSe templates, we find such growths as less reasonable and that is why they are not included in the provided examples. However, the chemistry of such growths would, eventually, the same as in any other provided examples associated with the growth of phosphides (GaP), arsenides (GaAs) or nitrides (GaN).

Figure 10F:
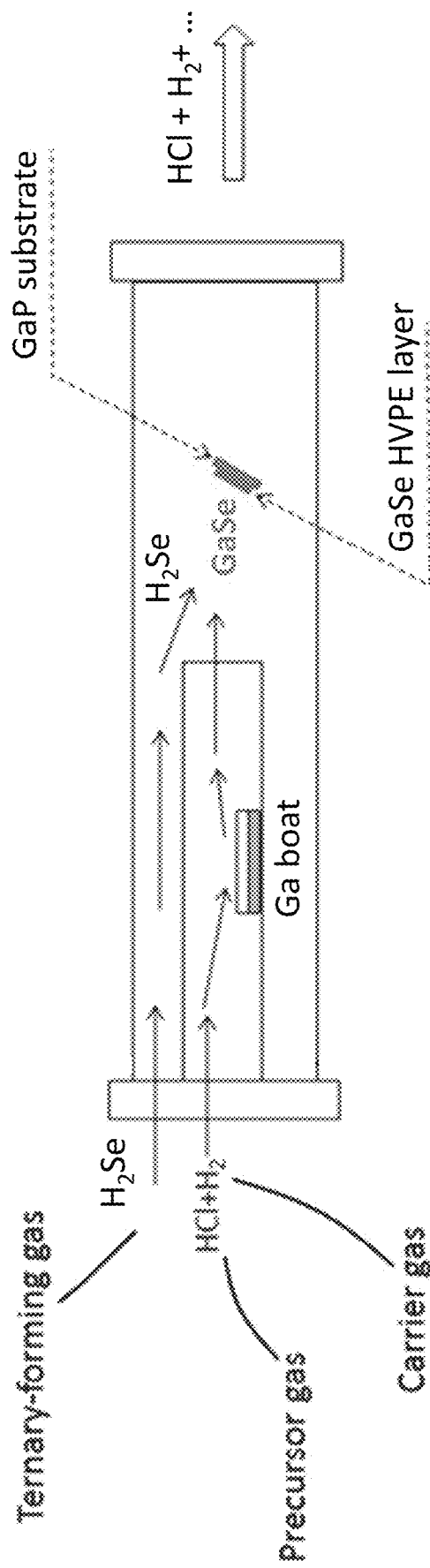
FIG. 10F illustrates a schematic drawing of an HVPE apparatus for optimized thick heteroepitaxial growth of a cubic phase zinc blende gallium selenide Ga$_2$Se$_3$ with in-situ pre-growth treatment of the GaP substrate or the template, according to an embodiment of the invention.
Figure 10G:
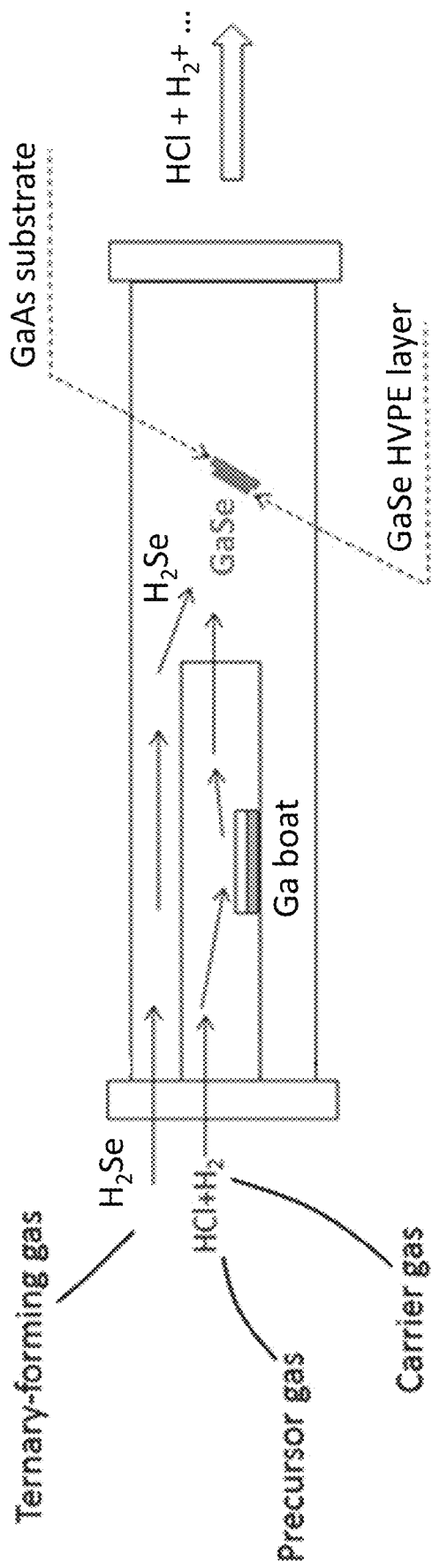
FIG. 10G illustrates a schematic drawing of an HVPE apparatus for optimized thick heteroepitaxial growth of a cubic phase zinc blende gallium selenide Ga$_2$Se$_3$ with in-situ pre-growth treatment of the GaAs substrate or the template, according to an embodiment of the invention.
Figure 10H:
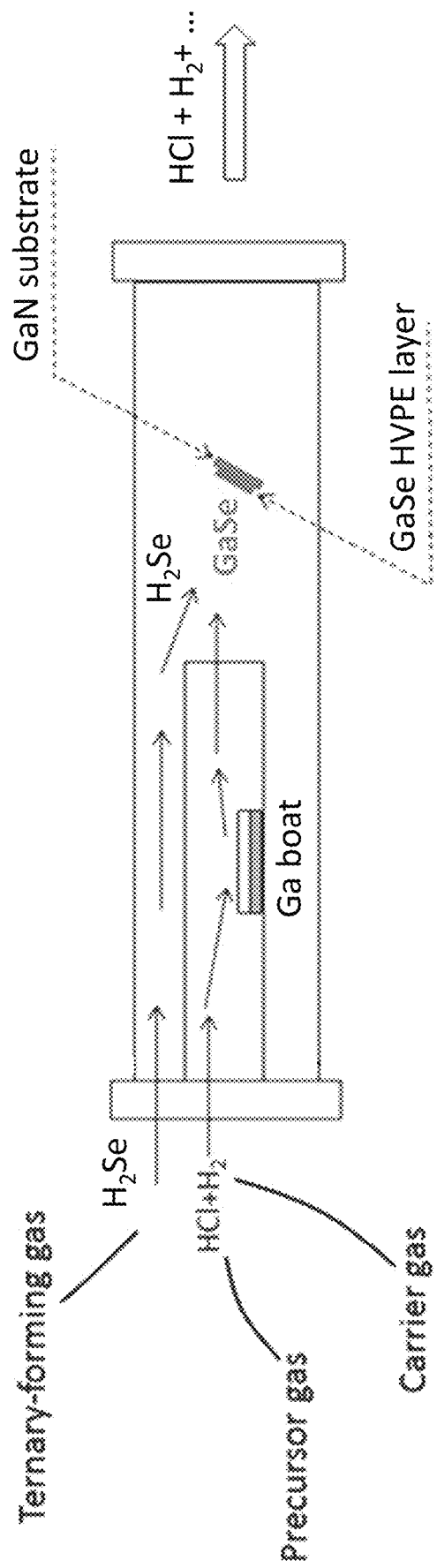
FIG. 10H illustrates a schematic drawing of an HVPE apparatus for optimized thick heteroepitaxial growth of ε-GaSe with in-situ pre-growth treatment of the GaN substrate or the template, according to an embodiment of the invention.

As illustrated in FIGS. 10F-10H, the related experiments were conducted in the same hot wall 3-inch diameter horizontal quartz reactor 10 positioned in a three-zone resistive furnace 12. A quartz boat 14 positioned in the first zone 16 and filled with molten gallium (Ga) was placed in a one-inch diameter inner tube 18 overflowed with a mixture of hydrogen $H_2$ as carrier gas and HCl (first precursor). The purpose of using $H_2$ is not only to carry the HCl but also to dilute the HCl flow to a desired extent, e.g. 30-40%, with $H_2$ being 60-70% of the total $H_2$/HCl mixture, while the HCl flow picks up some gallium (Ga) from the boat 14 to form gallium chloride in one of the following compositions: $GaCl$, $GaCl_2$ or $GaCl_3$. Another peripheral flow, a mixture of hydrogen and hydrogen selenide ($H_2Se$) (second precursor), is introduced in the reactor 10 to mix with the gallium chloride in the second reactor zone 20, the "mixing zone", in order that the species within the mixture react with each other and in surface reactions to form a GaSe layer on the surface of the substrate 22. One of the probable chemical reactions related to forming GaSe is:

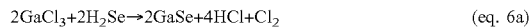
$$2GaCl_3+2H_2Se \rightarrow 2GaSe+4HCl+Cl_2 \quad \text{(eq. 6a)}$$

However, forming GaCl or $GaCl_2$ instead $GaCl_3$ or as fractions of the total gallium chloride flow is not excluded and in such cases eq. 6a shall be differently balanced as is shown below:

$$2GaCl+2H_2Se \rightarrow 2GaSe+2HCl+H_2 \quad \text{(eq. 6b)}$$

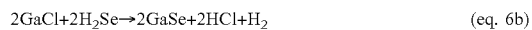
$$GaCl_2+H_2Se \rightarrow GaSe+2HCl \quad \text{(eq. 6c)}$$

In these three chemical equations, however, the assumption is that the formed gallium selenide is the hexagonal E-phase GaSe. For completeness, if we assume that the formed gallium selenide is the cubic phase zinc blende $Ga_2Se_3$, for completeness equations 6a-6c shall be re-written after replacing GaSe with $Ga_2Se_3$, as it follows:

$$2GaCl_3+3H_2Se \rightarrow Ga_2Se_3+6HCl \quad \text{(eq. 6d)}$$

$$2GaCl+3H_2Se \rightarrow Ga_2Se_3+2HCl+2H_2 \quad \text{(eq. 6e)}$$

$$GaCl_2+H_2Se \rightarrow GaSe+4HCl+H_2 \quad \text{(eq. 6f)}$$

To be clear, while equations 6a-6c shall be used for the growth of gallium selenide on the III-Nitride substrates (GaN or AlN), equations 6d-6f shall be associated with the growths on GaP and GaAs substrates. It is worth also to mention that during all three growths the chemistry is the same because the same material, GaSe, is growing. However, since the substrates are different, the optimal growth temperatures for each one of the substrates could be also different, but 500-900° C. or even 720-850° C. is acceptable. Similarly, during the pre-growth treatment all substrates shall be exposed to the same non-native precursor, $H_2Se$, with the expectation, however, that the composition of the intermediate buffer layer will be different. Thus, the buffer layer on the GaP substrate shall be from GaPSe, while the buffer layers in the other two cases of growth on GaAs and GaN (or AlN) shall be, from GaAsSe and, respectively, from GaNSe (or AlNSe). Of course, exposing the substrates during the pre-growth stage or some earlier stages of growth to a mixture of the non-native and the native precursors ($H_2Se+PH_3$, or $H_2Se+AsH_3$, or $H_2Se+NH_3$) is always an option. As described above, all these variations are related to either the growth of a cubic phase zinc blende gallium selenide $Ga_2Se_3$ on zinc blende GaP or GaAs substrates, or hexagonal F-phase GaSe (GaSe) on hexagonal substrates (GaN or AlN). Although from the point of view of lattice mismatch the most favorable case was initially the growth of a cubic phase zinc blende gallium selenide $Ga_2Se_3$ on GaP (lattice mismatch of only −0.607%). As discussed in the results, the growth of a cubic phase zinc blende gallium selenide $Ga_2Se_3$ on GaAs turned out to be most successful, even with the much larger lattice mismatch (−4.181%). The poor results of the GaSe/GaN is not surprising, bearing in mind the large positive lattice mismatch (~17%) between ε-GaSe and the III-Nitride substrates. However, the poor surface morphology and crystalline quality obtained after homoepitaxy of GaSe on a cubic phase zinc blende gallium selenide $Ga_2Se_3$ substrate is quite surprising. Obviously, all this leaves room for further improvements related to this material.

In the opposite cases, which may be less reasonable, growths of the hexagonal wurtzite structure GaN or AlN shall be performed on the hexagonal c-phase GaSe. One of the most probable chemical reactions for the growth of GaN is:

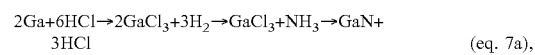
$$2Ga+6HCl \rightarrow 2GaCl_3+3H_2 \rightarrow GaCl_3+NH_3 \rightarrow GaN+3HCl \quad \text{(eq. 7a)},$$

while for the growth of AlN, the most probable chemical reaction is:

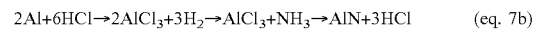
$$2Al+6HCl \rightarrow 2AlCl_3+3H_2 \rightarrow AlCl_3+NH_3 \rightarrow AlN+3HCl \quad \text{(eq. 7b)}$$

Respectively, the growth of the cubic zinc blende GaP and GaAs shall be performed on the cubic phase zinc blende gallium selenide ($Ga_2Se_3$) as the most probable chemical reaction for the case of GaP growth is:

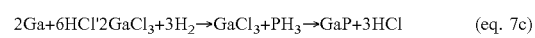
$$2Ga+6HCl'2GaCl_3+3H_2 \rightarrow GaCl_3+PH_3 \rightarrow GaP+3HCl \quad \text{(eq. 7c)}$$

while for the growth of GaAs the most probable chemical reaction is:

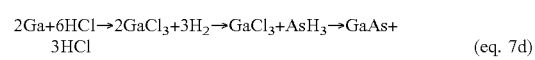
$$2Ga+6HCl \rightarrow 2GaCl_3+3H_2 \rightarrow GaCl_3+AsH_3 \rightarrow GaAs+3HCl \quad \text{(eq. 7d)}$$

Although equations 7a-7d are similar or the same as some of the equations given in Example 1 (e.g. eq. 3a, 4a, and 4b) they are presented here again for more clarity. In general, the growth of the same material follows similar chemical schemes no matter what kind of substrate is used.

In three of the four growths described in Example 3, the growths of GaP, GaAs, and GaN need molten Ga as a source of the III-group element precursors. Only the growth of AlN needs molten aluminum as a source of the III-group element. From the examples provided in this Example 3 one can also see that different materials (e.g. GaN, AlN, GaP) can be grown on different phases of the same material (cubic phase zinc blende gallium selenide $Ga_2Se_3$ and hexagonal phase gallium selenide e-GaSe). This is another alternative variation of the proposed in this disclosure growth approach. In other cases, however, different materials may be grown on the same crystallographic phase of the same material but on surfaces with different crystallographic orientations. This is possible because the lattice mismatch in a particular direction may be smaller for a particular material. Thus, it is known that the growth of cubic GaN is more favorable on (100) GaAs substrates, while the growth of hexagonal GaN is more favorable on (111) GaAs substrates. This is another alternative variation of the approach proposed in this disclosure.

Examples of heteroepitaxial growth of other selenides that are favored by the proposed approach are, e.g. CdSe/InAs (lattice mismatch—0.139%) or even growths of other layered materials such as, e.g. InSe. In the latter case the lattice mismatch and from here the substrate are not that important as far as the most probable growth of a layered material is through the van der Waals heteroepitaxy. Any substrate is acceptable. In these experiments, the II or III group material in the compound (in this case Cd and In) determines the first precursor, which may be just molten metal in the designated quartz boat 14. In contrast, the second precursor (the ternary gas) in all these cases may be hydrogen selenide $H_2Se$, which is also the non-native precursor for the pre-growth treatment of these substrates. The chemistry in these two cases as also presented in the table in FIG. 13 is:

$$Cd+2HCl \rightarrow CdCl_2+H_2 \rightarrow CdCl_2+H_2Se \rightarrow CdSe+2HCl \quad \text{(eq. 8a)}$$

for the growth of CdSe, and:

$$2In+6HCl \rightarrow 2InCl_3+3H_2 \rightarrow 2InCl_3+2H_2Se \rightarrow 2InSe+ 4HCl+Cl_2 \quad \text{(eq. 8b)}$$

for the growth of InSe.

(Note: The large variety of possible chemical paths shown in this Example 3 is applicable to some extent in the rest of the given examples but for simplicity, they are not shown in such details. For the same reason the FIGS. 10A-10L, as well the examples in the table in FIG. 13, are provided only with one or two chemical equations corresponding to the most likely reactions in each particular case.)

The growths given in this Example 3 are presented in FIGS. 10F-10H.

Example 4—Growth of ZnTe on GaSb and InAs Substrates

This embodiment (see FIG. 10I) of the invention is based, again, on hydride vapor phase epitaxy (HVPE) and the heteroepitaxial growth of ZnTe on GaSb or InAs substrates. Such substrates are readily available on the market at a reasonable price and relatively high crystalline quality for wafers with at least 2-inch diameter. In contrast, the ZnTe substrates available on the market are either polycrystalline (at larger sizes) or if they are "monocrystalline" they are relatively small samples which are not large enough for device development (e.g. for fabricating of OP templates) that, typically, still consist of several domains with different crystallographic orientations. That is why, although the opposite growths, i.e. the growths of GaSb or InAs on ZnTe substrates are, in general, possible, we consider them as less reasonable and for this reason we are not presenting them in detail in this disclosure. However, large area, crystalline ZnTe substrates may be grown using the disclosed method.

Figure 10I:
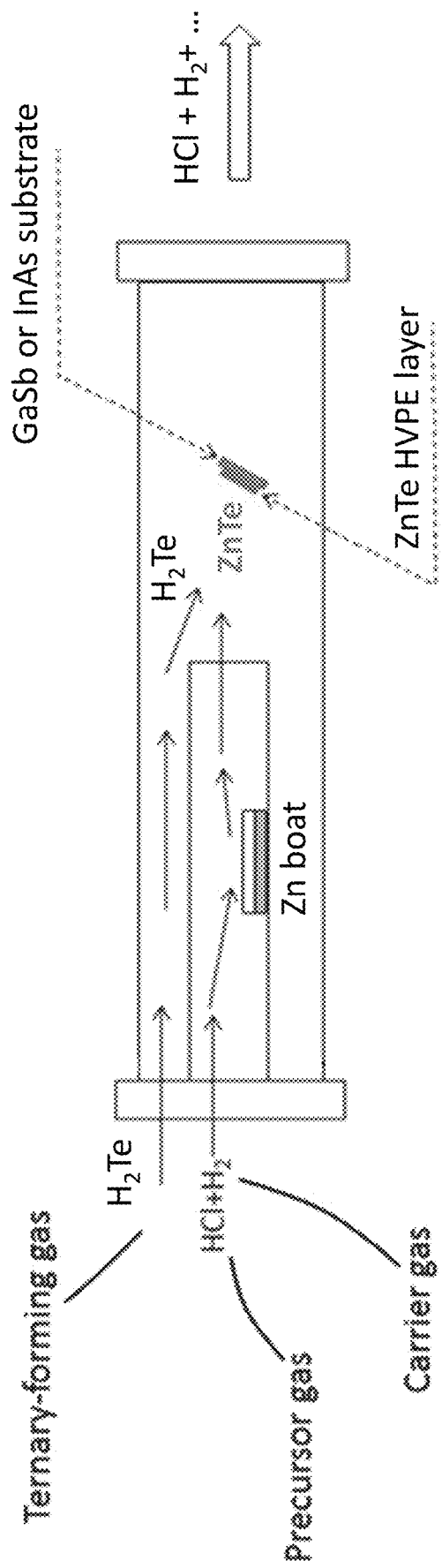
FIG. 10I illustrates a schematic drawing of an HVPE apparatus for optimized thick heteroepitaxial growth of ZnTe on GaSb or InAs substrates with in-situ pre-growth treatment of the GaSb or InAs substrate or template, according to an embodiment of the invention.

As illustrated in FIG. 10I, the related experiments were conducted again in the same hot wall 3-inch diameter horizontal quartz reactor 10 positioned in a three-zone resistive furnace 12. The quartz boat 14 positioned in the first zone 16 was filled with molten zinc (Zn) or with a Zn-rich solution of zinc chloride ($ZnCl_2$). Proposing such alternative source of the II-group element is an attempt to solve the high vapor pressure of Zn, which restricts the duration of growth and thus limits the thickness of the growing ZnTe layer. The quartz boat filled with the II-group element source is, similar to the other growth experiments, placed in one-inch diameter inner tube 18, and a mixture of hydrogen $H_2$ as carrier gas and HCl (the gas that will create the first precursor) is flowed over it. The purpose of the $H_2$ is, as described before, not only to carry the HCl but also to dilute the HCl flow to a desired extent, while the role of the HCl flow is to pick up some zinc (Zn) from the boat 14 to form zinc chloride ($ZnCl_2$). As a recommendation, when Zn-rich $ZnCl_2$ solution is used instead of molten Zn, the $H_2$+HCl mixture shall be more diluted with $H_2$ since this alternative source of Zn already contains some $ZnCl_2$ and only the excess of Zn in this saturated solution must react with the overflowing HCl. Another peripheral growth, which is a mixture $H_2+H_2Te$ is introduced into the reactor 10 to mix with the $ZnCl_2$ in the second reactor zone 20, the "mixing zone", in order for the species in the mixture to react with each other and in surface reactions to form a ZnTe layer on the surface of the substrate 22. In both cases of growth on either GaSb or InSe substrate, the second precursor (the ternary gas) is the same, $H_2Te$. Since the growth is of the same material, ZnTe, no matter the type of the substrate the chemistry of the process is also the same. One probable chemical reaction for forming ZnTe is:

$$Zn+2HCl \rightarrow ZnCl_2+H_2 \rightarrow ZnCl_2+H_2Te \rightarrow ZnTe+2HCl \quad \text{(eq. 9)}$$

The different substrate materials may require different temperatures for pre-growth treatment and growth, depending on the material properties. At the same time, although the substrates are pre-growth treated with the same non-native precursor, $H_2Te$, the formed ternary transition buffer layer shall be different. Thus, in the case of a GaSb substrate, the treatment shall result in the formation of a GaSbTe ternary buffer layer, while in the case of an InAs substrate the treatment shall result in the formation of an InAsTe ternary transition buffer layer.

The advantage of growing ZnTe comes from the fact that ZnTe has the widest and smoothest IR transparency among all known nonlinear optical materials for frequency conversion, which starts conveniently in the visible region and goes all the way down to 20 μm. At the same time, the ZnTe nonlinear d-coefficient is almost as large as the d-coefficient of GaAs. ZnTe, in addition, has one of the lowest two-photon absorption (FIG. 26).

However, there is one important inconvenience that one should take into account when planning to use our approach for growth of ZnTe or other tellurides—the poor availability of $H_2Te$. As most of the hydrides, hydrogen telluride is corrosive, flammable, and poisonous. However, the real reason for its very limited presence on the market is that $H_2Te$ is an unstable gas, which decomposes easily; light facilitates this process. To solve this issue, we propose instead of using $H_2Te$, to produce it in-situ within the reactor volume as a part of the growth process. This approach, i.e. producing in-situ of a needed chemical, which is hard to provide or, which is a subject of serious hazardous limitations, shall be considered as another variation of this disclosure, as far as we believe that it can be applied in other similar complicated cases.

H$_2$Te may be produced in-situ by using several commonly available Te-precursors. The first idea was to use some of the metal-organic tellurium precursors such as dimethyl or diethyl tellurium, which are already used in the MOCVD growth of ZnTe. However, while these metal-organics are relatively expensive, their chemistry is relatively complex. The solution we propose in this disclosure is based on simple chemical compounds which are readily available at a reasonable price, which in this particular case are tellurium tetrachloride (TeCl$_4$), sodium telluride (Na$_2$Te), and N$_2$TeO$_3$. These chemicals, if not exactly environmentally friendly, are at least not strongly poisonous. As hydroscopic materials, we shall protect them from the environment rather than the environment from them. However, most importantly, they can relatively easily produce H$_2$Te under rather ordinary conditions in one the following simple chemical reactions:

TeCl$_4$+3H$_2$→H$_2$Te+4HCl    (eq. 10a)

Na$_2$Te+2HCl→2NaCl+H$_2$Te    (eq. 10b)

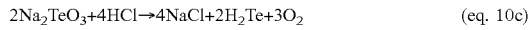

2Na$_2$TeO$_3$+4HCl→4NaCl+2H$_2$Te+3O$_2$    (eq. 10c)

(Note: In contrast to the other two chemicals, the price of Na$_2$Te is relatively high. That is why we may choose to avoid the reaction shown in eq. 10b, although it is relatively simple.)

Some other heteroepitaxial growths of tellurides (not shown schematically but included as favorable cases in FIG. 13) include Ga$_2$Te$_3$/InP (or GaTe/InP), CdTe/InSb, HgTe/InSb, or HgTe/CdTe. Such growths are also favored by the proposed approach by using chemistry similar to the growth of tellurides. In each of these additional cases, while the source of the II or III-group element is different—Ga, Cd, or Hg metal—the source of the VI-group element (the ternary precursor gas) is always the same, H$_2$Te. The most probable chemical reactions for forming these compounds are:

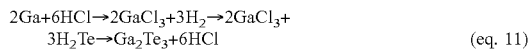

2Ga+6HCl→2GaCl$_3$+3H$_2$→2GaCl$_3$+
3H$_2$Te→Ga$_2$Te$_3$+6HCl    (eq. 11)

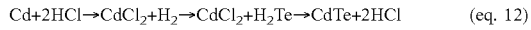

Cd+2HCl→CdCl$_2$+H$_2$→CdCl$_2$+H$_2$Te→CdTe+2HCl    (eq. 12)

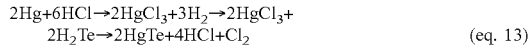

2Hg+6HCl→2HgCl$_3$+3H$_2$→2HgCl$_3$+
2H$_2$Te→2HgTe+4HCl+Cl$_2$    (eq. 13)

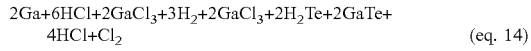

2Ga+6HCl+2GaCl$_3$+3H$_2$+2GaCl$_3$+2H$_2$Te+2GaTe+
4HCl+Cl$_2$    (eq. 14)

However, since the substrate materials are different for each of these cases, each of them will have its own specific composition based on the material properties of the related substrate. Accordingly, the composition of the ternary or quaternary buffer layer formed as a result of the pre-growth treatment in each individual case will be different as well, but will be some combination of 3 or 4 of the elements, Ga, Te, In, P, As, and Sb. On the other hand, the decision as to how reasonable a particular heteroepitaxial growth is may be based on how "common" (i.e. how available and expensive) a given substrate is and how important from practical point of view the growing layer is. This is one of the reasons why one might pay less attention to the opposite growths, including those related to the last four examples.

Some doped substrate materials may be a good solution for the growth of ZnTe substrates (and for other materials, as well). In general, many commercially available substrate materials are undoped (or unintentionally doped), while others are n- or p-doped, even co-doped. The doping may occur during the growth of the crystal boule, when the dopant is distributed relatively uniformly in the entire volume of the material. However, the introduction of the dopant atoms may also be done after the boule is sliced into substrates by using techniques such as ion implantation. In such cases the dopant atoms are introduced only to a small depth in the area near the substrate surface and do not present in the entire substrate volume, which in some cases is enough. While the major role of the doping is, in general, to change the material properties, it may also be used as another way of pretreating the sample prior to growth. This, in another way, may facilitate the process of heteroepitaxy from the point of view of ensuring a smoother transition between the substrate and the growing layer and more efficient relief of the initial stress built at the growing interface due to the lattice and thermal mismatches. This is because the dopant atom, depending on its ionic radius, may change the lattice constant of the substrate material, making it closer to the lattice constant of the growing material. For example, GaSb substrates are offered on the market as undoped and doped substrates, including some heavily doped with Zn. In this case the Zn-rich GaSb:Zn substrates shall match closer to the growing ZnTe layer than a regular undoped GaSb substrate. The degree to which the dopant atom will change the crystal cell of the substrate in the 'right' direction and how much it will contribute to the formation of the ternary transition layer shall be a subject of study in any particular case. Doping or using properly doped (and eventually co-doped) substrates for the following heteroepitaxial growth is another variation of our approach presented in this disclosure.

Some of the cases presented in Example 4 are illustrated in FIG. 10I.

Example 5—Growth of ZnS on GaP and CdS on InP Substrates

Figure 10J:
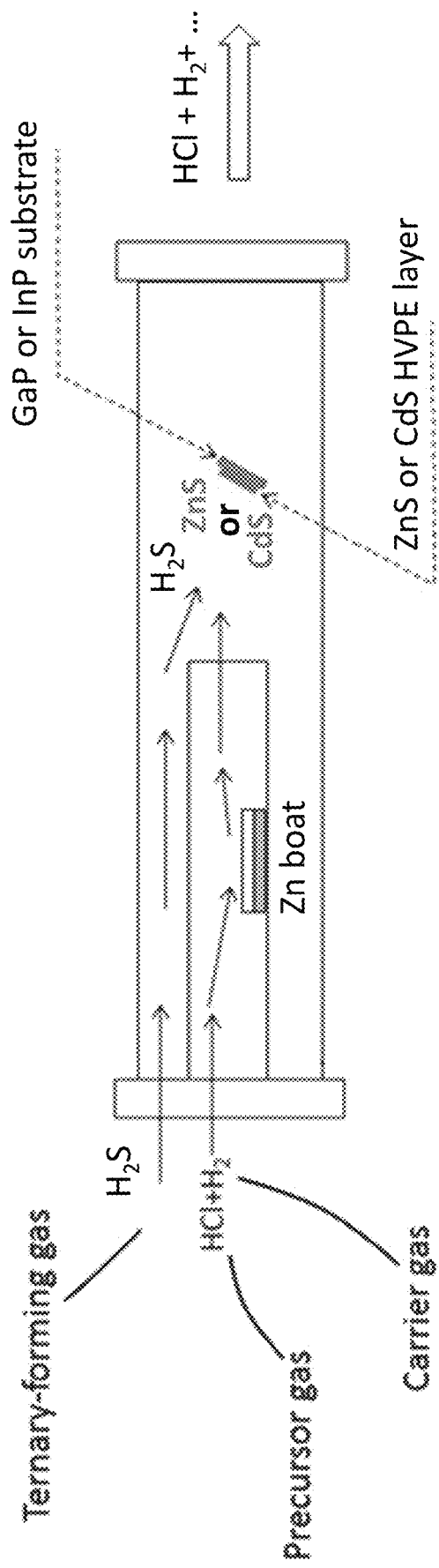
FIG. 10J illustrates a schematic drawing of an HVPE apparatus for optimized thick heteroepitaxial growth of ZnS and CdS with in-situ pre-growth treatment of the GaP or, respectively, the InP substrate or the related templates, according to an embodiment of the invention.

This embodiment (see FIG. 10J) of the invention is based, again, on hydride vapor phase epitaxy (HVPE) and the heteroepitaxial growth of ZnS on GaP substrates and another sulfide, CdS, on another, InP, substrate. In these two separate cases both substrates, GaP and InP, are commercially available with good crystalline quality and at reasonable price for wafers with at least 2-inch diameter. In contrast, the ZnS and CdS substrates available on the market are either polycrystalline (at larger sizes) or, if they are "monocrystalline", they are relatively small samples not large enough for device development (e.g. for fabrication of OP templates), which typically still consist of several domains with different crystallographic orientations. That is why growths of ZnS/GaP and CdS/InP are reasonable, in contrast to the opposite growths, i.e. growths of GaP/ZnS or InP/CdS, although that such growths are also possible due to the small lattice mismatches between these two couples of materias. Whether heteroepitaxy or homoepitaxy is preferred in a particular situation depends on numerous factors such as availability, quality, and price of the related substrates and OP-templates, and the availability of the precursors needed to perform a given growth, etc. Due to these factors, the properties of the grown materials with respect to the pursued applications and the close lattice and thermal mismatches, we believe that such growths are possible and reasonable. As illustrated in FIG. 10J, the related experiments were conducted again in the same hot wall 3-inch diameter horizontal quartz reactor 10 positioned in a three-zone resistive furnace 12. The quartz boat 14 positioned in the first zone 16 was filled with molten zinc (Zn) in case of the growth of ZnS or with molten cadmium (Cd) in case of the growth of CdS. The as described quartz boat filled with the molten II-group element (Zn or Cd), similarly to the other already described growth experiments, is placed in one-inch diameter inner tube 18. Then a mixture of hydrogen $H_2$ as carrier gas and HCl (the gas that will create the first precursor) is flowed over the boat. The purpose of the $H_2$ flow, as it was explained earlier, is not only to carry the HCl gas but also to dilute the HCl flow to a desired extent. The role of the HCl flow is to pick-up some zinc (Zn) in the case of ZnS growth or some cadmium (Cd) in the case of CdS growth from the boat 14 to form either zinc chloride (zinc dichloride $ZnCl_2$, or Zn mono-chloride (ZnCl), or zinc tri-chloride ($ZnC_3$), or their mixture) in the first case (ZnS growth), or cadmium chloride (cadmium dichloride $CdCl_2$, or Cd mono-chloride (CdCl), or cadmium tri-chloride ($CdC_3$), or their mixture) in the second case (CdS growth). Another peripheral growth, which is a $H_2+H_2S$ mixture is introduced into the reactor 10 to mix with the $ZnCl_2$ (or with $CdCl_2$) in the second reactor zone 20, the "mixing zone", in order for the species in the mixture to react with each other and in surface reactions to form a ZnS layer on the surface of the GaP substrate 22 or, respectively, to form CdS layer on the surface of the InP substrate 22. It is worth to mention that FIG. 10J illustrates growths of two different materials, ZnS and CdS, on two different substrate materials, GaP and InP, using two different source of II-group element, molten Zn or molten Cd. However, since both growing materials are sulfides, ZnS and CdS, the ternary precursor gas is one and the same, $H_2S$. This does not mean that the ternary transition buffer layers are the same. On the contrary, due to the different substrates, the ternary buffer layer after the pre-growth treatment of the substrate (GaP) with $H_2S$ shall be from GaPS, while in the second case the pre-growth treatment of the substrate (InP) with $H_2S$ shall be from InPS. The great advantage of using $H_2S$ here, in comparison to the growths of tellurides (e.g. ZnTe), is that in the case of growth of sulfides the ternary gas precursor, $H_2S$, is a well-known, readily available precursor. This allows skipping all steps (similar to those expressed by equations 10a-10c) that had to be taken to produce in-situ $H_2Te$ during the growth of tellurides.

The most likely chemistry for growing ZnS and, respectively, CdS (and some other sulfides), by the approach proposed here may be expressed by the following chemical equations:

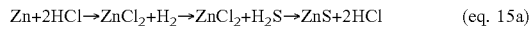
$$Zn+2HCl \rightarrow ZnCl_2+H_2 \rightarrow ZnCl_2+H_2S \rightarrow ZnS+2HCl \quad \text{(eq. 15a)}$$

and, respectively:

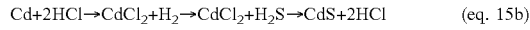
$$Cd+2HCl \rightarrow CdCl_2+H_2 \rightarrow CdCl_2+H_2S \rightarrow CdS+2HCl \quad \text{(eq. 15b)}$$

In some cases, sulfides offer great advantages compared to other nonlinear optical materials. Let us compare, for example, ZnS with ZnTe. Next to the convenience of using one well-known, readily available, and relatively cheap precursor ($H_2S$), ZnS, itself, offers several attractive features, even compared in one direction only—as a nonlinear optical material for frequency conversion devices. The ZnS transparency does not go very far into the infrared than that of ZnTe, but it starts at shorter wavelengths (see FIG. 26). Its nonlinear (d) coefficient at wavelengths of about 1 µm is visibly smaller than that of ZnTe, but it is still comparable to the d-coefficient of ZnSe (compare 20 pm·$V^{-1}$ vs. 27 pm·$V^{-1}$ (see FIG. 26), as well to the nonlinearity of the birefringent lithium niobate ($LiNiO_3$). The highest nonlinear coefficient $d_{33}$ of the later one ($LiNbO_3$) is 25 pm·$V^{-1}$, which corresponds with interactions that are parallel to the Z-axes, which direction is called 0-phase matching direction. Practically, in the direction of patterning, when we call the material "periodically pulled lithium niobate", or PPLN, the effective nonlinear coefficient is even smaller—only 14 pm·$V^{-1}$. Not to mention that the nonlinear coefficient of ZnS is 1-2 orders of magnitude larger that the d-coefficients of a number of traditional birefringent materials, e.g. potassium dihydrogen phosphate (KDP), which d-coefficient is only 2.5 pm·$V^{-1}$, or c-Barium borate (BBO) (2.5 pm·$V^{-1}$), or Lithium Triborate (LBO) (0.85 pm·$V^{-1}$). On the other hand, ZnS has one of the lowest 2PA, about 2-2.1 cm/$G^{-1}·W^{-1}$ at the wavelength of interest (1.06 pm) (see FIG. 26). Actually, among all studied to date nonlinear optical materials for frequency conversion devices, only GaP has lower 2PA than ZnS (see FIG. 26). At the same time, ZnS has the smallest refractive index n, only 2.36, among all of these materials. This, itself, allows the pattern of the OP templates to be with the widest domains, which strongly facilitates the following thick HVPE growth of orientation-patterned ZnS. The line of advantages of ZnS, which has never been investigated thoroughly as a material for frequency conversion (namely, because to date only polycrystalline ZnS is commercially available) may be further extended, for example with the favorable thermal properties of ZnS. Thus, the thermal conductivity of ZnS (see FIG. 26) is 27.2 W·$m^{-1}·K^{-1}$, which is significantly larger than the thermal conductivity of ZnSe, ZnTe, and GaSe, and comparable with the thermal conductivity of the leading material in this field, GaAs. In addition, the thermal expansion coefficient is one of the smallest. All this makes ZnS a preferable candidate for such applications, if it could be grown in monocrystalline quality, most probably, only heteroepitaxially. According to all previous considerations, this is made possible by the approaches provided in this disclosure.

Some of the cases presented in Example 5 are illustrated in FIG. 10J.

Example 6—Growth of Some Other Antimonides Such as GaSb and AlSb on InAs Substrates, and AlSb Also on GaSb Substrates As it was already discussed in Example 4 the opposite to the ZnTe/GaSb growth, i.e. the growth of GaSb on ZnTe is less reasonable due to the commercial absence of large area monocrystalline ZnTe substrates. However, due to the small lattice mismatch of GaSb with InAs (+0.620%) and the availability of InAs substrates GaSb may be easily grown by the disclosed technique on available InAs substrates, although GaSb substrates are available at about the same price and quality. However, there are a number of other reasons to prefer hetero—before homoepitaxy. An example is the case where the device development requires a structure combining two or more materials with different bandgap energies. For the same reason the more exotic material AlSb (relatively small lattice mismatch of +1.273%) may also be grown on InAs substrates, although the lattice mismatch of AlSb with GaSb is smaller (+0.650%) and that is why the growth of AlSb shall be more favorable on GaSb than on InAs substrates.

Figure 10K:
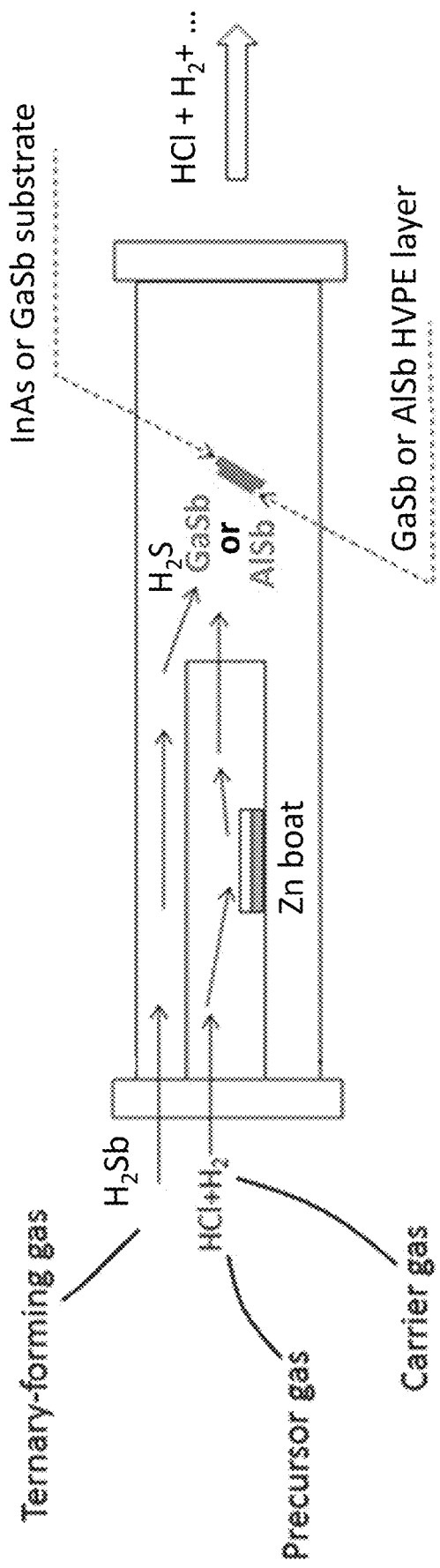
FIG. 10K illustrates a schematic drawing of an HVPE apparatus for optimized thick heteroepitaxial growth of GaSb and AlSb on InAs substrates and AlSb on GaSb substrates with in-situ pre-growth treatment of the InAs or, respectively, the GaSb substrate or the related templates, according to an embodiment of the invention.

This embodiment (see FIG. 10K) of the invention is based, again, on HVPE and the heteroepitaxial growth of GaSb and AlSb on InAs substrates and AlSb on GaSb substrates. As illustrated in FIG. 10K, the related experiments were conducted again in the same hot wall 3-inch diameter horizontal quartz reactor 10 positioned in a three-zone resistive furnace 12. The quartz boat 14 positioned in the first zone 16 was filled with molten gallium (Ga) in case of the growth of GaSb or with molten aluminum (Al) in case of the growth of AlSb. The quartz boat filled with the molten III-group element (Ga or Al), similarly to the other growth experiments, is placed in one-inch diameter inner tube 18, Then a mixture of hydrogen $H_2$ as carrier gas and HCl (the gas that will create the first precursor) is flowed over the boat. The purpose of the $H_2$ flow, as it was explained earlier, is not only to carry the HCl gas but also to dilute the HCl flow to a desired extent. Respectively, the role of the HCl flow is to pick up some Ga in the case of GaSb growth or some Al in the case of AlSb growth from the boat 14 to form either gallium chloride (gallium dichloride $GaCl_2$, or gallium mono-chloride (GaCl), or gallium tri-chloride ($GaCl_3$), or their mixture) in the first case (GaSb growth), or aluminum chloride (aluminum dichloride $AlCl_2$, or aluminum mono-chloride (AlCl), or aluminum tri-chloride ($AlCl_3$), or their mixture) in the second case (AlSb growth). Another peripheral growth, is when a $H_2+SbH_3$ mixture is introduced into the reactor 10 to mix with the $GaCl_3$ (or with $AlCl_3$) in the second reactor zone 20, the "mixing zone", in order the species in the mixture to react with each other and, hopefully, in surface reactions to form a GaSb layer or an AlSb layer on the surface of the InAs substrate 22 or, respectively, to form the AlSb layer on the surface of the GaSb substrate 22. The growth on the same substrate (InAs) in the first two cases (growth of GaSb or AlSb) does not mean that the ternary transition buffer layers are the same because the source of the III-group element is different, Ga or Al. Thus, the ternary transition buffer layer in the first case is expected to be from InGaAs, while in the second shall be from InAlAs. Similarly, although that in the second and the third case (growths of AlSb/InAs and AlSb/GaSb) we grow the same material (AlSb) using the same III-group element (Al), the ternary layers shall be again different because we are using different substrate materials. Thus, when the substrate is InAs the ternary transition layer shall be from InAlAs, while when the substrate is GaSb the ternary transition layer shall be from GaAlSb. Since in all these cases we are growing antimonides, the second precursor source, the ternary gas, should be $SbH_3$. The suggested chemistry for these three cases are expressed by the following chemical equations:

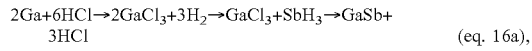
(eq. 16a), for the case of the GaSb growth, and:

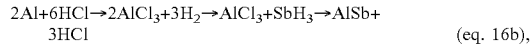
(eq. 16b), for the case of the AlSb growths.

Since AlSb is a material that is more exotic, and large area monocrystalline AlSb substrates are unavailable, the opposite growth of GaSb on AlSb is less reasonable (if not impossible at all), but the opposite growth of InAs on GaSb is as reasonable as the GaSb/InAs growth. Moreover, in this case the sign of the lattice mismatch is negative, which means that the GaSb layer grows under tensile strain, which according to some studies is a more favorable case than those grown under compressive strain (positive lattice mismatch). In this case, the source of the III-group element is Ga, while the second precursor, the ternary gas, is $SbH_3$, which during the pre-growth treatment of the InAs substrate shall form an intermediate InGaAs ternary buffer layer. The probable chemical reaction for this growth is:

(eq. 16c)

Some of the cases presented in Example 6 are illustrated in FIG. 10K.

Example 7—Growth of AlAs on GaAs Substrates

The growth of AlAs on GaAs is an illustrative example of the usefulness of the approach proposed in this disclosure. First, AlAs substrates are not available, which comes with two conclusions. First, heteroepitaxy is the only way to grow AlAs layers and, second, the opposite growth, i.e. GaAs/AlAs is unreasonable and, in general, impossible. The growth of AlAs on GaAs is highly reasonable for the following reasons: First, the relatively small lattice mismatch (+0.127%) between AlAs and GaAs. Second, as a substrate material GaAs is almost as common as Si, i.e. it is widely available, with high quality and with relatively low cost. Third, OP-GaAs templates with high quality are readily available, which means that growth of OP-AlAs may also be immediately attempted. Fourth, the band gap of AlAs is larger (different) than the bandgap of GaAs. Fifth, it is known that oxygen is the most common and least desirable impurity in Al-containing semiconductor materials. By using metal aluminum, which has the highest possible purity (much higher than the purity of any other Al-precursor) and by pre-making in-situ the first precursor (aluminum chloride) within the reactor chamber, the proposed approach ensures the lowest possible oxygen levels in growing AlAs.

Figure 10L:
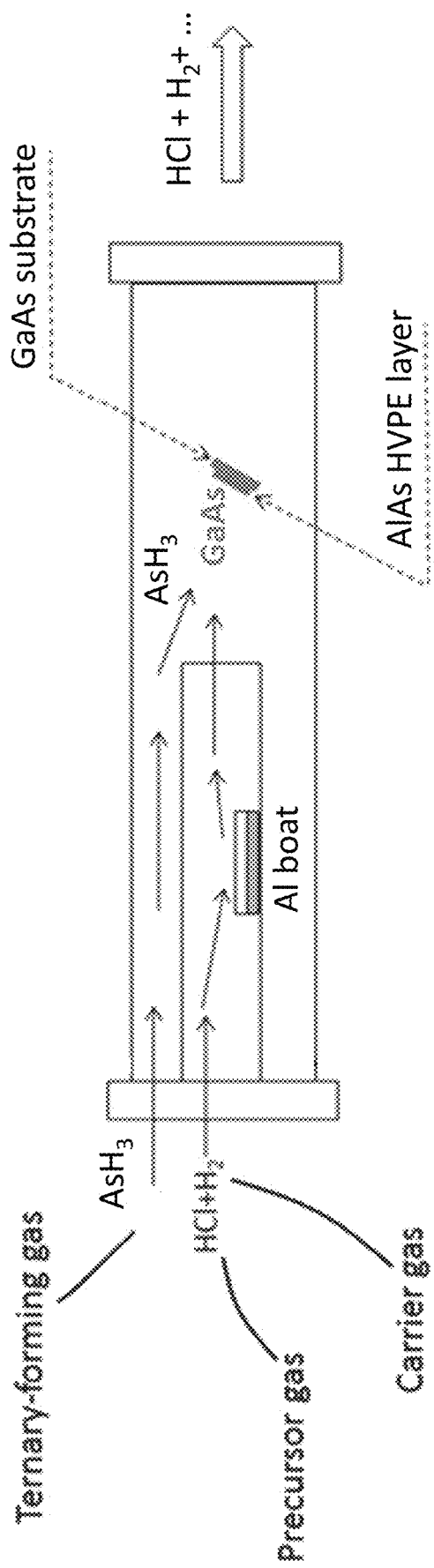
FIG. 10L illustrates a schematic drawing of an HVPE apparatus for optimized thick heteroepitaxial growth of AlAs on GaAs with in-situ pre-growth treatment of the GaAs substrate or the OP-GaAs template, according to an embodiment of the invention.

This embodiment (see FIG. 10L) of the invention is based, again, on hydride vapor phase epitaxy (HVPE) and the heteroepitaxial growth of AlAs on GaAs substrates and, eventually, OP-AlAs on OP-GaAs templates. As illustrated in FIG. 10L, the related experiments were conducted again in the same hot wall 3-inch diameter horizontal quartz reactor 10 positioned in a three-zone resistive furnace 12. The quartz boat 14 positioned in the first zone 16 was filled with molten aluminum (Al) and placed in one-inch diameter inner tube 18, Then a mixture of hydrogen $H_2$ as carrier gas and HCl (the gas that will create the first precursor) is flowed over the boat. The purpose of the $H_2$ flow, as it was explained earlier, is not only to carry the HCl gas but also to dilute the HCl flow to a desired extent. Respectively, the role of the HCl flow is to pick up some aluminum (Al) from the boat 14 to form aluminum chloride (aluminum dichloride $AlCl_2$, or aluminum mono-chloride (AlCl), or aluminum tri-chloride ($AlCl_3$), or their mixture). Another peripheral growth, which is a $H_2+AsH_3$ mixture is introduced into the reactor 10 to mix with the $AlCl_3$ in the second reactor zone 20, the "mixing zone", in order the species in the mixture to react with each other and in surface reactions to form a AlAs layer on the surface of the GaAs substrate 22. In this case, the GaAs substrate is kept in the flow of its native precursor $AsH_3$, which will protect the substrate from thermal decomposition but will not initiate the formation of an intermediate AlGaAs transition buffer layer. This means that the pre-growth substrate treatment should be modified. For example, the growth may start with the deposition of a low temperature buffer AlGaAs buffer layer. For the purpose another source of molten Ga (in another quartz boat) should be temporary introduced in the reactor and positioned in the small one-inch diameter inner tube 18 in order also to be flown by the HCL flow to form also gallium chloride. This Ga source could be kept open even during the initial stage of the growth but after that it should be removed or closed. Another, technically easier option, is to supply the process with Ga through another outside source as a bubbler with a gallium metal organic precursor such as TMG (tri-metal gallium). This is another variation of our approach. The suggested chemistry of formation of the AlGaAs ternary buffer layer and the following HVPE growth of the AlAs layer on the GaAs substrate is expressed by the next equations:

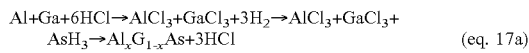
$$Al+Ga+6HCl \rightarrow AlCl_3+GaCl_3+3H_2 \rightarrow AlCl_3+GaCl_3+AsH_3 \rightarrow Al_xGa_{1-x}As+3HCl \quad (eq.\ 17a)$$

for the AlGaAs ternary layer formation, and:

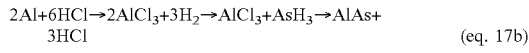
$$2Al+6HCl \rightarrow 2AlCl_3+3H_2 \rightarrow AlCl_3+AsH_3 \rightarrow AlAs+3HCl \quad (eq.\ 17b)$$

for the HVPE growing AlAs layer.

Some of the cases presented in Example 7 are illustrated in FIG. 10L.

Example 8—Growth of Multilayered Structures

The disclosed method has another advantage—it may be used for the growth of multilayer structures in pursuing different applications. For example, growth may start on a GaAs substrate pretreated with $PH_3$ followed by the growth of a GaP layer. In the next step, the grown GaP is pretreated with $H_2S$ followed by the growth of ZnS taking advantage from the small negative lattice mismatches between GaP and ZnS (−0.57%). Thus we could have in one structure three layers (ZnS/GaP/GaAs) with increasing bandgap energies (see FIG. 26) −1.42 eV (GaAs), 2.26 eV (GaP), and 3.54 eV (ZnS), which could find numerous practical applications. In this case, the reactor configuration should have more than one inner tubes (in this case two) with more than one sources of III or II group elements (in this case a boat with molten Ga and a boat with molten Zn). Respectively, there is a need for more than one (in this case two) parallel lines for supplying more than one ternary gases (in this case $PH_3$ and $H_2S$).

Another example is the growth of a ZnSe/GaAs/GaP/Se multilayered structure. In this case, after the deposition of GaP on a Si substrate, the as grown GaP layer shall be pretreated in $AsH_3$. After the deposition of a GaAs layer on the GaP layer, as a next step the as grown GaAs layer shall be pretreated in the flow of $H_2Se$ after which to continue with the ZnSe/GaAs growth.

These examples are only two of many other options for growth of multilayered structures for various practical applications. Growth of multilayered structures by using the approached provided in the text is another variation of the disclosure proposed here. For simplicity, the examples provided within the text of Example 8 are not illustrated on separate figures.

Example 9: Growths after Prior Growth (In-Situ or Non-In-Situ) Treatment of the Substrate with a Non-Native Material that is Also Non-Related to the Substrate or the Layer Material Precursor It was discovered that in some heteroepitaxial cases that the non-native precursor typically associated with the growing material has less impact on the foreign substrate than another not related to the growing material non-native precursor. For example, while $PH_3$ has almost no effect on the surface of a Si wafer exposed prior to the intended direct HVPE heteroepitaxy of GaP on Si, the exposure of a (100) Si wafer with 4° miscut to $H_2Se$ is visibly attacked by this non-native (to Si) material, which is also not related to the GaP layer precursor (see FIG. 24). That is why, maybe, direct HVPE growth of GaP on Si was not very successful. However, the Si substrate etched by $H_2Se$ provides more sites for the approaching phosphorus or gallium atoms to adhere (realizing a direct GaP growth) or, if the Si-surface is saturated enough with Se-atoms, this may be used for the formation of an initial SiGaSe buffer layer, which gradually may be converted into a GaSe buffer layer. This could be a gentle prelude to the subsequent growth of GaP, which closely matches the GaSe buffer layer GaP.

Si is, in general, inert to acids, except hydrofluoric acid (HF), which is the aqueous solution of the gas $H_2F$. HF has the unique ability to react with the naturally formed thin silicon oxide ($SiO_2$) layer (called also silica) when the material is even briefly exposed to air or water. HF forms with $SiO_2$ a hydrogen terminated layer of Si-H bonds in the reaction:

$$SiO_2+4HF \rightarrow +SiF_4+2H_2O \quad (eq.\ 18)$$

The hydrogen from this top surface layer may be used to form bonds with other chemical elements by treating the surface with other precursors, for example with $H_2Se$ or $PH_3$. If the surface is, however, saturated with fluorine (F) atoms through the formation of $SiF_4$ (see eq.18) such a treated Si-surface may be used for the growth of some fluorides, e.g. $CaF_2$ or $BaF_2$, which are also excellent optical materials. The pre-growth treatment in this case may be done before introducing the Si substrate in the reactor chamber in HF by following some standard or optimized procedures for treating Si in HF. The pre-growth treatment of the Si substrate may also be done in-situ within the reactor chamber by exposing the Si-wafer to HF gas flow. This option—pre-growth treatment of the substrate in a suitable solution before introducing it into the reactor chamber is another variation of our approach along with the aforementioned "in-situ" pre-growth treatment of the substrate in a non-native related or not related to the layer material precursor.

The preliminary deposition of a thin buffer transition layer from the same layer material by a different, typically, far-from-equilibrium growth technique, such as MOCVD or MBE, that was already described in the text could be accepted as another alternative variation of a pre (HVPE) growth treatment of the substrate, For simplicity, the examples provided within the text of Example 9 are not illustrated in separate figures.

Example 10—Growths of Nonlinear Optical and Other Single or Compound Semiconductor Materials on Halides To this point the heteroepitaxy examples provided were related mostly to either some well known As, P, or Sb-based semiconductor materials, e.g. GaAs, GaP, GaSb, etc., which may possess optical nonlinearity, or similar chalcogenide materials, i.e. materials containing S, Se, or Te, e.g. GaSe, ZnS, ZnTe, etc. However, there are still many other areas and different kinds of materials to match where heteroepitaxy can be a great help. Such materials are, for instance, the halides, i.e. materials that contain F, Cl, Br, or I. Examples for using halides as substrates are two well-known optical materials with a broad range of transparency that starts in the ultraviolet (UV) range and continues all the way to the mid- and long-wave IR (see FIG. 26), $CaF_2$, and $BaF_2$. These materials, by having inversion symmetry—a case when the first non-zero nonlinear optical coefficient is the third order coefficient, do not provide the option for frequency conversion by quasi-phase matching, which is a second order nonlinear optical phenomenon. However, due to their close match with some of the other nonlinear optical materials, they still may be used as their non-native substrates. Moreover, having similar structures, they still may be used for the fabrication of orientation patterned templates, which may be facilitated by the fact that they are softer materials (3 and 4 by Mohs scale) compared to 4.5 for GaAs and 5 for GaP), which are more vulnerable to some etchants that will not damage the grown material. For example GaP and GaAs may be grown on plain $CaF_2$ (negative lattice mismatches of −0.21% and +3.50%, respectively), or on the eventually fabricated OP-$CaF_2$ templates. In these two cases, the related (already explained in the text) substrate pre-growth treatment procedures and chemistry paths for the growth of phosphides and arsenides (see equations 4) shall be applied. The opposite growth, i.e. growth of $CaF_2$ (traditional optical material) on a common electronic material, Si (lattice mismatch of +0.57%) for optoelectronic applications shall be also considered as favorable. In the case of $BaF_2$, there are also several good matching options such as AlSb (−0.98% lattice mismatch), GaSb (−1.61% lattice mismatch), InAs, CdSe, etc. In each of these individual cases, the nature of the pursued application and which of the materials is more common (i.e. cheaper and more available) shall be the criteria of which material should be the substrate and which should be the growing layer. For simplicity, the examples provided within the text of Example 10 are not illustrated in separate figures.

Example 11—Growths of Non-Ferroelectric Materials on Ferroelectric Substrates (GaP/$LiNbO_3$) and OP Templates (OP-$LiNbO_3$)

This example of the growth of a non-ferroelectric material (GaP) on a substrate or an OP template from a ferroelectric material ($LiNbO_3$) is, at the same, time an example of the growth of a material with one crystal symmetry (cubic) on another material with a different crystal symmetry (trigonal). Furthermore, this is also an example for the growth of a traditional III-V semiconductor material (GaP) on a traditional oxide material ($LiNbO_3$).

Although the in-plane (a-plane) lattice mismatch between GaP and $LiNbO_3$ is relatively large (+5.87%), there are good reasons for choosing such combinations, among which is the extremely easy way for in-situ preparation of ferroelectric OP materials by growing them in a periodically alternating electrical field. Such periodically polled Lithium Niobate (PPLN) may be easily grown from melt by the conventional CZ growth technique and eventually sliced into OP-$LiNbO_3$ templates. As a following step, thick HVPE growth of GaP is performed on these templates using the aforementioned chemistry for the growth of phosphides (see equations 4). The unfavorable growth of GaP on the large matching $LiNbO_3$ may be dramatically facilitated by the growth of either an intermediate transition buffer layer or by a thin GaP layer on the $LiNbO_3$ substrates (respectively, the OP-$LiNbO_3$ templates). In the latter case, the deposition shall be performed by a far-from-equilibrium growth technique, such as MOCVD or MBE. The reason for this is that these techniques have demonstrated in practice that, although they are favorably less sensitive to the lattice mismatch, they can still transfer the polarity of the material underneath unchanged.

All of these examples of growth of one material on a substrate with different crystal symmetries, or the growth of a non-ferroelectric material on a ferroelectric substrate or template, or the growth of a semiconductor material on an oxide material, are variations of the method disclosed herein. Another variation is the HVPE growth of a thick layer on a thin layer (from the same or from a different material) deposited in advance on the substrate or on the template by a process that is less sensitive to lattice mismatch, such as a far-from-equilibrium growth process, e.g. MOCVD or MBE.

For simplicity, the examples provided within the text of Example 11 are not illustrated in separate figures. It should be also clear that by illustrating these examples with only one particular pair of materials, i.e. GaP and $LiNbO_3$, we do not put any limitations to other suitable materials that may be suggested in each of the above particular cases. GaN, for example, is another material where the fabrication of OP templates is easy, due to the great deal of effort dedicated to polarity control in III-Nitrides. This makes GaN and, in general, the III-Nitrides candidates as substrates or templates for heteroepitaxy in cases similar to these provided in example 11.

Some Basic Crystal Growth Considerations

Without being bound by theory, during heteroepitaxy the relation between the forces that keep the atoms of the substrate in place and the atoms of the growing layer, $\psi_{AA}$ and $\psi_{BB}$ from one side and the interfacial force $\psi_{AB}$ from the other side, is important. Thus, in the case when $\psi_{AB} \gg \psi_{BB}$ and $\psi_{AB} \cong \psi_{AA}$ the interfacial force $\psi_{AB}$ is strong enough to produce pseudomorphous growth. As a result, during pseudomorphous growth the lattice of the growing crystal B (e.g. GaP) will be, initially, homogeneously strained to fit to the lattice of the substrate crystal A (e.g. GaAs), which occurs at the expense of a linearly-increasing elastic strain. This, depending reciprocally on how large the lattice mismatch is, may typically continue to the deposition of no more than about 10-15 monoatomic layers. After this critical thickness $h_c$ (the thickness of the pseudomorphous growth), according to the misfit dislocation (MDs) concept, the pseudomorphous growth will become energetically unfavorable and the homogeneous strain will be released in the formation (in the ideal case) of MDs with a periodicity $\tau$ that should depend on the difference between the two lattice constants $a_0$-$b_0$. (Note: Interfacial force, $\psi_{AB}$, is the force across the interface between two faces that keep them together.)

Figure 11:
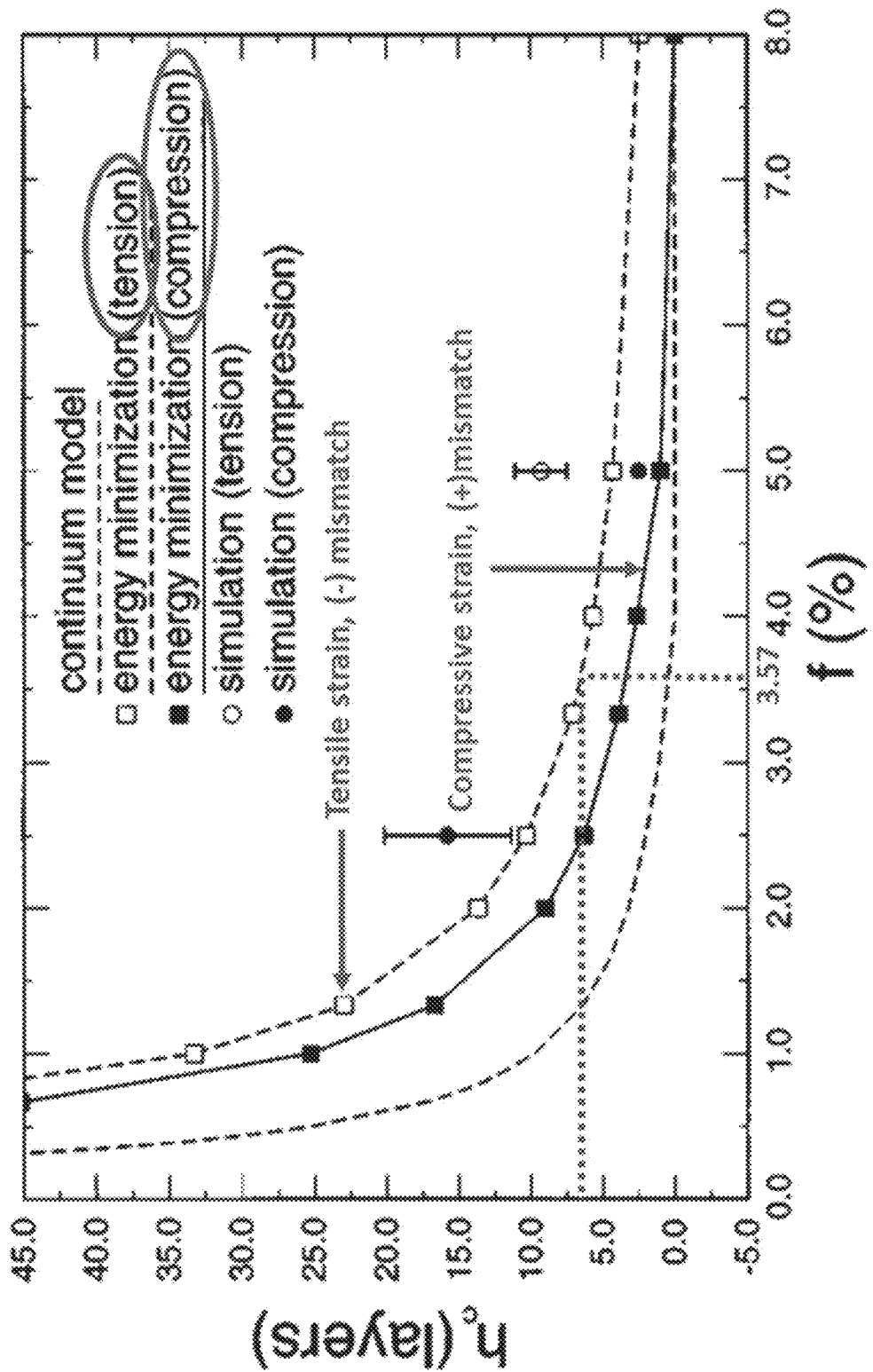
FIG. 11 depicts the thickness of the pseudomorphous growth (the critical thickness h$_c$) expressed as the number of monoatomic layers as a function of the lattice mismatch f.

The critical thickness $h_c$ is, in general, larger when the lattice mismatch in a particular heteroepitaxial case is smaller, i.e. for different cases $h_c$ increases with the decrease of the lattice mismatch. However, the critical thickness does not depend linearly on the linearly increasing elastic strain. Many other factors, such as the sign of the lattice mismatch, the mechanisms of MD formation or other alternative mechanisms of strain relief, etc., must be considered in order to predict this thickness. Most of these factors have been incorporated into several models related to the particular case of stress relaxation that occurs through misfit dislocation nucleation. Thus, taking into account the sign and the degree of the lattice mismatch between GaP and GaAs (−3.57%)(See eq. 1) and the periodicity $\tau$ of the MDs (∼28 interatomic distances) (see eq. 2), it was attempted, theoretically to determine the expected thickness of the pseudomorphous growth $h_c$ in this particular case of GaP/GaAs growth (see FIG. 11). FIG. 11 illustrates the critical thickness $h_c$ as a function of the misfit f. There, the upper dashed curve with the open squares is obtained by energy minimization with a continuum model (the lower dashed curve) and is correlated to a negative (tensile) misfit. The solid curve with the solid squares is obtained by minimization of the atomistic model for positive (compressive) misfit. The two solid circles are the MD simulation results for positive (compressive) misfit of f=+2.5% and f=+5.0%, while the open circle is the simulation result for f=−5.0% negative (tensile) misfit. (Note: that the error bar for the +5.0 compressive misfit is smaller than the size of the solid circle symbol and that is why does not appear in the figure.) The red dashed lines perpendicular to the f-axis and $h_c$-axis in FIG. 11 show the case of GaP/GaAs growth at a negative misfit of −3.57%. Thus, one can easily see that at the negative misfit of −3.57%, when the GaP grows tensile-strained on the GaAs substrate, the critical thickness must be in the range of 5-10 monoatomic layers after which theoretically the MDs shall start to appear with a periodicity τ (according to eq. 2) of about 28 monoatomic distances. After such a rough estimation, we tried to determine experimentally $h_c$ and τ using high magnification TEM cross sectional images of areas near the interface between the GaAs substrate and the HVPE grown GaP layer (see FIG. 12) by looking for interruptions in the regular lines of atoms parallel and perpendicular to the interface.

Figures 12A, 12B, 12C, 12D:
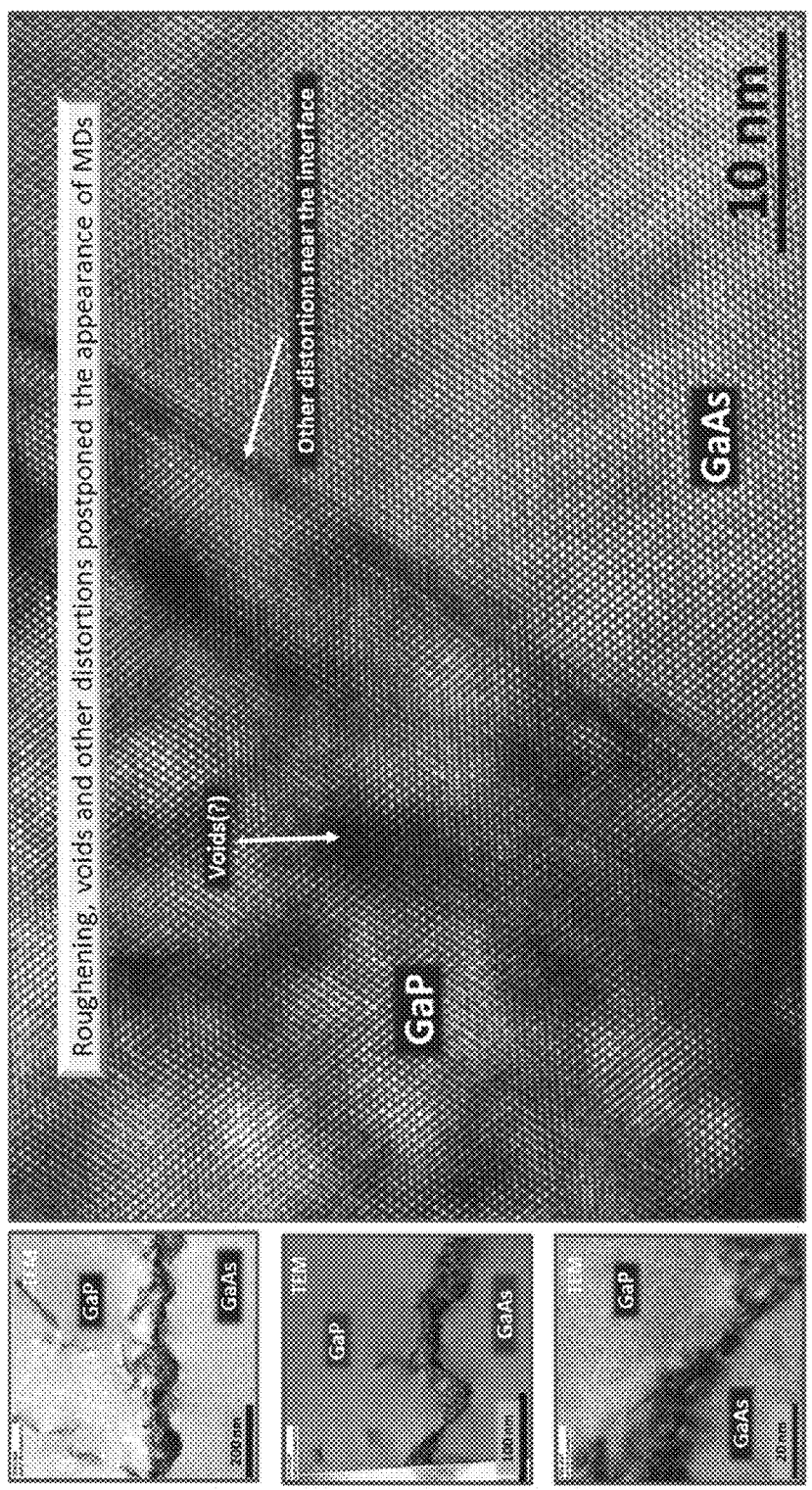
FIGS. 12A-12C depict TEM cross sectional images with increasing magnification showing rough surface interface between the growing GaP layer and the GaAs substrate.
FIG. 12D depicts that compositional variations and distortions of different kind, such as creating of voids or roughening of surfaces near the interface make difficult to determine the thickness of the pseudomorphous growth h$_c$ and the periodicity T of the MDs.
Figure 14E:
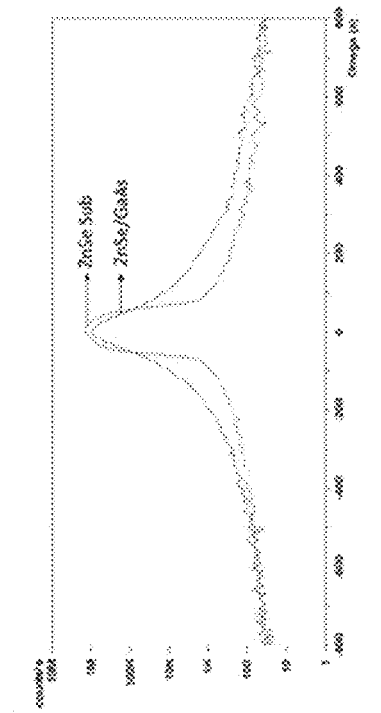
FIGS. 14A-14F depict SEM images of heteroepitaxial growth of ZnSe on plain GaAs substrates as (FIG. 14A) is a cross sectional image, and (FIG. 14B) is a top surface image. These images are compared to SEM images of homoepitaxial growth of ZnSe on a ZnSe substrate as (FIG. 14C) is cross section image, and (FIG. 14D) is a top surface image.
Figure 14B:
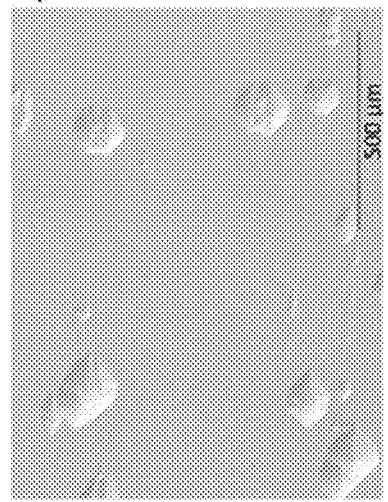
Figure 14A:
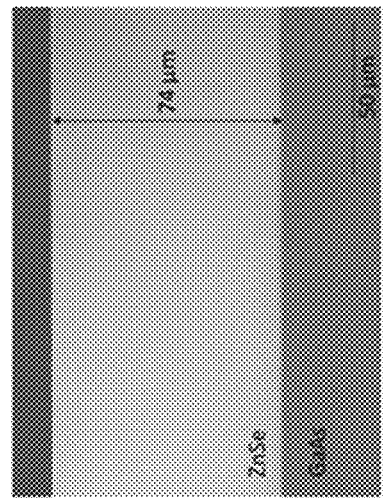
Figure 14F:
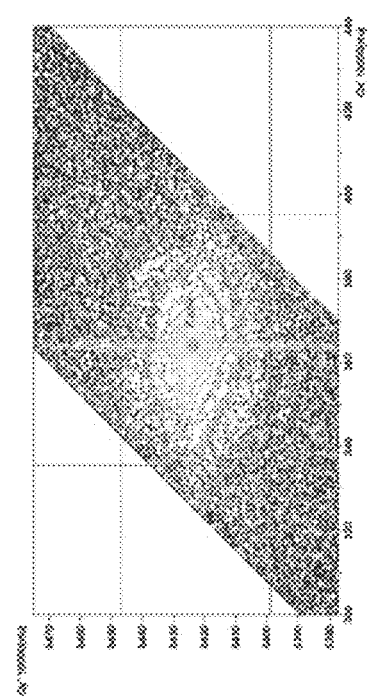
Figure 14D:
Figure 14C:
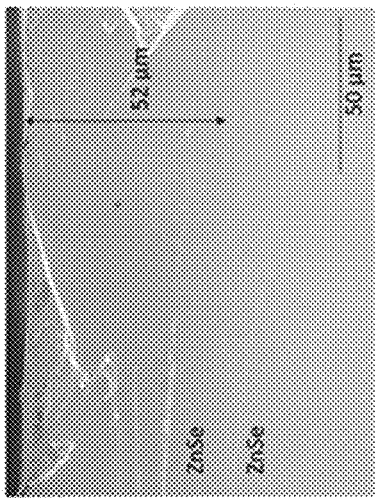

When searching for the appearance of MDs, however, one should bear in mind that all theoretical works and simulations (such as those graphically expressed in FIG. 11) assume a flat interface and, typically, predict smaller critical thicknesses than those determined in experimental studies. There is also a possibility, described in the literature, that the strain that is due to the lattice mismatch may also be accommodated by 90° MDs that are parallel to the interface, rendering them invisible on the provided cross sectional TEM images. In addition, in contrast to the relatively slow growth processes such as MOCVD or MBE, the faster HVPE growth may "seek" for faster alternative strain relief mechanisms that may postpone or even entirely replace the formation of MDs. Such, as was determined in the case of GaP/GaAs (see FIG. 12), are roughening of surfaces—having in mind the top layer surface or the interface—or formation of voids (which is actually the forming of new surfaces) above which, as it was once reported, the strain is lower. Other types of compositional variations near the interface, indicated by the contrast fluctuations shown by the arrows in FIG. 12D, are also possible. As for the case of growth of ZnSe on GaAs substrates, as FIGS. 15A-15B indicate, the strain relaxation, again, proceeds through the formation of stacking faults, which originate from the GaAs substrate (FIGS. 15A-15B) rather than through the formation of MDs. Another possibility is that the interfacial force $\omega_{AB}$ is just not strong enough to produce pseudomorphous growth, or that the P atoms replacing some of the As atoms in the GaAs crystal cell (forming GaAsP) diminish the need for a pseudomorphous growth. All this means that each particular heteroepitaxial case and each used growth approach may have its own specificity in relieving the strain built in as a result of lattice and thermal mismatches between substrate and growing layer.

Characterizations

Each pretreated or grown sample was characterized with regard to its surface morphology and crystalline and optical quality by at least several of the following characterization techniques: cross section and top layer surface Nomarski optical imaging, x-ray diffraction (XRD), scanning electron microscopy (SEM), atomic force microscopy (AFM), tunnel electron microscopy (TEM), electron dispersion spectroscopy (EDS), optical transmission, and linear and nonlinear optical absorption. Each of these material characterizations was performed in order to reveal the mechanisms of the formation of defects near the interface between the substrate and the growing layer, and also how these defects propagate in the layer and how they impact the final layer quality, taking into account the impact of the applied pretreatment conditions and the applied growth parameters during the growth stage.

Characterizations related to the surface morphology, the crystalline layer quality, and other electrical and optical parameters related to some specific practical applications were used also as a feedback to the growth process that allowed the determination of the optimal parameters for pretreating and growth, e.g. substrate and mixing zone temperatures and the rates of their increase or decrease, reactor pressure, V-III ratios, gas flow regimes, etc., for a number of different material cases.

From the dark field TEM images of GaP grown on GaAs sample (see FIG. 2B) it was confirmed that, as it was predicted (see FIG. 2A), the biaxial strain a during growth of GaP/GaAs may be resolved into a uniaxial shear stress τ on the (111) dislocation glide plane. As a result, edge, screw, and mixed dislocations do appear along the (111) zone; as in the case of a Burger vector G=00$\bar{2}$ both edge and mix dislocations are observed, while in the case of G=002 screw and mix dislocations are observable (see FIG. 2B). The good news is that after the first 1-2 μm of growth, which are highly populated with dislocations, the dislocation density starts to noticeably decrease with layer thickness. Thus, as our cross section linear transmission measurements indicated, in the next couple of hundreds of microns the material demonstrates good IR transparency, which is the first precondition for using these materials for frequency conversion applications. Finally, the growing layer is terminated by a smooth top surface morphology with an average roughness RMS<1 nm for a 1 μm² AFM scanning spot. Such a self-healing effect was noticed during the HVPE growth of many other materials too, for example, in the case of HVPE grown GaN. This decrease of the dislocation density with the increase of the layer thickness is usually associated with the increase of the probability of two opposite treading dislocations that appear at the interface to fall within their interaction cutoff, eventually, annihilating each other.

Our measurements indicate that we have determined good control parameters for engineering the transition buffer layer, particularly with regard to its thickness, composition, and quality, which allows a smooth transition between two mismatched materials.

Figure 20B:
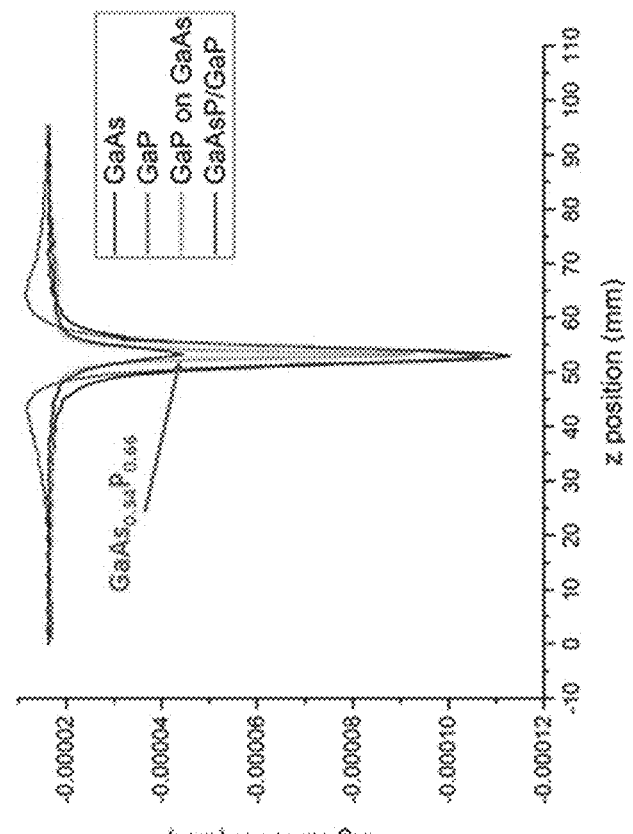
FIGS. 20A-20B depict Linear IR transmission of GaAs$_x$P$_{1-x}$ ternaries with two different compositions compared to the linear IR transmission of the parenting, GaAs and GaP materials (FIG. 20A); Nonlinear Z-scan showing that the GaAs$_{0.34}$P$_{0.36}$ ternary exhibits a lower linearity than the parenting materials, GaAs and GaP (FIG. 20B).
Figure 20A:
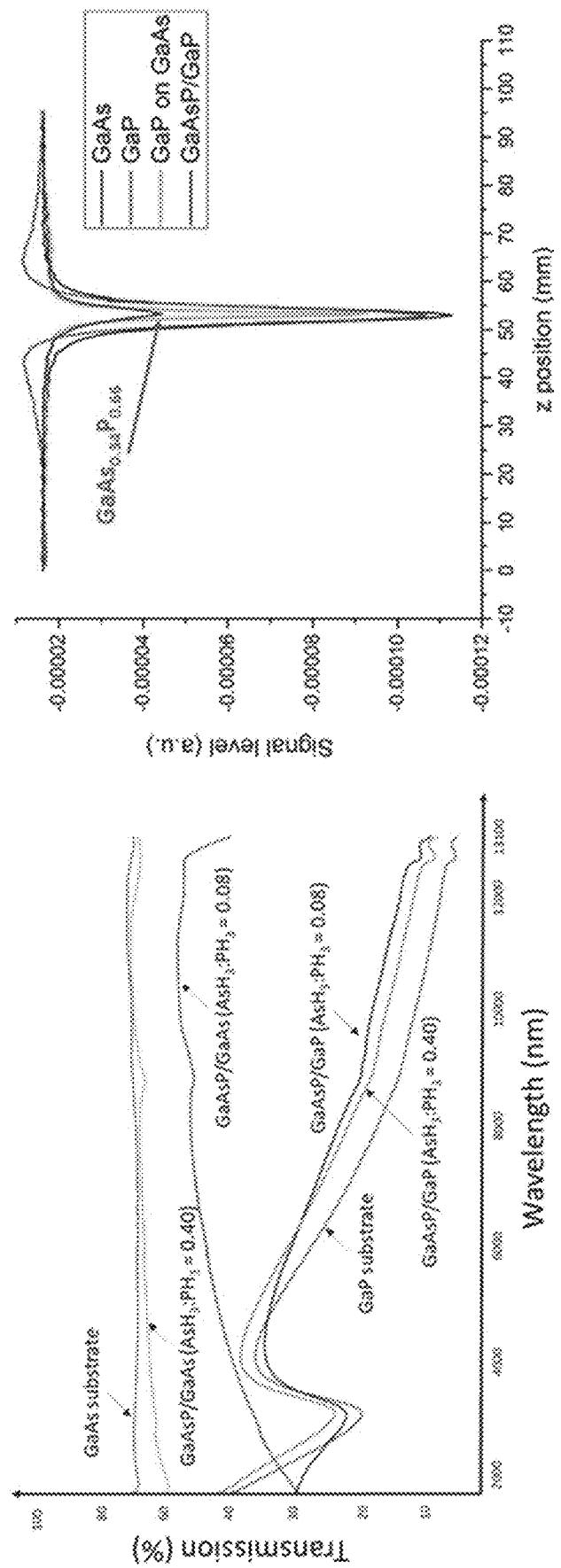

For example, we demonstrated that by extending the idea of the transition buffer layer to the growth of a thick ternary layer, we were able to achieve hundreds of microns thick layer of $GaAs_xP_{1-x}$ with a changing composition. In a particular series of experiments we grew 300-700 pm thick $GaAs_xP_{1-x}$ with compositions within the range of x=0.1-0.91 as the growth on plain (GaAs) substrates (FIGS. 19A-19B), which were intended for linear and nonlinear optical measurements (linear absorption and transmission, 2PA and nonlinear susceptibility) (FIGS. 20A-20B), while the growths on orientation-patterned (OP-GaAs) templates (FIGS. 21A-21F) were dedicated to demonstrating ternaries in frequency conversion and device development. Examples of typical ternary compositions are $GaAs_{0.34}P_{0.66}$ and $GaAs_{0.61}P_{0.39}$. $GaAs_xP_{1-x}$ ternaries are attractive due to the possibility of combining in one material having the higher nonlinear susceptibility of GaAs with the lower 2PA of GaP (FIGS. 20A-20B), meaning a material with a higher nonlinear susceptibility than GaP but a lower 2PA than GaAs. Shifting the edge of the strong 2PA from 1.7 pm (in GaAs) towards the shorter wavelengths (under 1.55 μm in $GaAs_xP_{1-x}$) is also attractive because it brings the advantage of using readily available pump sources at 1.55 μm and under, which are currently used in the telecommunication industry.

Figures 22A, 22B, 22C:
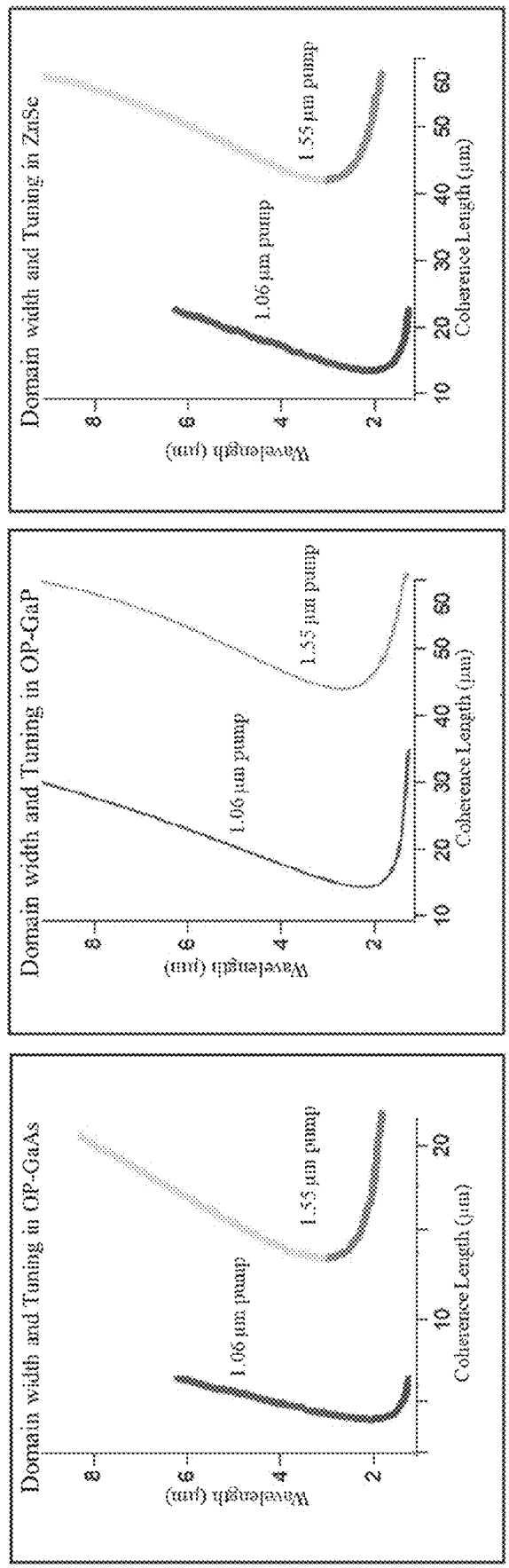
FIGS. 22A-22C depict phase matching curves for OP-GaAs (FIG. 22A) for two pumping wavelengths, 1.06 µm and 1.55 µm compared to the phase matching curves for OP-GaP (FIG. 22B) and OP-ZnSe (FIG. 22C). By comparing the figures one can easily see that to achieve the same output wavelength (see y-axis) the domain widths (the coherence lengths) of patterns on the OP-GaP and OP-ZnSe templates should be 2-3 times larger (see x-axis) than in the case of OP-GaAs, which strongly facilitate the HVPE growth on them.
Figure 23:
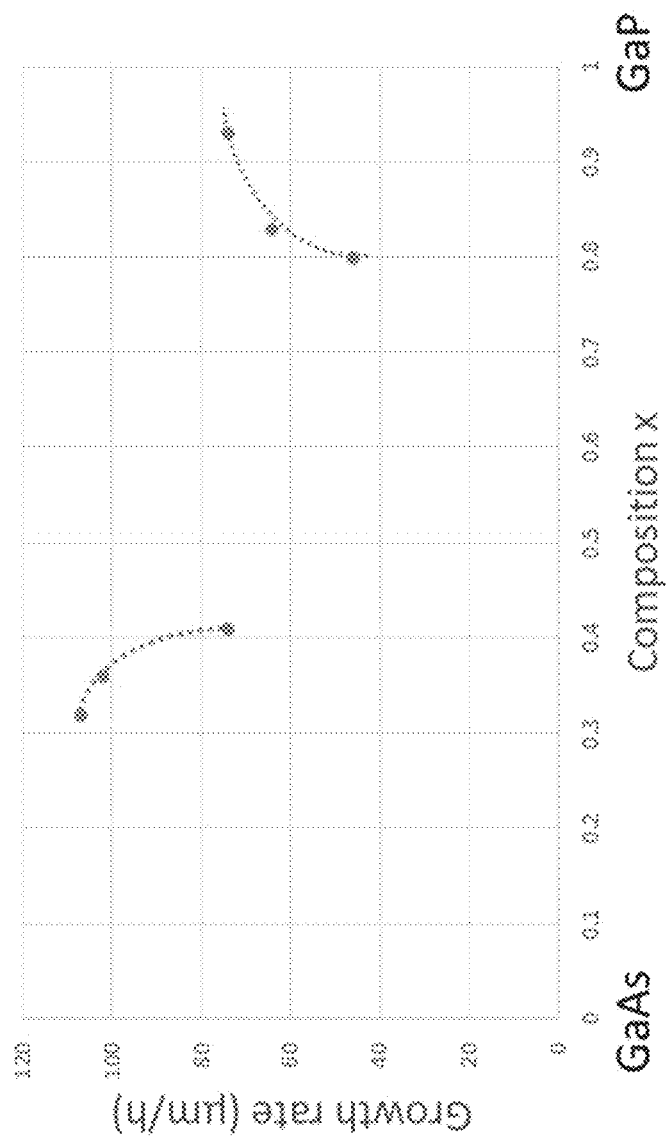
FIG. 23 depicts the dependence of the growth rate on the chemical composition x during the growth of $GaAs_xP_{1-x}$ ternaries. As one can see when the composition x is closer to a binary material, GaAs or GaP, the growth rate is faster (with the trend GaAs to grow, generally, faster than GaP) but drops down for the compositions in the middle.

Another advantage of ternaries, and specifically of GaAsP, can be easily seen on the phase-matching curves for GaAs (FIG. 22A) and GaP (FIG. 22B) plotted for 2 different pump wavelengths, 1.06 µm and 1.55 µm. Thus, to achieve the same output wavelength (see y-axis) one will need an OP-template which pattern has averagely 2-3 times wider domains (larger coherence length) (see x-axis) in the case of OP-GaP compared to the case of OP-GaAs. This strongly facilitates the thick HVPE growth on the template since maintaining good domain fidelity during the growth is much easier at wider domains. This tells us that a GaAsP ternary not only will be able to be pumped at shorter wavelengths but will also possess a dispersion that will allow patterns with larger domain widths, which significantly facilitates the HVPE growth on the OP-template. A similar conclusion for the advantage of ZnSe vs GaAs can be easily made if one compare the phase-matching curves of OP-ZnSe (FIG. 22C) and OP-GaAs (FIG. 22C). In addition, depending on the composition, ternaries may be grown on either one of the parenting materials, e.g. GaAs or GaP for a GaAsP ternary. For example, it is more suitable to grow $GaAs_{0.61}P_{0.39}$ on GaAs substrates or OP-GaAs templates, while the growth of is $GaAs_{0.34}P_{0.66}$ is more reasonable on GaP substrates or OP-GaP templates. Some useful information related to the growth of $GaAs_xP_{1-x}$ is provided in FIG. 23, which presents dependence of the growth rate on the ternary x-composition. According to FIG. 23, when the composition is closer to a binary material, e.g. GaAs or GaP, the growth rate is faster (with the trend for GaAs to grow, generally, faster than GaP) but slows down for compositions in the middle. In addition, ternaries are always more favorable heteroepitaxial cases due to the smaller lattice mismatches with the parenting substrate materials. Thus, ternaries are a good solution for improved heteroepitaxial growth at lower lattice mismatches, which directly favors the intended device developments. Giving $GaAs_xP_{1-x}$ as an example of ternaries is not intended to restrict other ternaries or quaternaries (included or not included in the texts of this disclosure), which may be based on other material combinations, or to take advantage of the ideas for their growth or practical use in the same or similar to the described here applications.

Figure 16B:
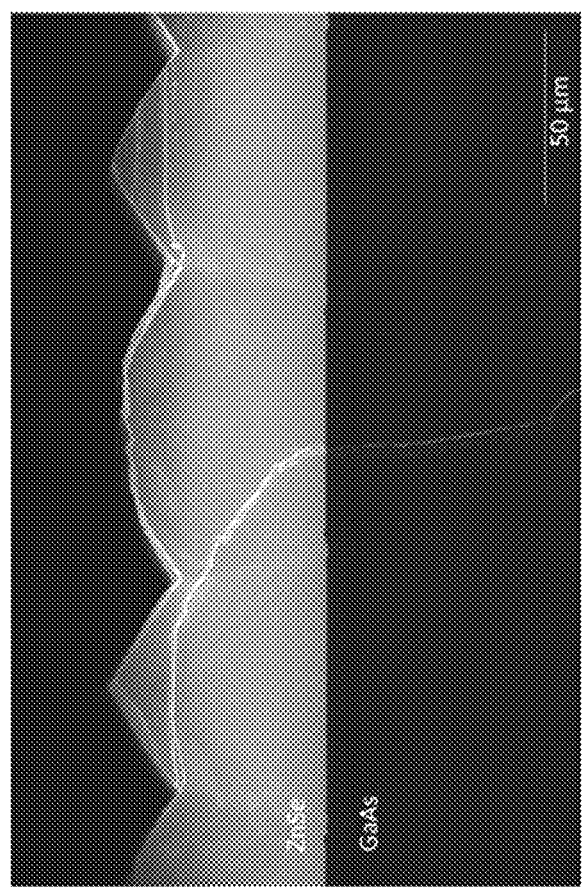
FIGS. 16A-16B depict cross-sectional (FIG. 16A) and top surface (FIG. 16B) SEM images of OP-ZnSe grown heteroepitaxially on OP-GaAs templates.
Figure 16A:
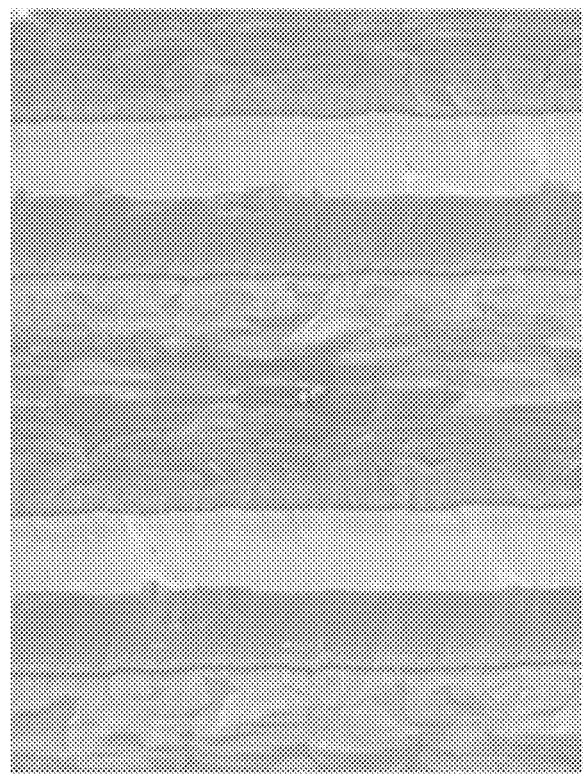

By demonstrating that heteroepitaxy is possible and successful in some less favorable cases (e.g. GaP/GaAs and GaAs/GaP) we have opened the doors wide for other heteroepitaxial cases (e.g. ZnSe/GaAs; ZnTe/GaSb; ZnTe/InAs; AlAs/GaAs; GaSe on GaP, GaAs, or GaN; ZnS/GaP; and even GaP/Si) that often provide closer, more favorable lattice and thermal matches. As provided in the Experimental results above, many of these cases have already been successfully grown by our technique in large size substrates (halves or quarters of 2-inch wafers) with high surface and crystalline quality. For example, up to 500 pm thick ZnSe with smooth surface morphology and FWHM of about 60 arcsec of XRD 2 theta-omega scan was grown with growth rate of up to 105 pm/h as it is shown in FIGS. 14-16. In some of these cases, due to the high Zn-vapor pressure, which restricted the duration of growth to about 2 hours, achieving thicker layers demanded a re-growth, which was possible without any need for polishing of the layer after the first growth. The successful growth of ZnSe/GaAs is another example of the power of the proposed heteroepitaxial approach because, to date, most of the commercially available ZnSe substrates are polycrystalline, and if they are crystalline, they are unpractically small, with poor crystalline quality, and very expensive.

Figure 17B:
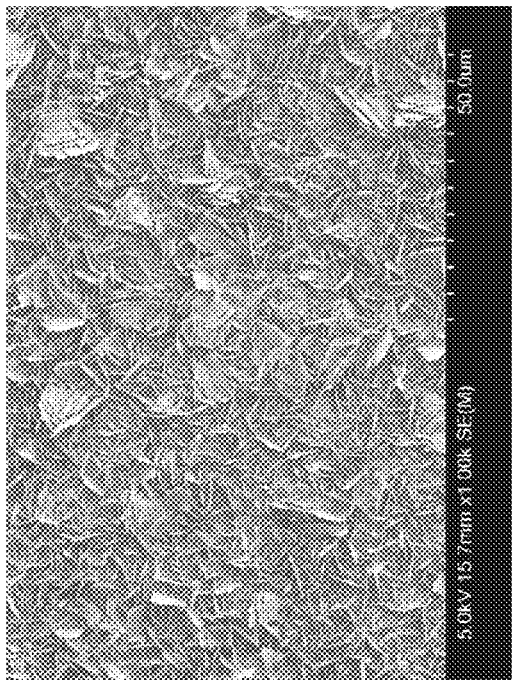
FIGS. 17A-17C depict top surface SEM images of heteroepitaxial growth of GaSe on a GaP substrate (FIG. 17A) and GaSe on a GaN substrate (FIG. 17B) compared to the homoepitaxial growth of GaSe on a GaSe substrate (FIG. 17C).
Figure 17C:
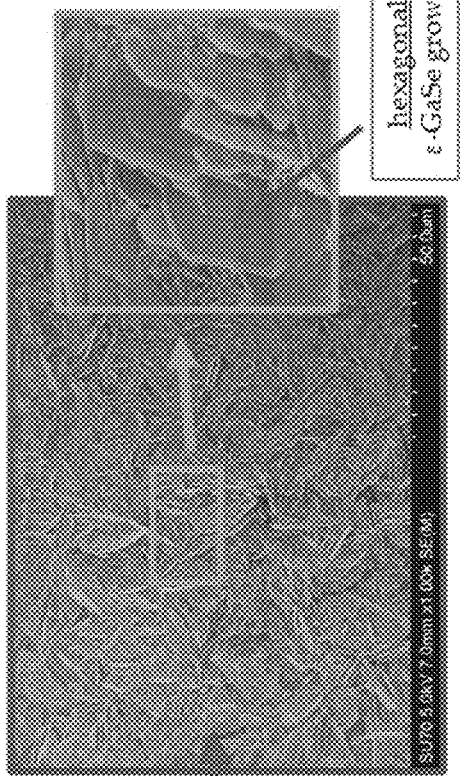
Figure 17A:
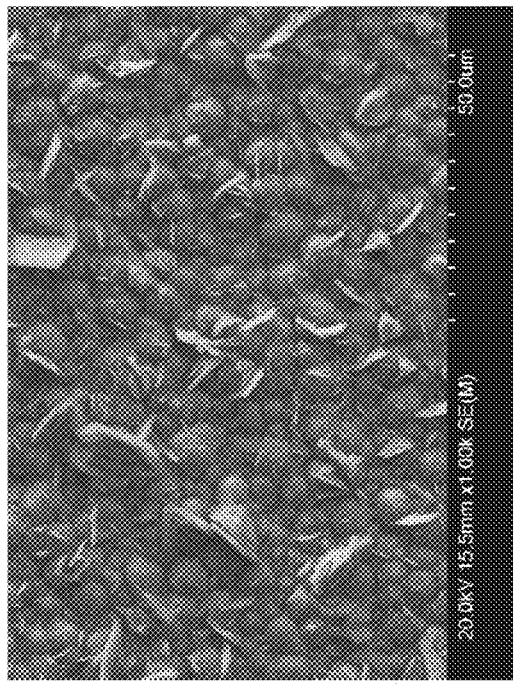

In this series of experiments, cubic phase gallium selenide with zinc blende symmetry ($Ga_2Se_3$) was grown on GaP (FIG. 17A) and GaAs (FIG. 18) substrates, while hexagonal ε-phase gallium selenide (GaSe) was attempted on GaN substrates (FIG. 17B). While the poor quality of the growth on GaN (FIG. 17B) can be explained by the large lattice mismatch between GaN and GaSe, the poor quality of the growth on GaP at such a small lattice mismatch between GaP and GaSe (FIG. 17A) was surprising. For comparison the growth of gallium selenide was performed also homoepitaxially (FIG. 17C) on a monocrystalline hexagonal ε-GaSe substrate, which surprisingly resulted not in a continuous monocrystalline GaSe layer but in numerous differently sized and differently oriented a-phase hexagonal GaSe flakes (FIG. 17C). The most successful growth was the growth of the cubic phase gallium selenide with zinc blende symmetry ($Ga_2Se_3$) (FIG. 18A) on the GaAs substrate. Thus, for the first time low-dimensional $Ga_2Se_3$ was grown by HVPE in the shape of large area continuous monocrystalline layers with thicknesses in the range of 0.2-4.5 pm on GaAs substrates (FIGS. 18A and 18B). An indication of their good quality was the EDS analysis (FIG. 18C) and also the HR-XRD of these samples, which clearly revealed cubic phase $Ga_4Se_6$ (or just $Ga_2Se_3$) with zinc blende structure and excellent surface and crystalline quality (FIGS. 18D and 18E).

Although ε-GaSe has been used for a long time for phase matching frequency conversion in the mid-IR, GaSe, has never achieved the ubiquity of other NLO materials in commercial and industrial applications due to the difficulties associated with the growth process and sample preparation. This comes from the fact that GaSe has a layered structure with weak interlayer van der Waals bonding and, further, hardness close to zero by the Mohs' scale. The numerous phases in which this material can exist (even co-exist in a single sample) brings additional complexity to the growth process. In contrast to the hexagonal F-phase GaSe (suitable for phase matching frequency conversion) the cubic phase zinc blende $Ga_2Se_3$ could be an alternative material for quasi-phase matching frequency conversion. However, although $Ga_2Se_3$ has been grown as single crystals, large enough crystalline gallium selenide is not practically available, plus, such a soft material cannot handle the heavy polishing and etching procedures associated with the preparation of an OP-template. These two reasons make heteroepitaxy the only option for the growth of gallium selenide for QPM frequency conversion. Fortunately, the zinc blende $Ga_2Se_3$ has about the same lattice mismatch with GaAs (−4.02%) as GaP with GaAs (−3.57%). This supports for favorability of $Ga_2Se_3$/GaAs heteroepitaxy and, eventually, the growth of OP-$Ga_2Se_3$ on OP-GaAs templates, similar to GaP/GaAs and OP-GaP/OP-GaAs heteroepitaxy. Realizing HVPE growth of continuous layer zinc blende $Ga_2Se_3$ with smooth surface morphology and excellent crystalline is a good opportunity to grow this excellent NLO material for QPM frequency conversion in the MLWIR. However, the even closer lattice mismatch with GaP (−0.42%) supports the heteroepitaxy of $Ga_2Se_3$/GaP. Moreover, other applications of that would find heteroepitaxy of the cubic zinc blende gallium selenide on the close lattice matched Si are also attractive. For example, in contrast to some traditional 2D materials, wherein zero bandgap energies restrict them from their use in logic electronics or for field-effect transistors (FETs), the low-dimensional GaSe has the advantage that its bandgap energy may be tuned by the number of the deposited monolayers, which are easily controlled by growth duration. In addition, GaSe has a strong photo-response, which makes this material suitable for photodetectors. The growths of GaSe presented herein are classic examples of van der Waals heteroepitaxy, which is another variation of the invention.

According to FIG. 1 and FIG. 13, in addition to the cases already discussed, there are a number of other favorable heteroepitaxial cases that are determinable by the lattice mismatch between the substrate and the growing layer. Such cases include, for example, CdS/InP (−0.624% lattice mismatch), or vice-versa, i.e. InP/CdS (+0.624% lattice mismatch), AlSb/GaSb (+0.650% lattice mismatch), CdSe/InAs (−0.139% lattice mismatch), GaSb/InAs (+0.620% lattice mismatch), AlSb/InAs (+1.273% lattice mismatch), CdTe/InSb (+0.040% lattice mismatch), InSb/CdTe (−0.040% lattice mismatch) or vice-versa CdTe/InSb, HgTe/CdTe (−0.447% lattice mismatch), HgTe/InSb (−0.407% lattice mismatch), or even CdS/ZnS (+7.064% lattice mismatch) or vice-versa ZnS/CdS. Although in the latter case the lattice mismatch may be considered as large, there are a number of techniques and growth modes (explained above) that make heteroepitaxy possible. A great example of that is the growth of GaN on sapphire, where the initial lattice mismatch is huge, −33.354%. The disclosed techniques may be successfully applied in another example of a relatively large lattice mismatch of +5.87%, when GaP is grown on periodically poled LiNbO$_3$ (PPLN). This heteroepitaxial case of the growth of a semiconductor material with excellent nonlinear optical properties, GaP (FIG. 13) on an excellent optical oxide ferroelectric material, LiNbO$_3$, is especially attractive, because the polarity inversion in ferroelectric materials is easy and does not require the preparation of OP-templates. Growth of semiconductor materials on optical materials or on ferroelectric materials are other variations. Growths of other semiconductor materials on other optical materials (but not oxide materials) such as GaF$_2$ and BaF$_2$ are also attractive due to the small lattice mismatches, especially in the cases of GaP/CaF$_2$, GaAs/CaF$_2$, or AlSb/BaF$_2$ and GaSb/BaF$_2$ (see FIG. 13). Growths of semiconductor materials on optical materials, which are neither oxide nor ferroelectric materials, is another useful variation.

From point of view of lattice mismatch, many of the heteroepitaxial cases presented in FIG. 13 are more favorable than the first realized case—GaP/GaAs (−3.574% lattice mismatch), which is a good precondition for their success. The concept was demonstrated successfully in the growth of ZnSe on GaAs (only +0.238% lattice mismatch), and the growths of GaSe on different substrates, e.g. cubic phase zinc blende gallium selenide Ga$_2$Se$_3$ on GaAs (−4.02% lattice mismatch). The mixed results with the more favorable case of Ga$_2$Se$_3$/GaP (−0.42% lattice mismatch, only) is attributed to the diversity of GaSe phases, and the imperfect optimization of the growth conditions, which also explains the imperfect quality of the GaSe/GaSe homoepitaxial growth.

In one of the example in FIG. 13 (InSe) a substrate material is not specified. This is because there are some contradictions in the literature in regards to the InSe crystal structure and lattice constants. In addition, such as in the already proven case of GaSe/GaAs growth, InSe is a typical 2D material. Such materials may be grown on various substrates because in such cases the layers are held to the substrate by van der Waals forces, a case when the lattice mismatch does not play such an important role, as opposed to the other cases discussed above. Thus, the disclosed approach gives one the opportunity to grow heteroepitaxially numerous other 2D van der Waals semiconductor materials, such as elemental 2D semiconductors, chalcogenides, phosphides, arsenides, iodides, and oxides. Thus, van der Waals heteroepitaxy is another important alternative variation of this technique.

As taught above, however, the lattice mismatch is not the only important criterion when matching two materials in a growth process. First, to be practical, the substrate material should be available in a relatively large size (e.g. at least 2-inch wafers), at a reasonable price, and with high surface and crystalline quality; the so-called "epi-ready" surface. The availability of such substrates indicates a mature growth and wafer preparation technology, as well viable OP template preparation techniques. Next to the well-known, common substrates, e.g. Si, Ge, GaAs, or GaP, some other materials, e.g. InAs, InP, InSb, GaSb, and CdTe are also available as substrates for subsequent epitaxial growth. From this point of view, it makes perfect sense to grow materials that are either more expensive or not available in a large size and good crystalline quality, e.g. ZnSe, ZnTe, or GaSe, on common or high quality substrates, e.g. growth of crystalline ZnSe/GaAs, ZnTe/GaSb, or GaSe/GaAs, etc., as well on the related OP templates, when they are available. In the same way, it is much more reasonable to grow CdSe, which is also not available as large crystalline substrates, on InAs, which is available at high quality and at a reasonable price of about $100 per 2-inch wafer. Similarly, it is preferable to grow CdS (about $2,000 per 2" wafer) on the cheaper InP (about $400 per 2-inch wafer) than to perform the opposite growth, i.e. InP/CdS. Also to be considered are the growths of zinc-blende (cubic) materials on zinc-blende (cubic) substrates (e.g. GaP/GaAs), or wurtzite (hexagonal) materials on wurtzite (hexagonal) substrates (e.g. GaN/sapphire) rather than, for example, a zinc-blende material, which has a cubic symmetry, on a wurtzite substrate, which has a hexagonal symmetry. One also should bear in mind that different crystallographic orientations might provide a closer lattice match to different phases of one material. Thus hexagonal GaN may be successfully grown on (111) GaAs substrates, while cubic GaN may be grown on (100) GaAs. The opposite arrangement, i.e. that two different phases of the same material could be grown successfully on completely different materials is also possible in many particular cases. Thus, as described above, Ga$_2$Se$_3$ can be grown on GaP, while ε-GaSe can be grown on GaN (for more examples see FIG. 13). In order to simplify the chemistry, it is also preferable to grow antimonides on antimonides, or selenides on selenides, etc., than, for example, antimonides on sulfides, even when this is at the expense of a larger lattice mismatch. Thus, for example, the case AlSb/GaSb should be preferred to the case of CdSe/InAs. However, this as many other recommendations presented here, shall not be accepted as a strict rule because there are cases when growth of a layer on the same type of substrate material may result in lower surface quality expressed by, for example, a larger number of misfit and treading dislocations. Some examples: 1) InAs/GaSb have much smaller lattice mismatch (−0.615%) than InAs and GaAs (+7.165% lattice mismatch) and that is why it should be preferred; 2) the CdSe/InAs growth should be also preferred due to the negligible lattice mismatch of −0.139%, even though they are combinations of semiconductors from different groups—II-VI and III-V.

Many other factors important to the growth process should also be taken into account. For example, the lack of a H$_2$Te precursor on the market and its easy decomposition to H$_2$ and Te (most probably before to have the chance to react with the other chemicals involved in the growth) require a search for alternative chemical approaches in the growth of tellurides, for example, in the growth of ZnTe. One of these approaches is to produce in-situ H$_2$Te within the reactor volume using other chemicals and chemical reactions, e.g. thermal decomposition of TeCl$_4$ in the flow of H$_2$ or H$_2$+HCl mixture (see eq. 10a), or other options shown in eq. 10b and eq. 10c (see also FIG. 13).

Next to the already described compound semiconductor substrates we may also add some more details about using some traditional optical (CaP$_2$ or BaF$_2$) or ferroelectric (LiNbO$_3$) or non-ferroelectric materials as substrates, including some perovskites (e.g. BaTiO$_3$), some of which were already mentioned above and in FIG. 13. The reason for that is not only that many of these new substrate materials can be found on the market in a reasonable size, quality, and price (e.g. $50-$100 per a 100 mm diameter wafers), but also because they could have small lattice or thermal mismatches with the above mentioned semiconductor materials (see FIG. 13). With this, we enter in territories where we shall grow together not only the same structured materials, but also materials with different natures, chemical compositions, structures, symmetries, and properties, e.g. traditional optical or electronic compound semiconductor materials with traditional optical materials, ferroelectrics or perovskites, oxides, chalcogenides, fluorides, nitrides, etc. Fortunately, in many of these cases nature provides endless options, which we just must discover. In others, however, when a suitable self-organizing growth mechanism does not yet exist, more research efforts are necessary in engineering the transition buffer layer between the substrate and growing layer. One possible way for "fitting", for example, fluorides with oxides structures is "by interleaving isostructural components that are sharing structurally identical cation and anion sub-lattices". A great example of a natural self-organizing mechanism (already mentioned above) is the growth of GaN on sapphire with which GaN has the huge lattice mismatch of 33%. However, if the growth starts with nitridation of the surface (in an ammonia rich atmosphere) this will initiate growth of AlN with which GaN has a lattice mismatch of 2.5% only. From first sight, this "pre-growth" does not make any sense, because the lattice mismatch of AlN and sapphire is even larger (35%). Fortunately, during this initial growth the AlN lattice cell rotates 30 degree towards the sapphire lattice cell, which minimize the system energy. This rotation reduces the AlN/sapphire lattice mismatch from 33% to 13.3% so now AlN can grow on sapphire, which allows in a later stage the growth of GaN on the initial AlN layer.

One should also bear in mind that, as described above, from a crystallographic point of view, growth at a negative mismatch that results in a tensile strained growing layer is more favorable than growth performed at a positive mismatch, i.e. under compressive strain. One simplified explanation of such a preference is that a tensile growing layer can compensate to some extent the strain of the naturally compressed substrate surface, as well as the fact that the tensile growth provides conditions for thicker pseudomorphic growth that are also more favorable for 2D (layer) growth, which is the reason for observing smooth surface morphology after such growths. In contrast, when the growth occurs under compressive strain, such growth conditions allow a smaller critical thickness and favor 3D (island) growth instead, which results in rougher surface morphology. That is why, for example, growth of CdS/InP (−0.624% lattice mismatch) should be preferred to the growth of InP/CdS (the same but positive, +0.624%, lattice mismatch). However, such considerations may depend on what we want to achieve with the growth, whether metamorphic buffer layers or the formation of quantum dots, wells, or other nano or microstructures.

It should also be remembered that the thermal mismatch between the growing layer and the substrate, i.e. the difference between the thermal expansion coefficients and their thermal conductivities, starts to play a more and more important role with increasing the layer thickness, which can lead to cracking of the growing layer. For example, the 3 times smaller thermal conductivity of ZnSe (18 W·m−1K−1) but larger thermal expansion coefficient (compare 7.1 vs. 5.7 $10^{31\ 6}$·K$^{-1}$) (see FIG. 26) should be also taken into account when the intention is growing thicker ZnSe layers on GaAs substrates.

In general, the best ternary for the buffer layer will be the one that is formed by the two parenting materials. For example, GaAsP sounds like the best buffer layer material for the GaP/GaAs or GaAs/GaP growths. For the purpose, the initial growth shall be initiated under the flow of a mixture of AsH$_3$ and PH$_3$. In this case, the ratio of these two precursors in the mixture may be changed from only arsine (AsH$_3$) to only phosphine (PH$_3$) in order to build up a graded GaAsP ternary buffer layer. However, if we want to grow a thick GaAsP ternary layer (not only a ternary buffer layer), we shall keep a desired precursors' ratio constant, to obtain a constant layer composition. One should also keep in mind that phosphine is much more volatile than arsine, which means that to achieve equal amounts of phosphorus and arsenic in the ternary composition, the amount of phosphine in the AsH$_3$+PH$_3$ ratio shall be much greater than arsine. In this example, the III-group element (Ga) is the same in the substrate and the layer material. Similar to this example is the growth of GaSe on GaAs. In this case, the ternary GaAsSe shall be formed by using one boat of molten Ga over flowed by a mixture of arsine (AsH$_3$) and hydrogen selenide (H$_2$Se). Similar is also the case of growth of GaSb on GaAs, where a mixture of arsine and hydrogen antimonide (called also stibine), AsH$_3$+SbH$_3$, flows over the boat with molten Ga, to form the GaAsSb ternary. The cases of growths of layers on substrates when the III-group element of the layer and substrate are different, however, are more complicated. Thus, according to one study GaSb has been grown (using a different growth technique, MBE) not only on GaAs substrates but also on InAs and AlSb buffer layers deposited in advance on the GaAs substrate. In these two cases (InAs and AlSb buffer layers) the III-group elements, when growing the initial buffer layers on the GaAs substrates, are different—Ga and In in the InAs/GaAs case and, respectively, Ga and Al in the AlSb/GaAs case. Towards this purpose, an additional boat with molten In or, respectively, with molten Al is introduced into the reactor chamber. As for the V or VI group element precursors, only one V-group element precursor, AsH$_3$, is needed for the growth of the InAs buffer layer, while in the case of the AlSb/GaAs growth we will need not only a V-group element precursor, AsH$_3$, to flow over the boat with the molten Ga but also one VI-group element precursor, SbH$_3$, to flow over the boat with the molten Al. In addition, making it even more complicated, after the deposition of the buffer layer we proceed with the growth of the desired GaSb layer on the grown InAs or, respectively, AlSb buffer layer. For this purpose, in order to initiate the GaSb/AlSb growth, the VI-group element precursor, SbH$_3$, shall be kept flowing over both the Ga and the Al boats, while the AsH$_3$ flow shall be turned off. Respectively, in the case of GaSb/InAs growth, the VI-group element precursor, SbH$_3$, shall be turned on to overflow the boat with molten Ga, while the AsH$_3$ flow shall be kept flowing over the boat with molten In. Thus, the growth of GaSb on GaAs with the assistance of an InAs buffer layer (GaSb/InAs/GaAs) will start with the growth of an intermediate GaInAs ternary layer at the InAs/GaAs interface. This with the involvement of SbH$_3$ will convert gradually through a GaInAsSb quaternary phase within the InAs buffer layer to a GaInSb ternary layer near the growing GaSb/InAs interface which, eventually, by reducing the In content (with reducing the $AsH_3$ flow over the molten In) gradually will convert in the desired GaSb binary layer. Similarly, the growth of GaSb on GaAs with the assistance of an AlSb buffer layer (GaSb/AlSb/GaAs) will start with the growth of an intermediate AlGaAsSb quaternary buffer layer at the AlSb/GaAs interface, which will convert into an AlGaSb ternary at the GaSb/AlSb interface, which eventually will convert in the desire GaSb binary layer.

Another example with similar complexity is the growth of ZnSe on a GaAs substrate. The growth in this case occurs with the involvement of one II and one III-group element precursors (Zn and Ga) and two V-group element precursors ($AsH_3$ and $H_2Se$). However, this process could be simplified by not involving $AsH_3$, if (similarly to the growths of GaP/GaAs or GaAs/GaP) the non-native VI-group element precursor ($H_2Se$) "attacks" during the pretreatment stage the surface of the GaAs substrates, with the expectation that this ternary transition layer will gradually convert into ZnSe during the following ZnSe growth.

Other good examples of heteroepitaxy are the growths of ZnTe/GaSb (FIG. 10I), ZnS/GaP, and CdS/InP substrates (FIG. 10J), which in their simplest cases proceed through the formation at the growing interface of ternary layers, GaSbTe or InPS, respectively. More examples for heteroepitaxy through intermediate ternary or quaternary buffer layers (or just thick growths of ternaries or quaternaries layers) are supported in FIGS. 10A-10L and FIG. 13.

In summary, the examples provided in the previous paragraphs consider two different approaches for facilitating heteroepitaxial growth. The first one is by "in-situ" growing of a ternary or quaternary buffer layer between the substrate and the growing layer. The second one is by growing the intended layer on an already deposited buffer layer (it could be by a different growth technique) from a material that, hopefully, has a close lattice and/or thermal match with at least one of the substrate or the growing layer. In many cases, multiple buffer layers from different materials may be used to secure the desired smooth gradual transition between two materials that, at first sight, look completely incompatible. One good example of that is the growth of InSb on a GaAs substrate. The first step in this growth is to grow an intermediate layer of InP (lattice constant 5.8668 Å) on the GaAs substrate (lattice constant 5.6533 Å). The second step is to grow a second intermediate layer of GaSb (lattice constant 6.0959 Å) on the first InP buffer layer. The next step is to grow a third intermediate layer of ZnTe (lattice constant 6.1010 Å) on the second GaSb intermediate layer, and then to finish with the growth of a thick growth of InSb (lattice constant 6.4794 Å) layer. This was our initial goal, which, however, was not possible by a direct InSb/GaAs growth, due to the huge positive lattice mismatch (+10.74%) between these two materials. Of course, the success of such efforts will be greatly improved if the intermediate layers are grown in mixtures of the related precursors (in the case of the first InP/GaAs transition, an $AsH_3+PH_3$ mixture in the presence of Ga and In overflowed by HCl, etc.), which will support the growth of ternary or quaternary intermediate layers with a gradually-changing composition, ensuring a smooth transition between the two materials. Thus, materials that are otherwise completely incompatible may be grown on each other, even with differences in the lattice constants of 10 Å or more.

Figure 24A:
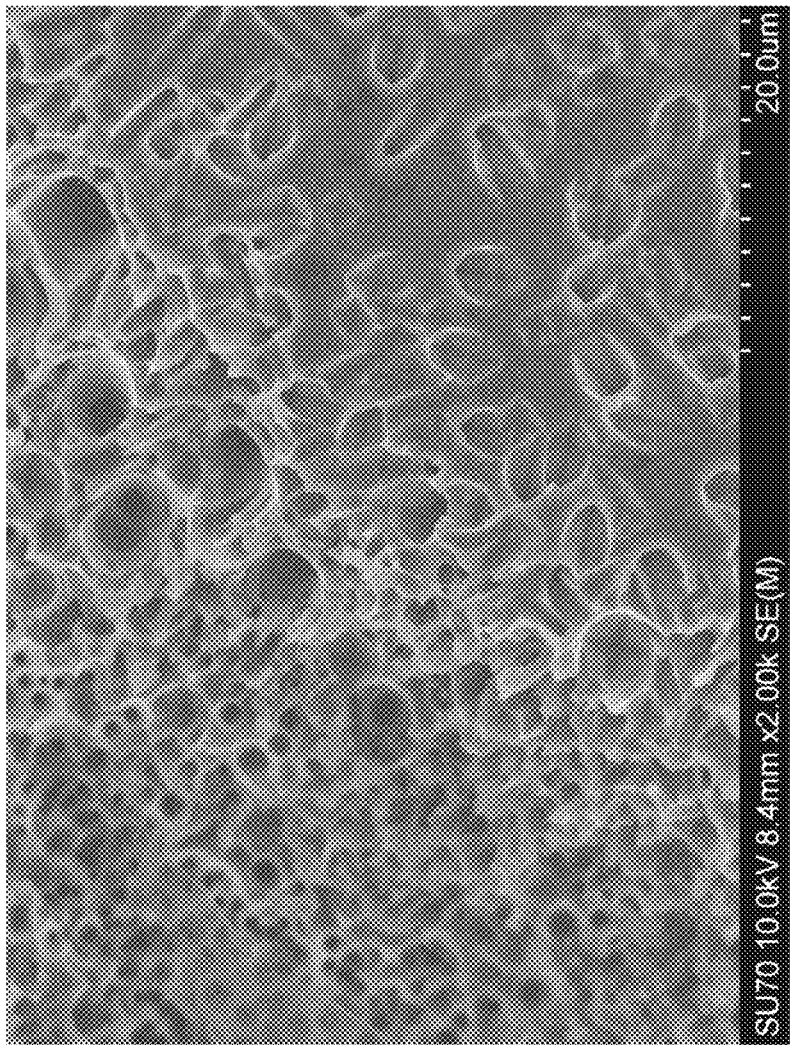
FIGS. 24A-24B depict SEM of the top surface (FIG. 24A) and the cross section (FIG. 24B) of a Si-wafer that was in-situ pretreated in a mixture of $H_2Se+H_2$ prior performing a HVPE growth of GaP on the wafer. Both images clearly show that $H_2Se$ strongly attacks the Si-surface, creating numerous randomly distributed etch pits with random shapes and depth, which hopefully facilitate the initial nucleation of the GaP layer.
Figure 24B:
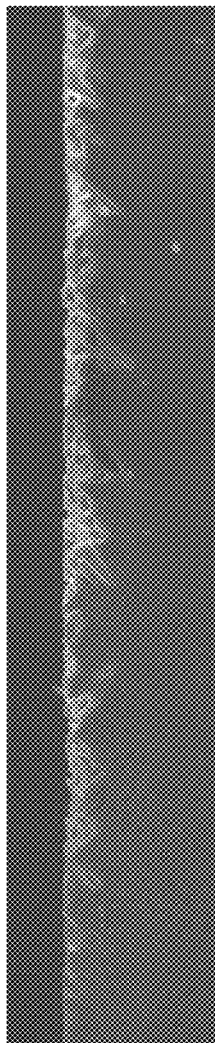

In some cases, the substrate pretreatment may be successful with a non-native precursor that has nothing to do with the subsequent growth. An example of that is the pretreatment of a Si substrate with $H_2Se$ in order to prepare the Si surface for the following thick HVPE growth of GaP. In this case, $PH_3$ had to be the first choice of a non-native precursor for pretreatment of the Si substrate with the idea $PH_3$ to pit the Si surface, starting to form GaPSi islands, which to coalesce eventually in a GaPSi buffer layer. The effect of $PH_3$ on the Si substrate, however, was not as strong as expected, as compared to the unexpectedly strong effect of $H_2Se$ (FIGS. 24A-24B). As the SEM images in FIG. 24A (top surface) and FIG. 24B (cross section) indicated, $H_2Se$ has a significant beneficial impact on the Si surface, etching it, i.e. making it rougher. Considering that, in contrast to the cases of using far-from-equilibrium growth techniques (MOCVD or MBE), a direct HVPE GaP/Si growth is impossible due to the low EPD (only $10^2$ $EP/cm^2$—compared with the much higher numbers for GaAs and GaP provided above), the newly formed etch pits after the $H_2Se$ pretreatment, by providing more sites at the surface for the approaching atoms to adhere to, will facilitate the HVPE GaP/Si growth, even without forming any ternary buffer layer. Pretreatment of the substrate surface with a non-native precursor, which is not expected to form a ternary or quaternary buffer layer is another variation of our approach, described in this invention.

In summary, the major criteria for choosing the substrate and the growing material pair are:

1. The sign and the magnitude of the lattice mismatch between the substrate and the growing layer: This determines the type of the elastic strain built in the growing layer and the mechanisms of its relief, as well the thickness of the pseudomorphous growth ($h_c$) and which type of growth—2D (layer growth) or 3D (island growth) is favored.
2. The difference in the thermal expansion coefficients and the thermal conductivities of the substrate and the growing material: The importance of this factor increases with increase of the growing layer thickness.
3. The crystallographic structure (symmetry) and the chemical bonds of both the substrate and the growing material and how compatible they are to each other.
4. The maturity of the substrate growth technology, wafer processing, and template preparation techniques.
5. The price, quality, and availability of the particular substrate or patterned template.
5. The maturity of the growing technique for the growth of the related layers.
6. The availability, toxicity, and flammability of the chemicals used and how corrosive they are. In other words, are they environmentally friendly and how dangerous they are for humans?
7. The range and importance of the expected practical applications and, in general, are there alternative approaches for preparing these materials and, if there are any, how competitive are they to the approaches presented here.

Precursor Gases and Ternary-Forming Gases

The first precursor gas is usually hydrogen chloride (HCl) diluted to the desired extent by the carrier gas (usually $H_2$). The role of the precursor gas is to pick-up a II or III group element (e.g. Ga, Al, Zn, Cd, Hg, etc.) from an open boat or from a bubbler, and with it to form a metal-chlorine compound, called II or III group element precursor or called just "precursor", which is delivered to the mixing zone, making it available to participate in the growing process.

The second precursor gas, called ternary-forming gas, is usually a hydride or halide in which there is a V or VI-group element ($AsH_3$, $PH_3$, $H_2Se$, $SbH_3$, $H_2S$, HF, $NH_3$, etc.) diluted to the desired extent by the carrier gas (usually $H_2$). The ternary-forming gas, which is actually the precursor of the V or VI-group element, is to be delivered to the mixing zone, making it available to participate in the growing process, reacting with the first precursor gas. We call this precursor "ternary-forming" because the chemical reactions between the precursor gas and the ternary-forming gas, which hopefully will occur on the surface of the foreign substrate rather than in the gas stream, resulting in the formation of ternary islands which, eventually coalescence to form a continuous ternary intermediate buffer layer.

Alternative names: The precursor gas may be called "precursor" of "the II or III group element" or "first precursor". The ternary-forming gas may be called "precursor of the V or VI group element" or "second precursor".

By demonstrating that heteroepitaxy is possible and successful at larger lattice mismatches without using a specially-patterned template in a one-step growth process (preceded by substrate pre-growth pretreatment), we have eliminated the need for growth on patterned substrates at larger mismatches, or the preliminary deposition of a thin MOCVD or MBE layer, or even the HVPE deposition of a low-temperature lower quality buffer layer. The disclosed parameters of heteroepitaxy, e.g. the thickness of the pseudomorphous growth and the periodicity of the misfit dislocations, for some particular cases have established clear criteria by which additional cases of heteroepitaxy may be deemed favorable.

The invention described herein is an innovative approach for pre-growth in-situ treatment of a substrate and the subsequent optimized thick HVPE heteroepitaxial growth on the substrate as a continuation of the pretreatment. The inventive approach applies discovered process parameters that secure a smooth transition between two different materials, and the process is flexible enough to adapt these parameters even at relatively large lattice and thermal mismatches. The evidence provided herein regarding the successful heteroepitaxial growths of materials which are disfavored according to the known prior art or conventional wisdom supports the application of the inventive process over a wide range of semiconductor pairs of materials (or pairs of a semiconductor material with another type of material—for example optical, ferroelectric, etc.) having differing degrees of lattice or thermal mismatches.

As mentioned above, the invention consists broadly of two steps: (1) pre-growth treatment of the substrate in order to initiate the replacement of V (or VI) group atoms of the substrate with V (or VI) group atoms of the layer intended to be grown, and (2) heteroepitaxial growth on the pretreated substrate. The proposed approach allows plenty of opportunity for applying different process parameters, using different pretreatment and growth temperatures and regimes of their achieving, pressures, durations of substrate pretreatment and growth, flow rates, and flow regimes, etc. The invention allows one to freely adjust the process parameters with the major goal to accommodate the substrate and the layer material or two or more subsequent layer materials to each other.

Alternative variations:
1. Growths of one material or different phases of one material on different crystallographic orientations of another material, as the substrate and the layer material could be with the same or with different symmetry: In some cases one crystallographic plane of one material could match closer, i.e. have smaller lattice mismatch, with one or another material or different phases of one and the same material.

Example: Hexagonal GaN can be successfully grown on (111) GaAs substrates, while cubic GaN can be grown on (100) GaAs.

2. Two or more different phases of the same material can be grown successfully on completely different materials and, wise-versa, two different materials (e.g. GaN, AlN, GaP, GaAs, etc.) can be grown on different phases of one and the same material (a cubic phase zinc blende gallium selenide $Ga_2Se_3$ and hexagonal gallium selenide e-GaSe).

Example: $Ga_2Se_3$ can be grown on GaP and on GaAs substrates, while GaSe may be grown on GaN substrates (see also FIG. 13) and wise-versa, GaN and AlN can be grown on $Ga_2Se_3$, while GaP and GaAs can be grown on GaSe.

3. A layer from one material can be grown on a buffer layer comprising a third material that has a lattice constant between those of the substrate and the growing layer: In this case, the substrate and the layer materials are not "parenting" to the buffer layer materials.

Example: GaSb can be grown on GaAs by using not only GaSb, but also InAs or AlSb buffer layers.

4. Multiple buffer layers from multiple distinct materials can be used for a gentle and gradual transition between two completely incompatible materials.

Examples: 1) Growth of a InSb/ZnTe/GaSb/InP/GaAs multilayered structure—Grow, first, an intermediate InP layer (lattice constant 5.8668 Å) on a GaAs substrate (lattice constant 5.6533 Å). Then continue with the growth of a GaSb layer, (lattice constant 6.0959 Å) on the already deposited InP layer. After that grow a third, ZnTe layer, (lattice constant 6.1010 Å) on the GaSb layer, and then finish with a thick growth of InSb (lattice constant 6.4794 Å) on the already grown ZnTe layer; 2) Growth of a ZnSe/GaAs/GaP/Se multilayered structure—In this case, after the deposition of GaP on a Si substrate, the as grown GaP layer shall be pretreated in $AsH_3$. As a second step, GaAs is grown on the pretreated GaP layer. As a third step the as grown GaAs shall be pretreated in the flow of $H_2Se$ after which growth of ZnSe shall be performed the pretreated GaAs layer.

5. Growth of multilayered structures not only for fitting one material to another through heteroepitaxy but also in support of developments related to various applications.

Examples: 1) Successful growth of optical on electronic materials, for example, GaP on Si may have huge impact on developments in Optoelectronics; 2) Subsequent growths of multiple layers from materials with different bandgap on the same substrate could accelerate developments in both multicolor detectors and large and small surface highly efficient solar cells.

6. Heteroepitaxial growth of low dimensional (LD) and two dimensional (2D) semiconductor materials through van der Waals heteroepitaxy where the lattice mismatch does not play that important role in contrast to the case of the classic heteroepitaxy.

Examples: 1) Growth of LD $Ga_2Se_3$ on GaAs substrates (or OP-GaAs templates); 2) Growth of 2D elemental (e.g. graphene) or compound semiconductor materials such as InSe and other chalcogenides, phosphides, arsenides, iodides, and oxides.

7. The proposed approach is applicable not only for III-V compounds (e.g. GaAs, InAs, AlAs, GaSb, InSb, AlSb, GaP, InP, GaN, AlN, etc.) but also for II-VI (e.g. ZnSe, CdSe, CdTe, HgTe, ZnTe, CdS, etc.) and even III-VI (GaSe, InSe, GaTe) semiconductor compounds. At the same time, it is not a strict rule to grow one group's materials, on substrates from the same group (e.g. an III-V group material on a III-V group substrate, etc.), because some mixed cases may be more favorable from point of view of, for example, lattice and thermal mismatch.

Example: The already realized case of growth of ZnSe (II-VI group) grown heteroepitaxially on the III-V group GaAs substrate.

8. Growth of a semiconductor material on a semiconductor substrate with different crystal symmetry.

(Note: A particular case from variation 1, purposely extracted to emphasize on its importance) Example: 1) Growth of hexagonal GaN on cubic GaAs substrates 9. Growth of semiconductor materials on oxide (including perovskites) or non-oxide (including $CaF_2$ and $BaF_2$) optical or non-optical materials including with different chemical composition and symmetry.

Examples: 1) GaP and GaAs can be grown on $CaF_2$ (lattice mismatches of −0.21% and +3.50%, respectively); 2) growths of $AlSb/BaF_2$ and $GaSb/BaF_2$.

10. Growth of non-ferroelectric semiconductor materials on oxide or non-oxide ferroelectric materials including on patterned ferroelectric materials with different chemical composition and symmetry.

Examples: 1) Growth of GaP on plain $LiNbO_3$ at the large lattice mismatch of +5.87%, which can be facilitate with the preliminary deposition of a thin MOCVD or MBE GaP layer on the substrate; 2) Growth of OP-GaP on orientation-patterned periodically pulled Lithium Niobate (PPLN).

11. Growth of semiconductor materials on optical materials, which are neither oxide nor ferroelectric materials.

12. The combination of one close-to-equilibrium growth technique (HVPE) with one far-from-equilibrium growth technique (MBE, MOCVD), makes it possible to grow heterostructures which appear impossible according to the prior art, including growths on common substrates, such as Si or Ge: The preliminary deposition of a thin MOCVD or MBE layer that facilitate the HVPE growth can be accepted as a pre-growth pretreatment of the substrate prior the HVPE growth Examples: 1) Growth can start with thin MOCVD or MBE growth of GaP on Si and continue with thick HVPE growth of GaP on the GaP intermediate layer, which may be continued with thick HVPE growth of GaAs on the HVPE GaP layer, and then continued further with thick HVPE growth of ZnSe on the HVPE grown GaAs, etc.; 2) Growth can start with thin MOCVD or MBE growth of GaAs on Ge and continued with thick HVPE growth of GaAs on the GaAs intermediate thin layer, which may be continued with thick HVPE growth of GaP on the HVPE GaAs layer, and then continued further with thick HVPE growth of $Ga_2Se_3$ on the HVPE grown GaP, etc.; 3) The unfavorable effect of the large lattice mismatch during the growth of GaP or OP-GaP on a $LiNbO_3$ substrate or on an orientation-patterned periodically pulled Lithium Niobate (PPLN) can be greatly facilitated by the preliminary deposition of a thin MOCVD or MBE GaP or GaAs (or from other suitable material) layer on the $LiNbO_3$ substrate or OP template.

13. Seeking for alternative chemical solutions such as using alternative precursors or alternative way to for delivering them or in-situ preparing of unavailable precursors.

Examples: 1) Due to the high vapor pressure of Zn, the boat with molten Zn during the growth of ZnSe could be replaced by prepared in advance or in-situ Zn-rich $ZnCl_2$-solution; 2) Instead of using an open boat with the molten II or III group element (e.g. Ga, Al, etc.), the supply of this chemical element can be done by using a bubbler and even another II or III group element precursor (e.g. TMG (tri-metal gallium), TMA (tri-metal aluminum, etc.); 3) If a precursor is either unavailable or unstable, or it is a subject of serious hazardous limitations (e.g. $H_2Te$), it could be prepared in-situ within the reactor volume as a part of the very growth process.

14. Pretreatment of the substrate surface with a non-native precursor for which is not expected to form a ternary or quaternary buffer layer if this can facilitate the following growth.

Example: If a direct HVPE growth of GaP on Si is intended, the low EPD of Si ($10^2$ $EP/cm^2$—compared to the much higher numbers for GaAs and GaP provided in [0004]) is a problem. In this case, $PH_3$ shall be the first choice of a nonnative precursor for pretreatment the Si substrate with the idea $PH_3$ to pit the Si surface forming GaPSi islands which, eventually, to coalesce in a GaPSi buffer layer. The effect of $PH_3$ on the Si substrate, however, is not strong enough. Fortunately, $H_2Se$ has a significant impact on the Si surface, etching it, i.e. making it rougher. The newly formed etch pits after the $H_2Se$ pretreatment, by providing more sites for the atom approaching the surface to adhere there, facilitate the HVPE GaP/Si growth, even without initially forming of any ternary islands and, eventually, ternary buffer layer.

15. Replacing the in-situ pre-growth treatment of the substrate with a non-native precursor (or a mixture of precursors) can be replaced by in-situ thermal or/and chemical treatments of the substrate or through wet or dry etching (e.g. ion beam etching) before introducing the substrate in the reactor chamber for the following growth.

Example: It is known that with a certain etching procedure hydrofluoric acid (HF) can remove the oxides layers from the surface of a Si substrate. Using optimized etching procedures HF may etch deeper the Si surface as the newly formed itch pits can facilitate the following HVPE growth. In addition, a number of other chemicals and procedures can also have the desire impact on many other common substrate materials.

16. Doping or co-doping of the substrate prior or during the first stage of growth could also be used to fit two different materials during the HVPE heteroepitaxy, bearing in mind that dopants can change dramatically the lattice constant of a material, making in this way the lattice mismatch between growing layer and substrate more acceptable. This "in-situ" procedure could be replaced by doping the substrate prior to introduce it in the reactor chamber using techniques such as ion implantation. Other techniques (e.g., ion beam spotter deposition) may also facilitate the initials stage of the HVPE growth.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of performing heteroepitaxial growth of InSe, the method comprising:
providing a reactor comprising an inner tube and an outer tube surrounding the inner tube, the inner tube comprising a boat comprising a Group II/III element, the outer tube comprising a substrate situated inside the outer tube and downstream of the inner tube, the substrate comprising one of AlAs, GaSe, $Ga_2Se_3$, CdSe, InSe, GaTe, $Ga_2Te_3$, HgTe, GaSb, AlSb, CdS, ZnS, $CaF_2$, $BaF_2$, $LiNbO_3$ and PPLN and the Group II/III element comprising In;

exposing the substrate to a carrier gas comprising $H_2$ and a first precursor gas comprising HCl, wherein the carrier gas and the first precursor gas are delivered from inside the inner tube toward the substrate;

delivering a first ternary-forming gas and a second ternary-forming gas through the outer tube, outside the inner tube, to form the heteroepitaxial growth, each of the first and second ternary-forming gasses comprising two or more of $AsH_3$, $H_2Se$, $SbH_3$, $H_2Te$, $H_2S$, and HF;

exposing the substrate to the first and second ternary-forming gasses in a predetermined ratio of first ternary-forming gas to second ternary-forming gas (1tf:2tf ratio); and changing the 1tf:2tf ratio over time.

2. The method of claim 1, further comprising:

flowing the ternary-forming gasses through the furnace at a 1tf:2tf ratio of about 1:0;

heating the substrate to about 500° C.-900° C.; and changing the 1tf:2tf ratio toward 0:1 over a time period of 1 min-10 hours.

\* \* \* \* \*